US012532510B2

(12) United States Patent
Li et al.

(10) Patent No.: US 12,532,510 B2
(45) Date of Patent: Jan. 20, 2026

(54) PROFILE CONTROL OF ISOLATION STRUCTURES IN SEMICONDUCTOR DEVICES

(71) Applicant: Taiwan Semiconductor Manufacturing Company, Ltd., Hsinchu (TW)

(72) Inventors: Wei-Jin Li, Hsinchu (TW); Che-Hao Chang, Hsinchu (TW); Zhen-Cheng Wu, Hsinchu (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 614 days.

(21) Appl. No.: 17/836,740

(22) Filed: Jun. 9, 2022

(65) Prior Publication Data

US 2023/0290853 A1    Sep. 14, 2023

Related U.S. Application Data

(60) Provisional application No. 63/319,526, filed on Mar. 14, 2022.

(51) Int. Cl.
| | |
|---|---|
| *H10D 30/67* | (2025.01) |
| *H01L 21/02* | (2006.01) |
| *H01L 21/311* | (2006.01) |
| *H01L 21/3115* | (2006.01) |
| *H01L 21/762* | (2006.01) |
| *H10D 62/10* | (2025.01) |

(52) U.S. Cl.
CPC ... *H10D 30/6735* (2025.01); *H01L 21/02332* (2013.01); *H01L 21/31116* (2013.01);
(Continued)

(58) Field of Classification Search
CPC ........... H01L 29/42392; H01L 29/0673; H01L 29/78689; H01L 21/76224;
(Continued)

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |
| (Continued) | | | |

FOREIGN PATENT DOCUMENTS

| | | |
|---|---|---|
| DE | 102017117984 A1 | 4/2018 |
| KR | 10-2017-0011957 A | 2/2017 |
| TW | 202207368 A | 2/2022 |

OTHER PUBLICATIONS

Taiwan Semiconductor Manufacturing Co., Ltd., Intellectual Property Office Notice of Final Rejection, Jan. 24, 2025, 3 pages.

*Primary Examiner* — Christine S. Kim
*Assistant Examiner* — Tyler J Wiegand
(74) *Attorney, Agent, or Firm* — Sterne, Kessler, Goldstein & Fox P.L.L.C.

(57) ABSTRACT

A semiconductor device with doped shallow trench isolation (STI) structures and a method of fabricating the same are disclosed. The method includes forming a fin structure on a substrate, forming a superlattice structure with first and second nanostructured layers arranged in an alternating configuration on the fin structure, depositing an oxide liner surrounding the superlattice structure and the fin structure in a first deposition process, forming a dopant source liner on the oxide liner, depositing an oxide fill layer on the dopant source liner in a second deposition process different from the first deposition process, performing a doping process to form a doped oxide liner and a doped oxide fill layer, removing portions of the doped oxide liner, the doped oxide fill layer, and the dopant source liner from sidewalls of the superlattice structure, and forming a gate structure on the fin structure and surrounding the first nanostructured layers.

20 Claims, 56 Drawing Sheets

(52) U.S. Cl.
CPC .... *H01L 21/3115* (2013.01); *H01L 21/31155* (2013.01); *H01L 21/76224* (2013.01); *H10D 30/6757* (2025.01); *H10D 62/118* (2025.01)

(58) Field of Classification Search
CPC ....... H01L 21/76237; H01L 21/823481; H01L 21/02329–02332; H01L 21/02321; H01L 21/823878; H01L 21/3115–31155; H10D 84/0151; H10D 84/0188; H10D 30/6735; H10D 30/6757
See application file for complete search history.

(56) References Cited

U.S. PATENT DOCUMENTS

| | | | |
|---|---|---|---|
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 11,664,441 B2 | 5/2023 | Lin et al. | |
| 2009/0321809 A1* | 12/2009 | Ramaswamy | H01L 21/02332 257/E29.129 |
| 2017/0025535 A1 | 1/2017 | Wu et al. | |
| 2018/0130800 A1 | 5/2018 | Huang et al. | |
| 2018/0138268 A1* | 5/2018 | Smith | H10D 62/834 |
| 2018/0145131 A1 | 5/2018 | Wang et al. | |
| 2019/0371650 A1* | 12/2019 | Sun | H01L 21/76202 |
| 2020/0357703 A1* | 11/2020 | Lee | H01L 21/76224 |
| 2021/0257480 A1* | 8/2021 | Jhan | H01L 29/78696 |
| 2022/0051906 A1* | 2/2022 | Chiu | H01L 21/823807 |

* cited by examiner

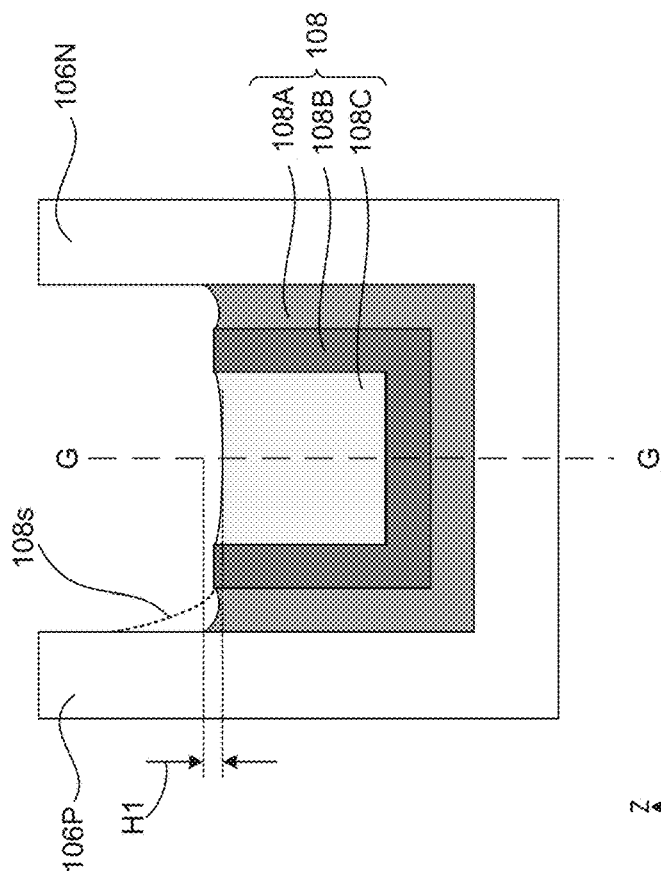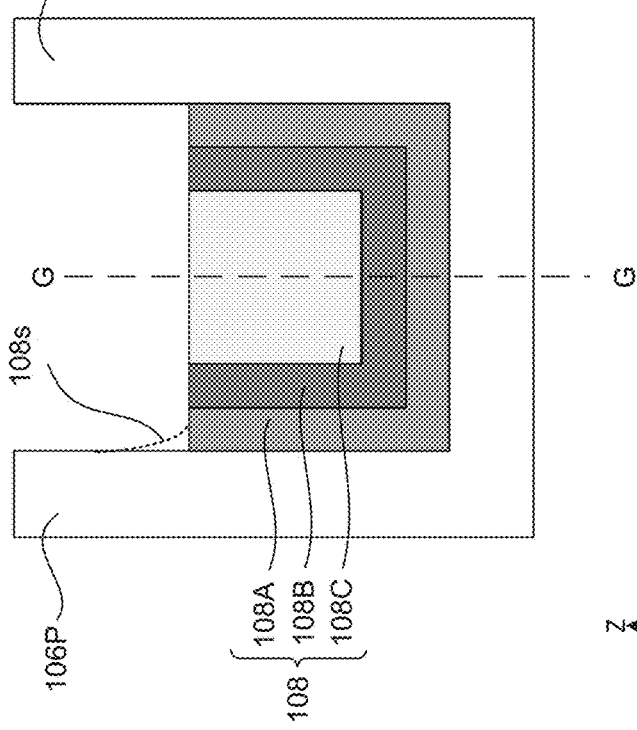
FIG. 5F
FIG. 5G

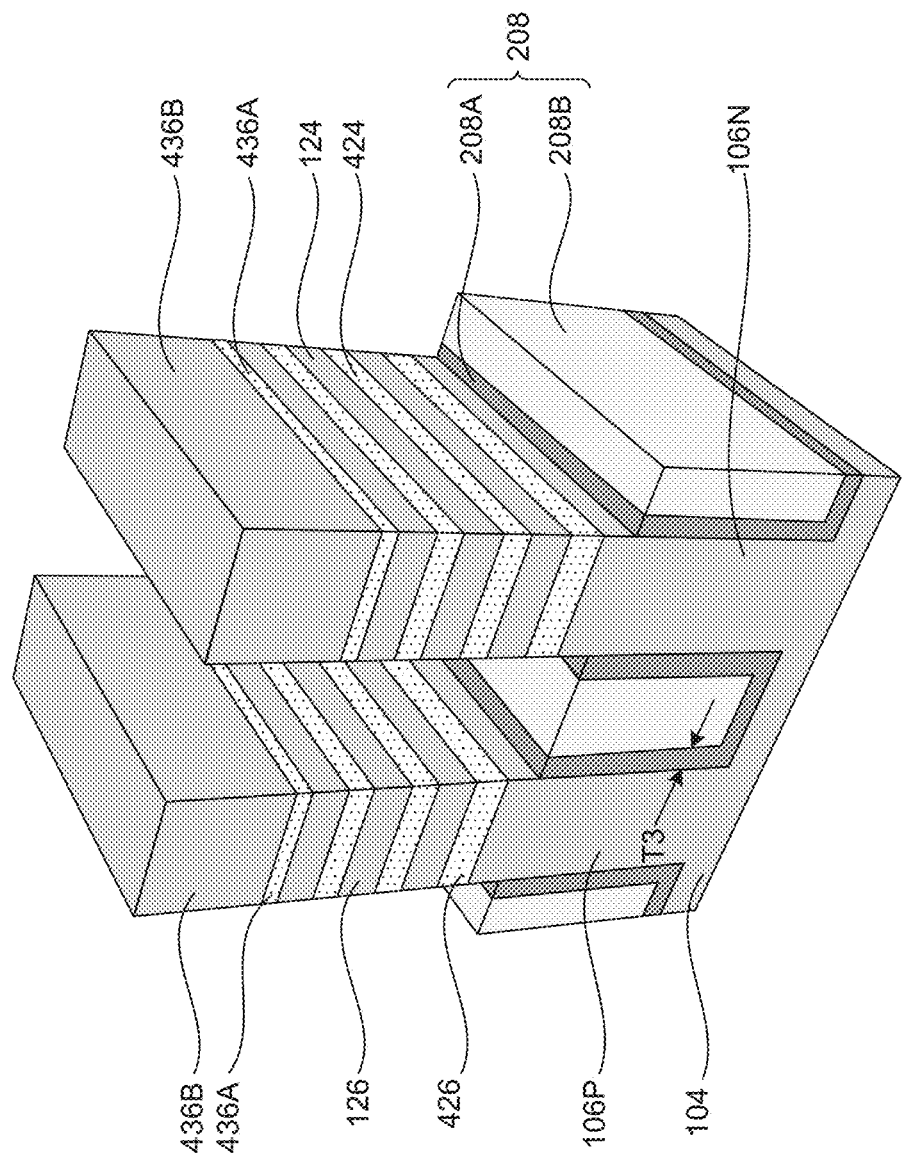
FIG. 7E
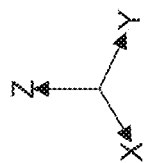

PROFILE CONTROL OF ISOLATION STRUCTURES IN SEMICONDUCTOR DEVICES

CROSS-REFERENCE TO RELATED APPLICATION

This application claims the benefit of U.S. Provisional Patent Application No. 63/319,526, titled "Shallow Trench Isolation Structures," filed on Mar. 14, 2022, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 4, 5A-5B, 5E-5G, 6A-6D, 8-13, and 14A-19D illustrate isometric, cross-sectional, and top-down views of a semiconductor device with isolation structures at various stages of its fabrication process, in accordance with some embodiments.

FIGS. 7A-7B and 7E illustrate isometric views of another semiconductor device with isolation structures at various stages of its fabrication process, in accordance with some embodiments.

Figure 1A:
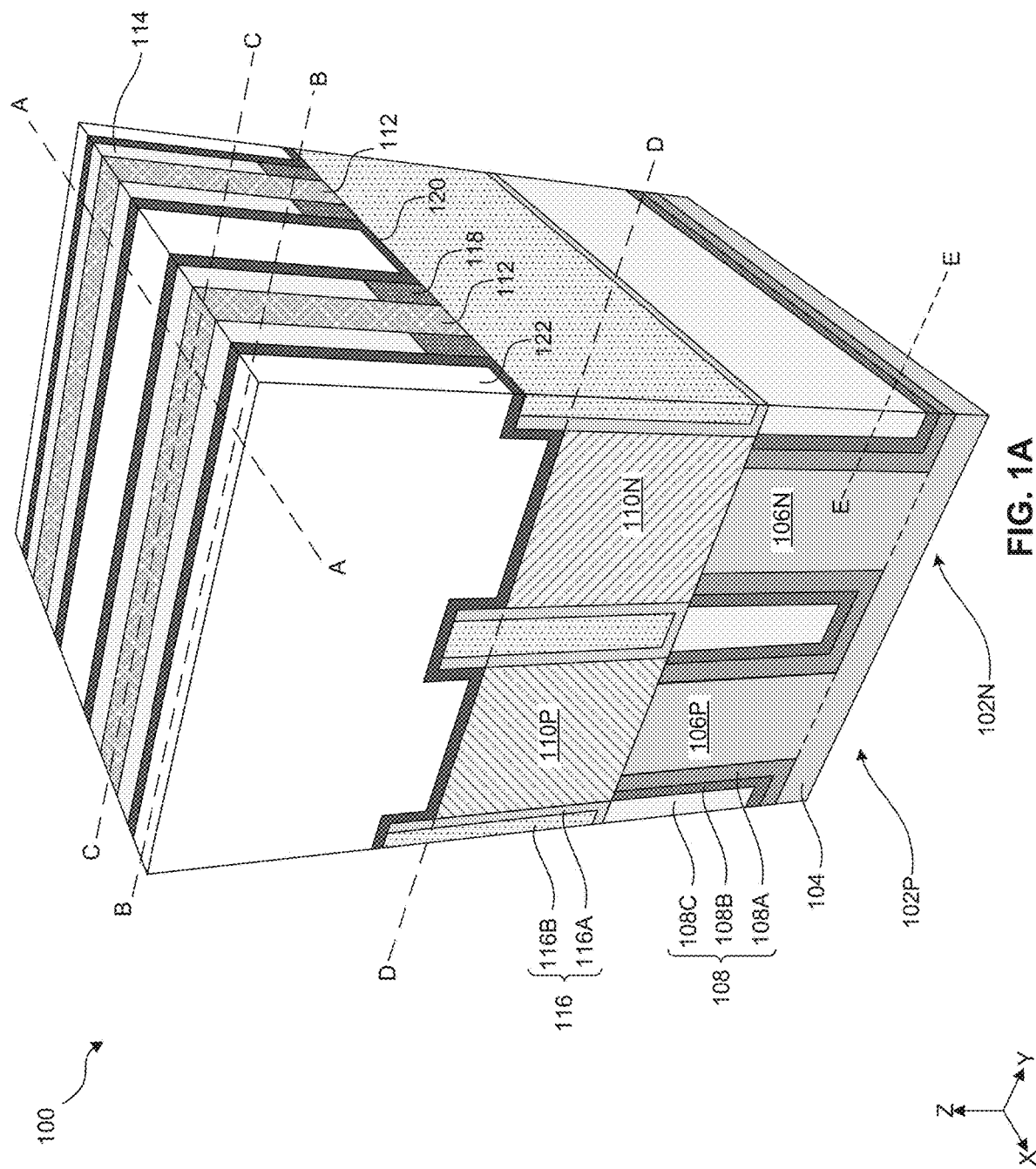
FIGS. 1A-1E illustrate isometric, cross-sectional, and top-down views of a semiconductor device with isolation structures, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example structures of semiconductor devices (e.g. GAA FETs) with doped shallow trench isolation (STI) structures and examples methods of fabricating the same. In some embodiments, the doped STI structure can include a doped liner, a dopant source liner, and a doped fill layer. In some embodiments, the formation of the doped STI structure can include forming a stack with a liner, a dopant source liner, and a fill layer with an etching rate faster than an etching rate of the liner. The formation of the doped STI structure can further include doping the liner and the fill layer by annealing the stack to implant dopant material from the dopant source liner into the liner and the fill layer. The doping of the liner and the fill layer can reduce the etching rate difference between the liner and the fill layer and/or modify the etching rates of the liner and the fill layer to be substantially equal to each other. As a result, the uniformity of the etched surface profiles of the doped STI structure is improved. The improved uniform surface profiles of the doped STI structure results in improved linear profiles of structures subsequently formed on the doped STI structure, preventing or reducing fabrication defects in the subsequently-formed structures.

In some embodiments, the dopant source liner can include a nitride layer (e.g., silicon oxynitride (SiON) or silicon nitride (SiN)), and the doped liner and the doped fill layer can include nitrogen dopants. In some embodiments, the concentration of nitrogen atoms in the dopant source liner can decrease to a range of about 0 atomic % to about 5 atomic % from a range of about 5 atomic % to about 20 atomic % after the annealing process. In some embodiments, the doped fill layer can include a concentration of nitrogen dopants of about 1 atomic % to about 5 atomic %. The concentration of nitrogen dopants in the doped fill layer is greater than the concentration of nitrogen dopants in the doped liner.

Figure 1B:
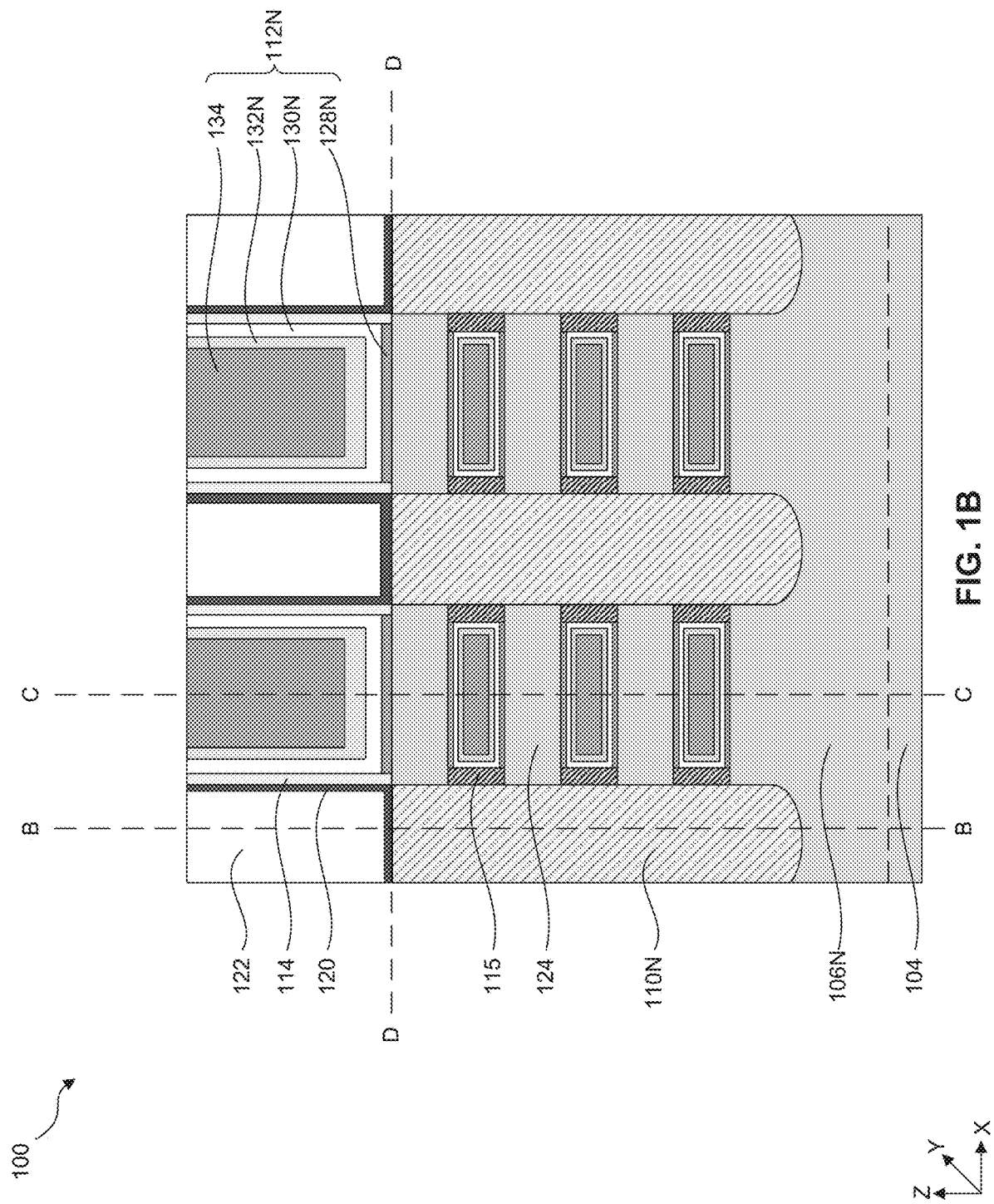
Figure 1C:
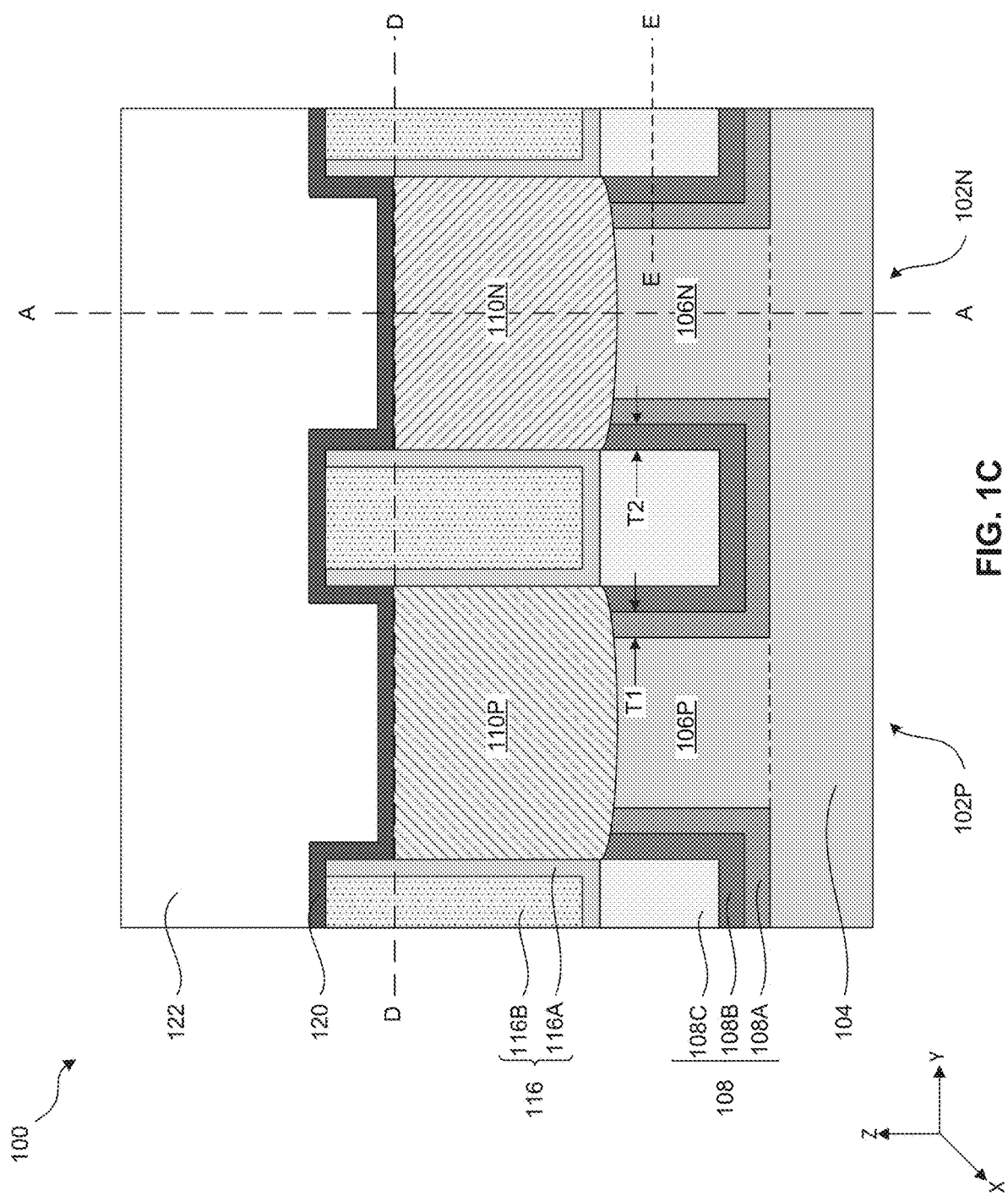
Figure 1D:
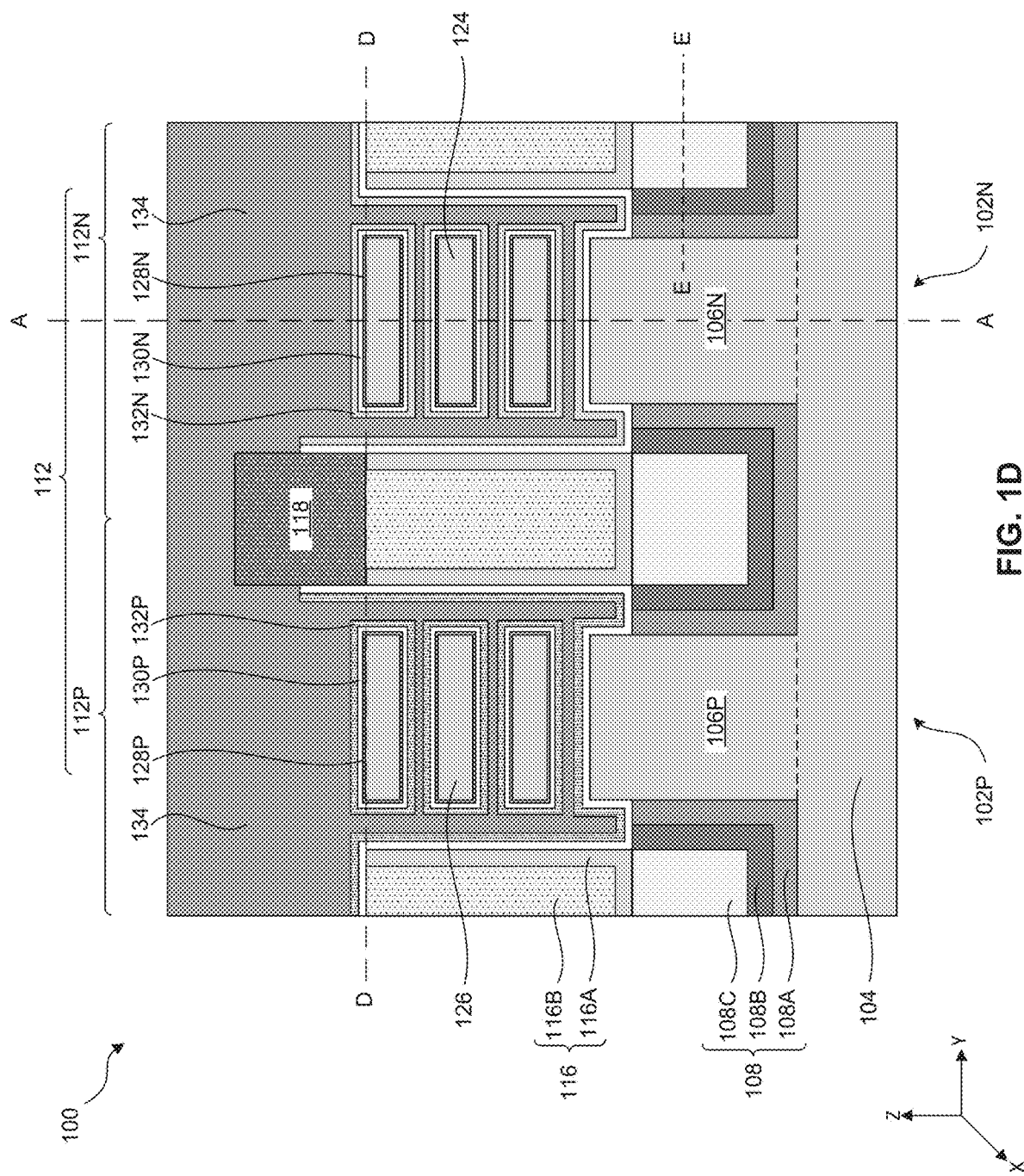
Figure 1E:
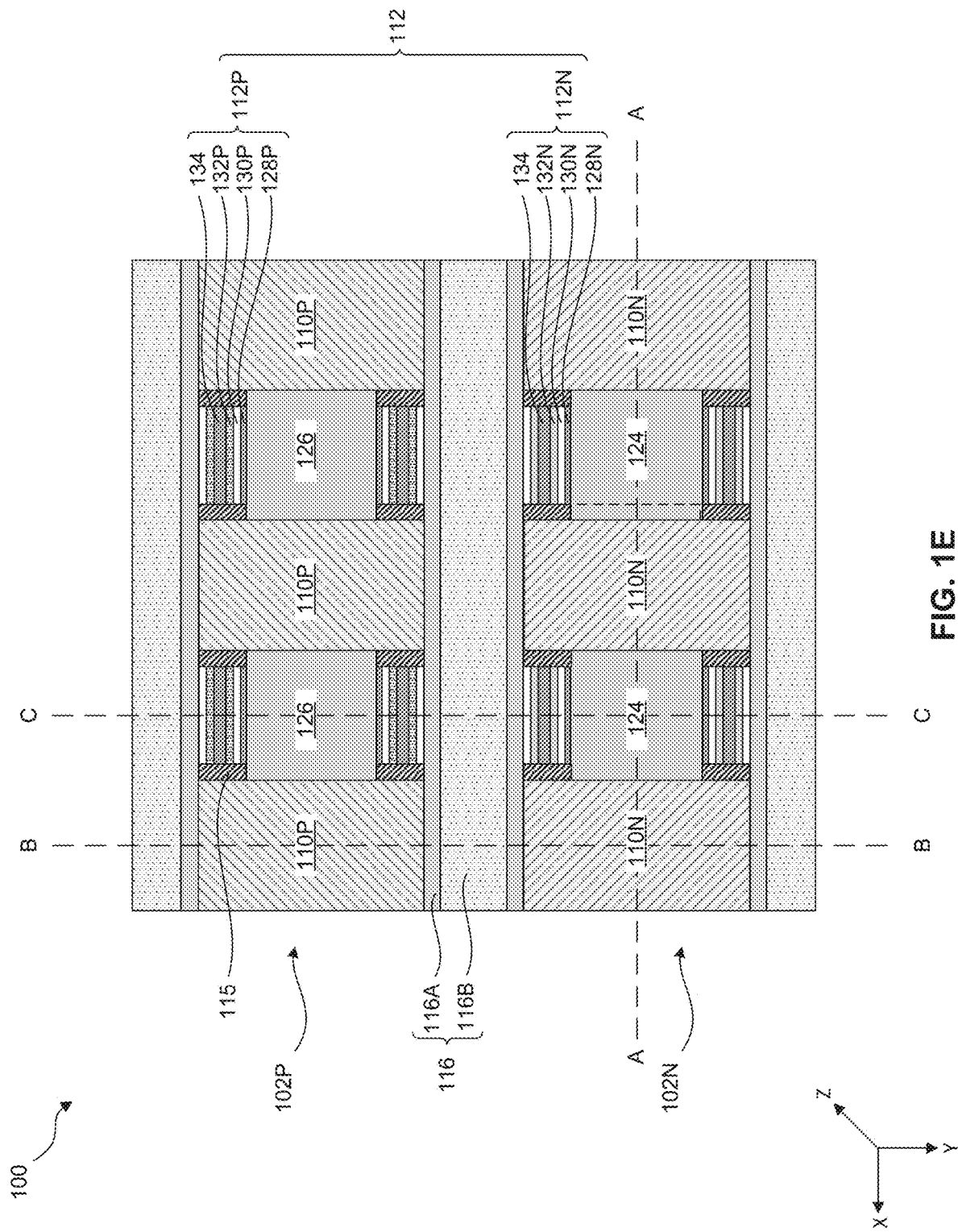

FIG. 1A illustrates an isometric view of a semiconductor device 100 with NFET 102N and PFET 102P, according to some embodiments. FIGS. 1B, 1C, and 1D illustrate cross-sectional views of semiconductor device 100 along lines A-A, B-B, and C-C of FIGS. 1A-1E, according to some embodiments. FIG. 1E illustrates a top-down view of semiconductor device 100 along lines D-D of FIGS. 1A-1D, according to some embodiments. FIGS. 1B-1E illustrate views of semiconductor device 100 with additional structures that are not shown in FIG. 1A for simplicity. The discussion of elements with the same annotations applies to each other, unless mentioned otherwise.

Referring to FIGS. 1A-1E, semiconductor device 100 can include (i) a substrate 104, (ii) fin structures 106N and 106P disposed on substrate 104, (iii) doped STI structures 108 disposed on substrate 104 and adjacent to fin structures 106N and 106P, (iv) source/drain (S/D) regions 110N and 110P disposed on fin structures 106N and 106P, respectively, (v) gate structures 112, (vi) gate spacers 114, (vii) isolation structures 116 disposed on doped STI structures 108, (viii) barrier layers 118 disposed on isolation structures 116, (ix) etch stop layer (ESL) 120, (x) interlayer dielectric (ILD) layer 122, (xi) stacks of nanostructured channel regions 124 disposed on fin structure 106N, (xii) stacks of nanostructured channel regions 126 disposed on fin structure 106P, and (xiii) inner spacers 115. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm. In some embodiments, nanostructured channel regions 124 and/or 126 can be in the form of nanosheets, nanowires, nanorods, nanotubes, or other suitable nanostructured shapes.

In some embodiments, substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structures 106N and 106P can include a material similar to substrate 104 and extend along an X-axis.

In some embodiments, each of doped STI structures 108 can include a doped liner 108A disposed on substrate 104 and along sidewalls of fin structures 106N-106P, a dopant source liner 108B disposed on doped liner 108A, and a doped fill layer 108C disposed on dopant source liner 108B. In some embodiments, doped liner 108A and doped fill layer 108C can include an insulating oxide layer with dopants, and dopant source liner 108B can include an insulating compound of the dopant material. In some embodiments, doped liner 108A and doped fill layer 108C can include the same type of dopants. In some embodiments, the insulating oxide layer can include silicon oxide (SiO2) layer or other suitable insulating oxide layers. In some embodiments, doped liner 108A, dopant source liner 108B, and doped fill layer 108C can include a semiconductor element similar to or different from each other.

Figure 1F:
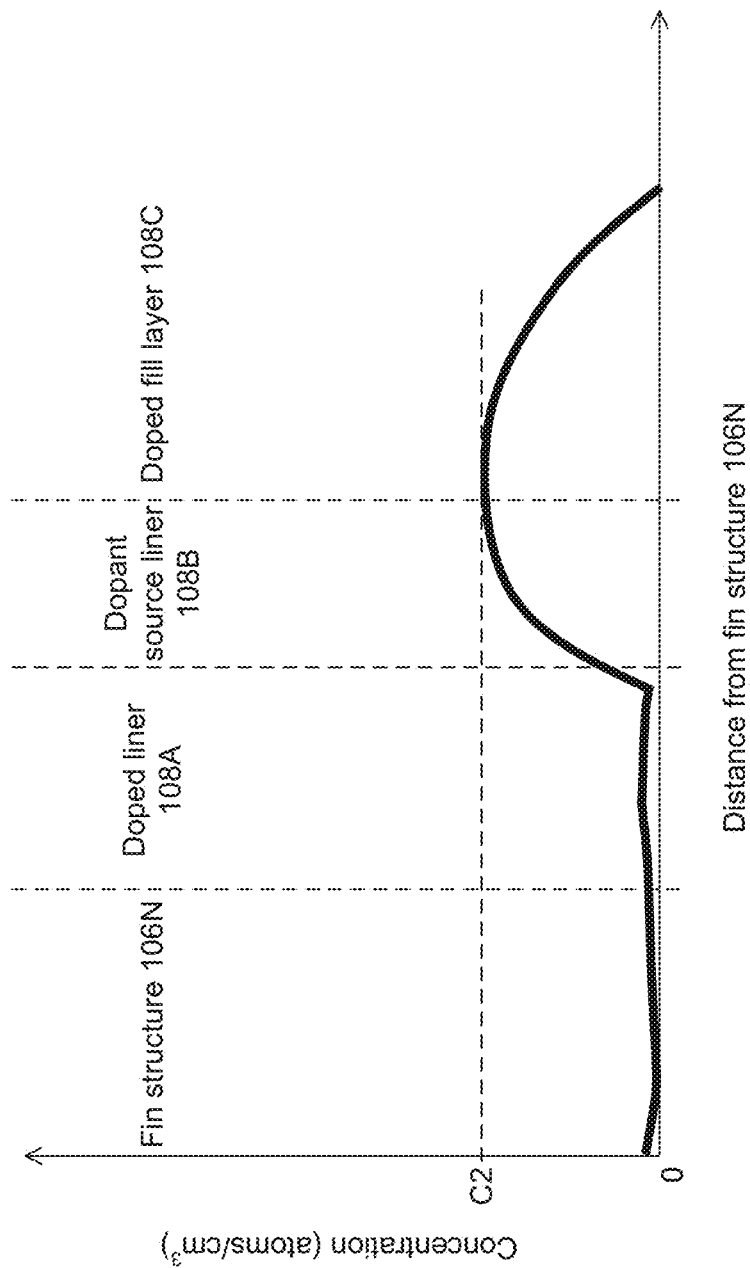
FIG. 1F illustrate characteristics of an isolation structure, in accordance with some embodiments.

In some embodiments, doped liner 108A and doped fill layer 108C can include an insulating oxide layer with nitrogen dopants, and dopant source liner 108B can include a nitride layer, such SiN layer, SiON layer, or other suitable nitride layers. In some embodiments, doped liner 108A, dopant source liner 108B, and doped fill layer 108C can have a concentration profile of nitrogen atoms with a peak concentration C2 along lines E-E of FIGS. 1A and 1D-1E, as shown in FIG. 1F. The concentration of nitrogen atoms in doped fill layer 108C can be greater than the concentration of nitrogen atoms in doped liner 108A and dopant source liner 108B, as shown in FIG. 1F.

In some embodiments, the type and concentration profile of dopants in doped liner 108A and doped fill layer 108C (e.g., as shown in FIG. 1F), and the material of dopant source liner 108B (e.g., SiN or SiON) can be selected to achieve substantially equal etching rates of doped liner 108A, dopant source liner 108B, and doped fill layer 108C or to achieve an etching rate difference among doped liner 108A, dopant source liner 108B, and doped fill layer 108C less than about 1 nm/sec. Such etching rates between doped liner 108A, dopant source liner 108B, and doped fill layer 108C can facilitate the formation of doped STI structures 108 with substantially planar top surface profiles. The substantially planar top surface profiles of doped STI structures 108 can facilitate the subsequent formation of structures (e.g., cladding layers 838 shown in FIG. 8) on doped STI structures 108 with improved linear sidewall profiles. The subsequently-formed structures with improved linear sidewall profiles can prevent or reduce fabrication defects in the subsequent formation of S/D regions 110N-110P and gate structures 112, as described below with reference to FIGS. 8-13 and 14A-19D.

Referring to FIG. 1F, in some embodiments, the peak concentration C2 of nitrogen atoms can be equal to or less than about 5 atomic %. In some embodiments, the concentration of nitrogen atoms in doped liner 108A can range from about 0.1 atomic % to about 4 atomic %. In some embodiments, the concentration of nitrogen atoms in doped fill layer 108C can range from about 1 atomic % to about 5 atomic %. Below these concentrations of nitrogen atoms in doped liner 108A and doped fill layer 108C, substantially equal etching rates of doped liner 108A and doped fill layer 108C may not be achieved. On the other hand, above these concentrations of nitrogen atoms in doped liner 108A, dopant source liner 108B, and doped fill layer 108C, the nitrogen atoms can introduce fixed charges in doped liner 108A, which can induce a current leakage path in substrate 104.

In some embodiments, doped liner 108A can have a thickness T1 of about 2 nm to about 10 nm. If thickness T1 is below 2 nm, nitrogen atoms from dopant source liner 108B can introduce fixed charges in doped liner 108A, which can induce a current leakage path in substrate 104. In addition, thickness T1 below 2 nm may not adequately protect fin structures 106N-106P from thermal damages during subsequent annealing and/or deposition processes. On the other hand, if thickness T1 is greater than 10 nm, the processing time for doping doped liner 108A increases, and consequently increases device manufacturing cost. In some embodiments, dopant source liner 108B can have a thickness T2 of about 1 nm to about 6 nm. If thickness T2 is below 1 nm, dopant source liner 108B may not provide adequate concentrations of nitrogen atoms to doped liner 108A and doped fill layer 108C to achieve substantially equal etching rates of doped liner 108A and doped fill layer 108C. On the other hand, if thickness T2 is greater than 6 nm, nitrogen atoms from dopant source liner 108B can introduce fixed charges in doped liner 108A, which can induce a current leakage path in substrate 104.

Referring to FIGS. 1A-1C and 1E, in some embodiments, S/D regions 110N can include an epitaxially-grown semiconductor material, such as Si, and n-type dopants, such as phosphorus and other suitable n-type dopants. In some embodiments, S/D regions 110P can include an epitaxially-grown semiconductor material, such as Si and SiGe, and p-type dopants, such as boron and other suitable p-type dopants.

Referring to FIGS. 1B, 1D, and 1E, in some embodiments, nanostructured channel regions 124 and 126 can include semiconductor materials similar to or different from substrate 104. In some embodiments, nanostructured channel regions 124 and 126 can include Si, SiAs, silicon phosphide (SiP), SiC, SiCP, SiGe, Silicon Germanium Boron (SiGeB), Germanium Boron (GeB), Silicon-Germanium-Tin-Boron (SiGeSnB), a III-V semiconductor compound, or other suitable semiconductor materials. Though rectangular cross-sections of nanostructured channel regions 124 and 126 are shown, nanostructured channel regions 124 and 126 can have cross-sections of other geometric shapes (e.g., circular, elliptical, triangular, or polygonal).

Referring to FIGS. 1A-1B and 1D-1E, in some embodiments, each of gate structures 112 can include a gate structure 112N surrounding nanostructured channel regions 124 and a gate structure 112P surrounding nanostructured channel regions 126 for which gate structures 112 can be referred to as "gate-all-around (GAA) structures" or "horizontal gate-all-around (HGAA) structures." The portions of gate structures 112N and 112P surrounding nanostructured channel regions 124 and 126 can be electrically isolated from adjacent S/D regions 110N and 110P by inner spacers 115. In some embodiments, semiconductor device 100 can be a finFET and have fin regions (not shown) instead of nanostructured channel regions 124 and 126.

In some embodiments, gate structures 112N and 112P of each gate structure 112 can include (i) interfacial oxide (IL) layers 128N and 128P disposed on nanostructured channel regions 124 and 126, respectively, (ii) high-k (HK) gate dielectric layers 130N and 130P disposed on IL layers 128N and 128P, respectively, (iii) work function metal (WFM) layers 132N and 132P disposed on HK gate dielectric layers 130N and 130P, respectively, and (iv) gate metal fill layers 134 disposed on WFM layers 132N and 132P. In some embodiments, gate structures 112N and 112P of each gate structure 112 can have a common gate metal fill layer 134. In some embodiments, WFM layers 132N and 132P can include materials different from each other. In some embodiments, IL layers 128N and 128P and HK gate dielectric layers 130N and 130P can include materials similar to or different from each other.

In some embodiments, IL layers 128N and 128P can include silicon oxide ($SiO_2$), silicon germanium oxide ($SiGeO_x$), or germanium oxide ($GeO_x$) and can have a thickness of about 0.5 nm to about 2 nm. In some embodiments, HK gate dielectric layers 130N and 130P can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), and can have a thickness of about 0.5 nm to about 4 nm. Within these thickness ranges of IL layers 128N and 128P and HK gate dielectric layers 130N and 130P, adequate electrical isolation between gate structures 112N and nanostructures channel regions 124 and between gate structures 112P and nanostructures channel regions 126 can be provided without compromising device size and manufacturing cost.

In some embodiments, WFM layers 132N can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based materials, or a combination thereof. In some embodiments, WFM layers 132P can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), and a combination thereof. In some embodiments, gate metal fill layers 134 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

In some embodiments, gate spacers 114, inner spacers 115, ESL 120, and ILD layer 122 can include an insulating material, such as $SiO_2$, SiN, silicon carbon nitride (SiCN), silicon oxycarbon nitride (SiOCN), and silicon germanium oxide.

In some embodiments, isolation structures 116 can electrically isolate S/D regions 110N and 110P from each other and gate structures 112N and 112P from each other. Isolation structures 116 can also prevent the merging of epitaxially-grown semiconductor materials of S/D regions 110N and 110P during the formation of S/D regions 110N and 110P. In some embodiments, isolation structures 116 can include an insulating liner 116A and an insulating fill layer 116B. In some embodiments, insulating liner 116A and insulating fill layer 116B can include $SiO_2$, SiN, silicon carbon nitride (SiCN), silicon oxycarbon nitride (SiOCN), or silicon germanium oxide. In some embodiments, sidewalls of isolation structures 116 can be formed substantially aligned with sidewalls of doped fill layer 108C to prevent or minimize etching of doped fill layer 108C during the formation of S/D regions 110N-110P, as described in detail below.

In some embodiments, barrier layers 118 can prevent isolation structures 116 from etching during the formation of S/D regions 110N and 110P, as described in detail below. In some embodiments, barrier layers 118 can include a rare earth metal oxide layer with a rare earth metal, such as hafnium (Hf), lanthanum (La), indium (In), rhodium (Rh), palladium (Pd), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and combinations thereof. The concentration of the rare earth metal atoms in the rare earth metal oxide layer can range from about $1 \times 10^{20}$ atoms/cm$^3$ to about $3 \times 10^{22}$ atoms/cm$^3$. If the concentration is lower than about $1 \times 10^{20}$ atoms/cm$^3$, barrier layers 118 may not adequately protect isolation structures 116 from etching during the formation of S/D regions 110N and 110P. On the other hand, the device manufacturing cost increases if the concentration is higher than about $3 \times 10^{22}$ atoms/cm$^3$.

Figure 2A:
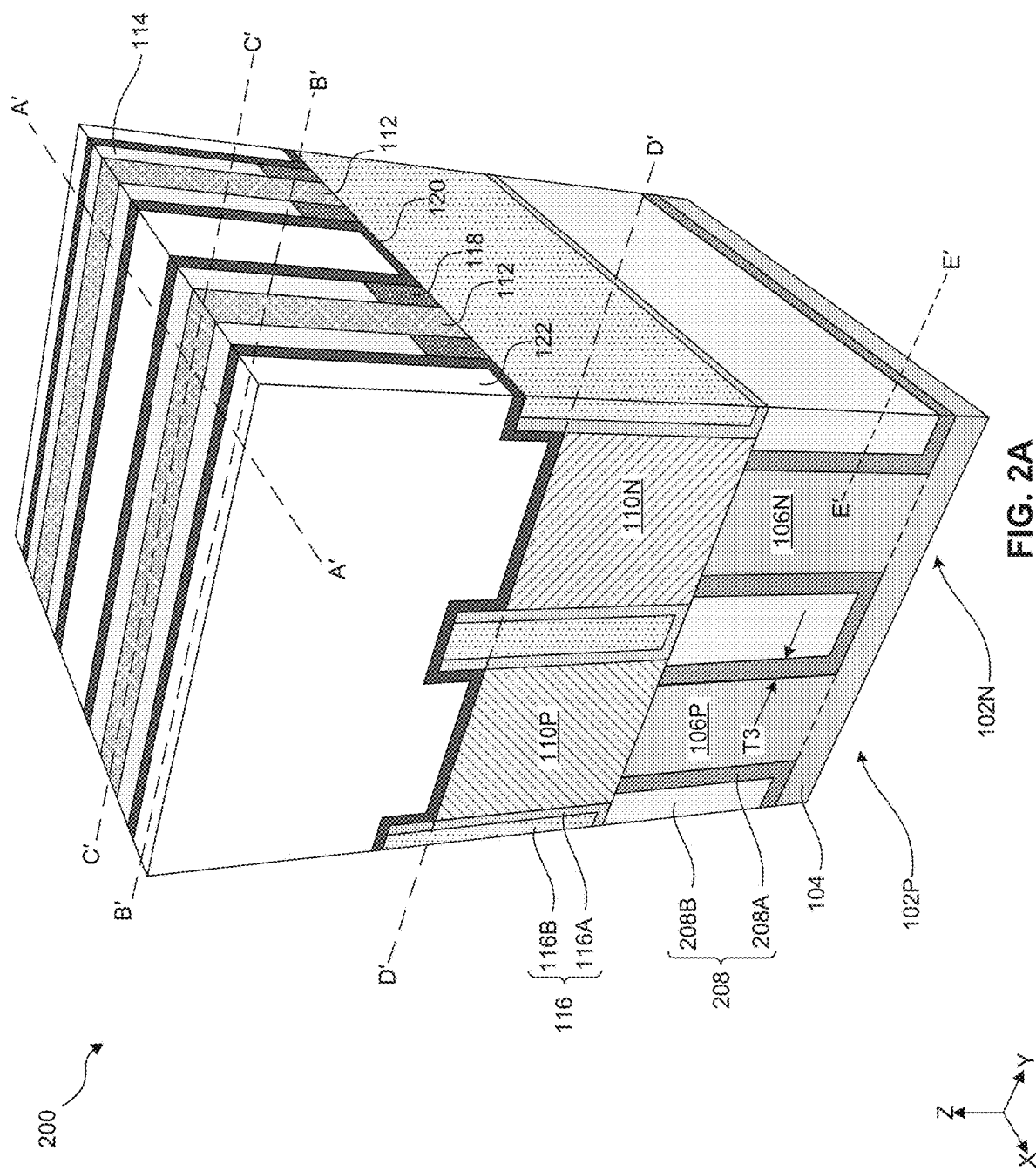
FIG. 2A illustrates an isometric view of another semiconductor device with isolation structures, in accordance with some embodiments.

FIG. 2A illustrates an isometric view of a semiconductor device 200 with NFET 102N and PFET 102P, according to some embodiments. The discussion of semiconductor device 100 applies to semiconductor device 200, except for doped STI structures 208 of semiconductor device 200. In some embodiments, views of semiconductor device 200 along lines A'-A', B'-B', C'-C', and D'-D' can be similar to that of FIGS. 1B, 1C, 1D, and 1E, except for doped STI structures 208. In some embodiments, doped STI structures 208 can include a bi-layered structure of a nitrogen-based liner 208A and a doped fill layer 208B, instead of a tri-layered structure of doped STI structure 108.

In some embodiments, nitrogen-based liner 208A can include an insulating nitride layer and doped fill layer 208B can include an insulating oxide layer with nitrogen dopants. In some embodiments, the insulating nitride layer can include SiN, SiON, or other suitable insulating nitride layers, and the insulating oxide layer can include SiO$_2$ layer or other suitable insulating oxide layers. In some embodiments, nitrogen-based liner 208A and doped fill layer 208B can include a semiconductor element similar to or different from each other.

Figure 2B:
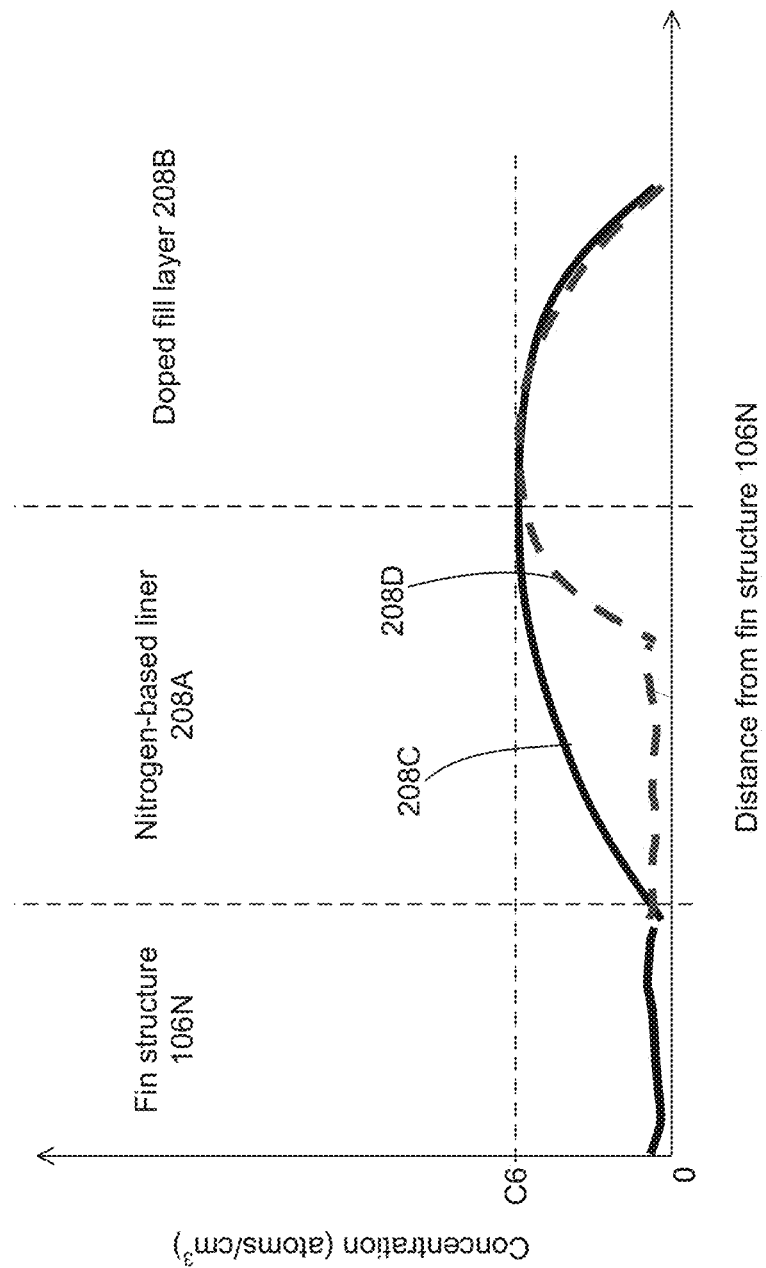
FIG. 2B illustrates characteristics of another isolation structure, in accordance with some embodiments.

In some embodiments, nitrogen-based liner 208A and doped fill layer 208B can have concentration profiles 208C or 208D of nitrogen atoms with a peak concentration C6 along a line E'-E' of FIG. 2A, as shown in FIG. 2B. The concentration of nitrogen atoms in doped fill layer 208B can be substantially equal (e.g., concentration profile 208C) or greater (e.g., concentration profile 208D) than the concentration of nitrogen atoms in nitrogen-based liner 208A. In some embodiments, the type and concentration profile of dopants in doped fill layer 208B (e.g., as shown in FIG. 2B), and the material of nitrogen-based liner 208A (e.g., SiN or SiON) can be selected to achieve substantially equal etching rates of nitrogen-based liner 208A and doped fill layer 208B or to achieve an etching rate difference between nitrogen-based liner 208A and doped fill layer 208B less than about 1 nm/sec. Such etching rates between nitrogen-based liner 208A and doped fill layer 208B can facilitate the formation of doped STI structures 208 with substantially planar top surface profiles. Similar to doped STI structures 108, the substantially planar top surface profiles of doped STI structures 208 can facilitate the subsequent formation of structures (e.g., cladding layers 838 shown in FIG. 8) on doped STI structures 208 with improved linear sidewall profiles.

Referring to FIG. 2B, in some embodiments, the peak concentration C6 of nitrogen atoms can be equal to or less than about 5 atomic %. In some embodiments, the concentration of nitrogen atoms in nitrogen-based liner 208A and doped fill layer 208B can range from about 1 atomic % to about 5 atomic %. Below these concentrations of nitrogen atoms in nitrogen-based liner 208A and doped fill layer 208B, substantially equal etching rates of nitrogen-based liner 208A and doped fill layer 208B may not be achieved. On the other hand, above these concentrations of nitrogen atoms in nitrogen-based liner 208A and doped fill layer 208B, the nitrogen atoms can introduce fixed charges in nitrogen-based liner 208A, which can induce a current leakage path in substrate 104. In some embodiments, sidewalls of isolation structures 116 can be formed substantially aligned (not shown) with sidewalls of doped fill layer 208B to prevent or minimize etching of doped fill layer 208B during the formation of S/D regions 110N-110P.

Referring to FIG. 2A, in some embodiments, nitrogen-based liner 208A can have a thickness T3 of about 2 nm to about 10 nm. If thickness T3 is below 2 nm, nitrogen-based liner 208A may not adequately protect fin structures 106N-106P from thermal damages during subsequent annealing and/or deposition processes. In addition, thickness T3 below 2 nm may not provide adequate concentration of dopants to doped fill layer 208B. On the other hand, if thickness T3 is greater than 10 nm, nitrogen atoms can introduce fixed charges in nitrogen-based liner 208A, which can induce a current leakage path in substrate 104.

Figure 3:
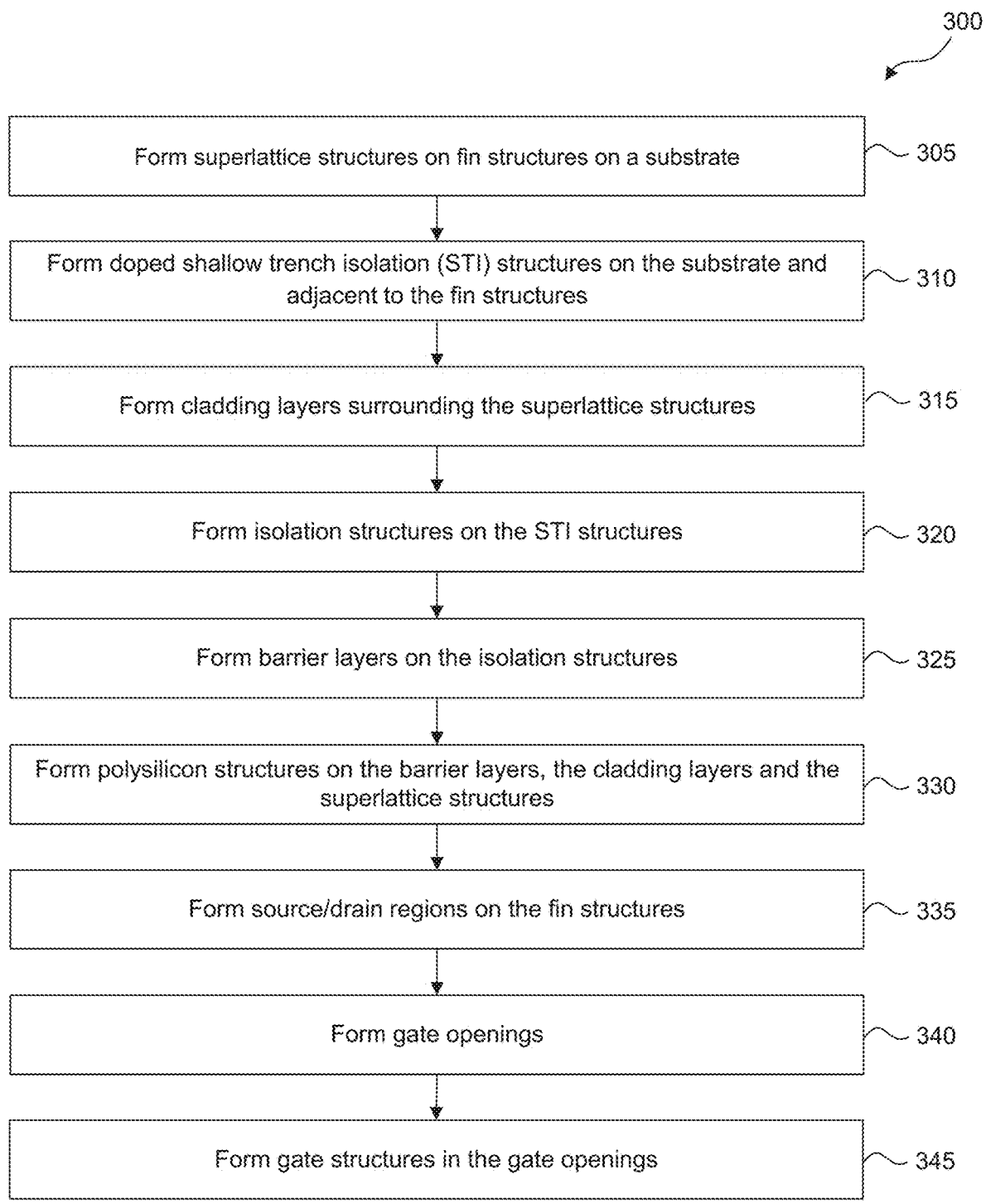
FIG. 3 is a flow diagram of a method for fabricating a semiconductor device with isolation structures, in accordance with some embodiments.

FIG. 3 is a flow diagram of an example method 300 for fabricating semiconductor devices 100 and 200, according to some embodiments. For illustrative purposes, the operations illustrated in FIG. 3 will be described with reference to the example fabrication process for fabricating semiconductor devices 100 and 200 as illustrated in FIGS. 4, 5A-5G, 6A-6D, 7A-7E, 8-13, and 14A-19D. FIGS. 4, 5A-5B, 5E, 6A-6D, and 8-13 are isometric views of semiconductor devices 100 at various stages of fabrication, according to some embodiments. FIGS. 7A-7B and 7E are isometric views of semiconductor devices 200 at various stages of fabrication, according to some embodiments. FIGS. 14A-19A are cross-sectional views of semiconductor devices 100 along lines A-A of FIGS. 1A and 1C-1E at various stages of fabrication, according to some embodiments. FIGS. 14B-19B are cross-sectional views of semiconductor devices 100 along lines B-B of FIGS. 1A-1B and 1E at various stages of fabrication, according to some embodiments. FIGS. 14C-19C are cross-sectional views of semiconductor devices 100 along lines C-C of FIGS. 1A-1B and 1E at various stages of fabrication, according to some embodiments. FIGS. 14D-19D are top-down views of semiconductor devices 100 along lines D-D of FIGS. 1A-1D at various stages of fabrication, according to some embodiments. Operations can be performed in a different order or not performed depending on specific applications. It should be noted that method 300 may not produce a semiconductor device 100 or 200. Accordingly, it is understood that additional processes can be provided before, during, and after method 300, and that some other processes may only be briefly described herein. Elements in FIGS. 4, 5A-5G, 6A-6D, 7A-7E, 8-13, and 14A-19D with the same annotations as elements in FIGS. 1A-1F are described above.

Figure 4:
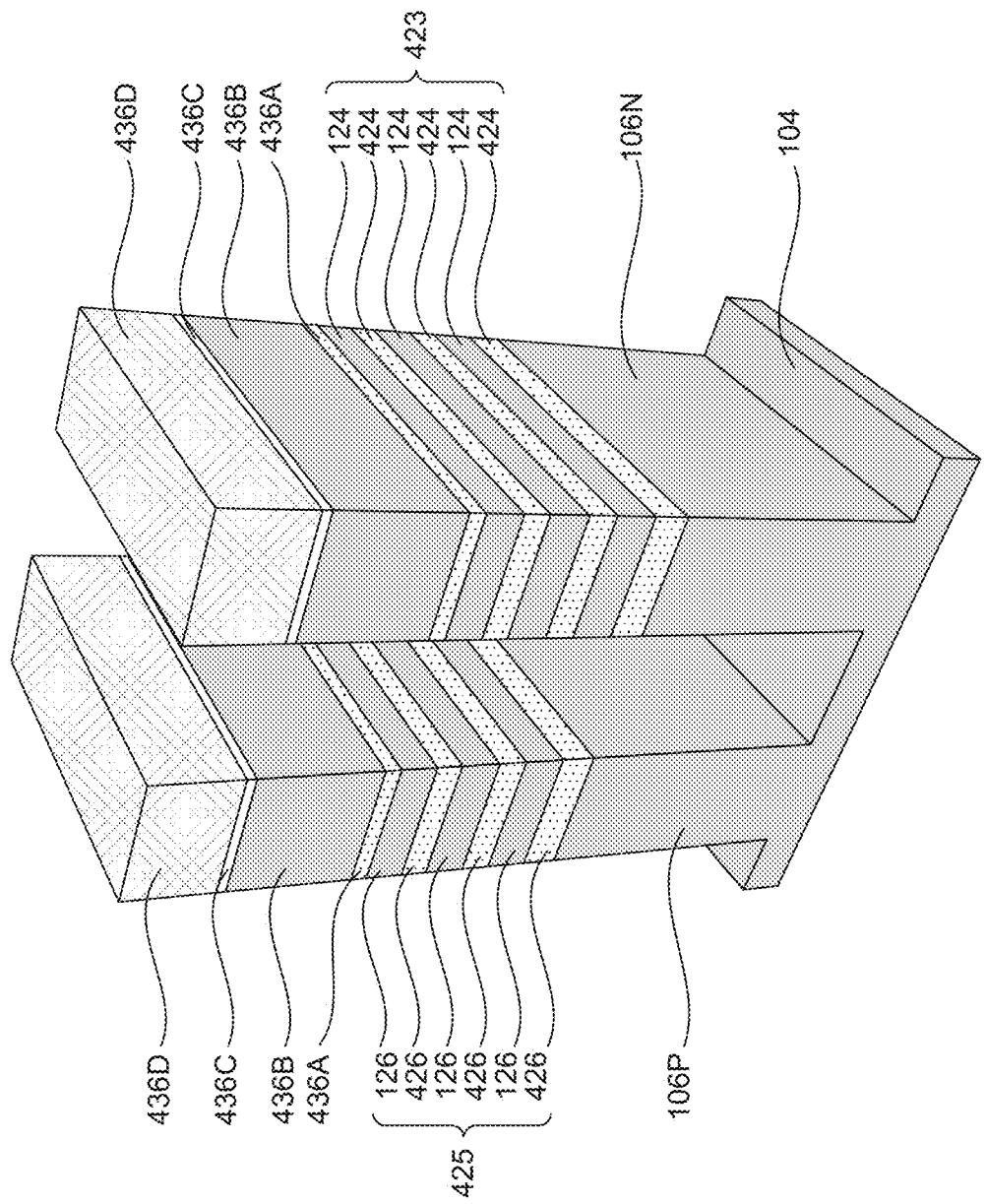

Referring to FIG. 3, in operation 305, superlattice structures are formed on fin structures on a substrate. For example, as shown in FIG. 4, superlattice structures 423 and 425 are formed on fin structures 106N and 106P, respectively. In some embodiments, superlattice structure 423 can include epitaxially-grown nanostructured channel regions 124 and nanostructured layer 424 arranged in an alternating configuration and superlattice structure 425 can include epitaxially-grown nanostructured channel regions 126 and nanostructured layer 426 arranged in an alternating configuration. In some embodiments, nanostructured channel regions 124 and 126 can include Si without any substantial amount of Ge (e.g., with no Ge) and nanostructured layers 424 and 426 can include SiGe. Nanostructured layers 424 and 426 are also referred to as sacrificial layers. During subsequent processing, nanostructured layer 424 and 426 can be replaced in a gate replacement process to form portions of gate structures 112N and 112P, respectively.

In some embodiments, a stack of masking layers 436A-436D can be formed on each of superlattice structures 423 and 425. In some embodiments, masking layer 436A can include a material similar to that of nanostructured layer 424, masking layer 436B can include a material similar to that of nanostructured channel regions 124, masking layer 436C can include an oxide layer, and masking layer 436D can include a nitride layer.

Referring to FIG. 3, in operation 310, doped STI structures are formed on the substrate and adjacent to the fin structures. For example, doped STI structures 108 can be formed on substrate 104 and adjacent to fin structures 106N and 106P as described with reference to FIGS. 5A-5G or as described with reference to FIGS. 6A-6E.

Figure 5A:
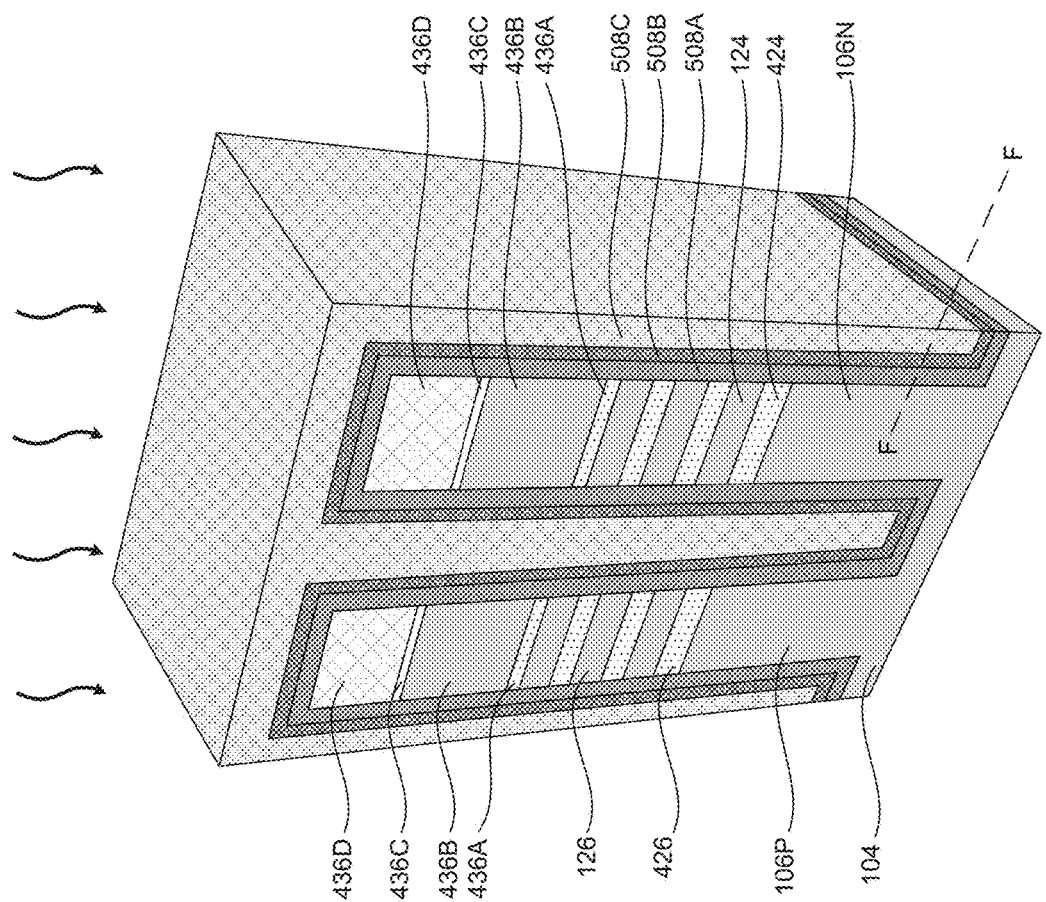
Figure 5A:
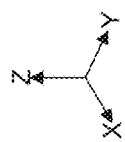
Figure 5B:
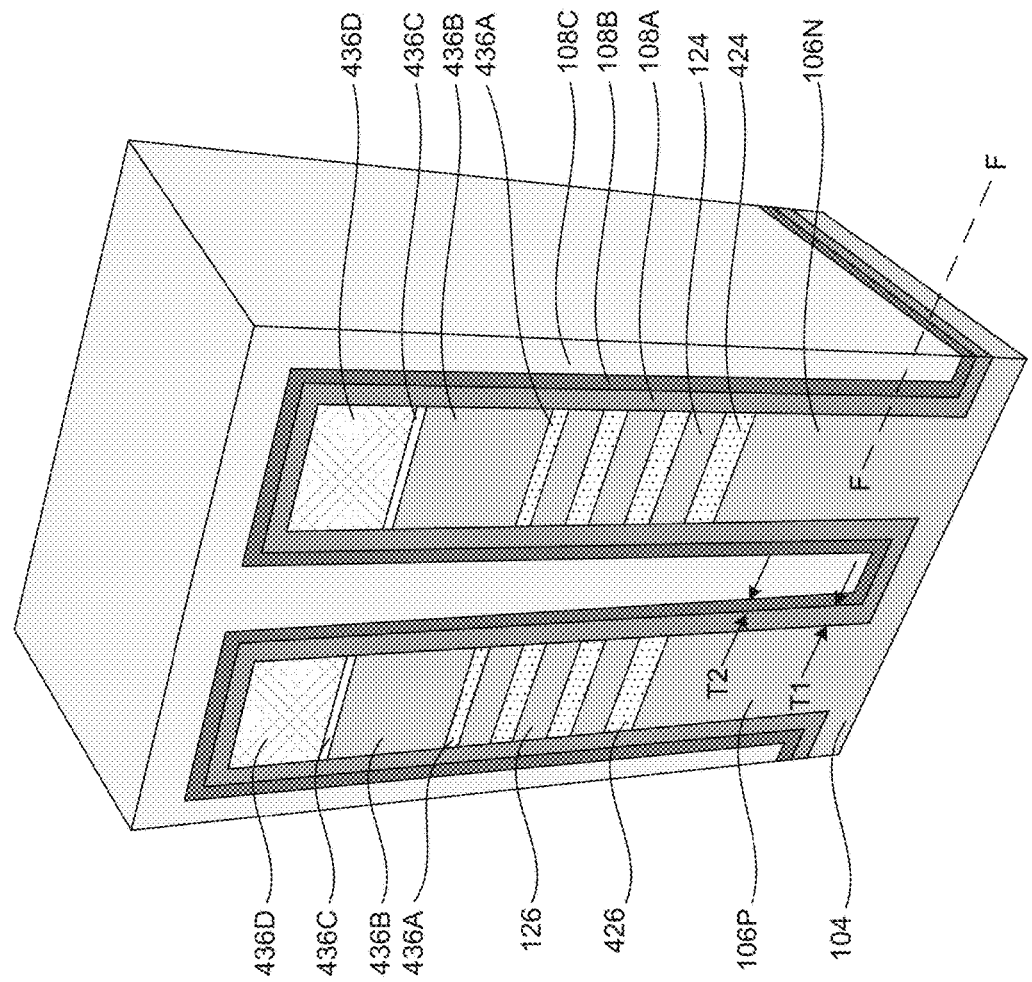
Figure 5B:
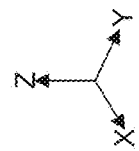
Figure 5C:
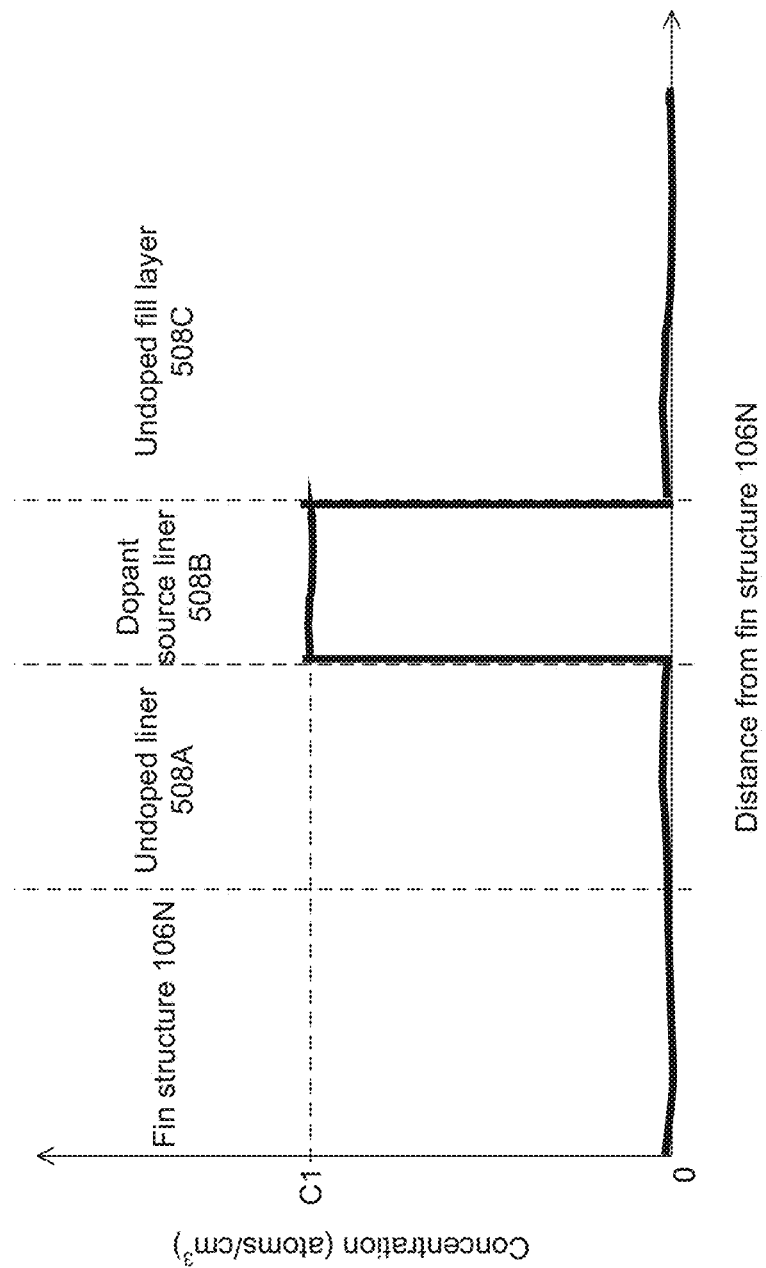
FIGS. 5C-5D and 6E illustrate characteristics of different isolation structures at various stages of its fabrication process, in accordance with some embodiments.
Figure 5D:
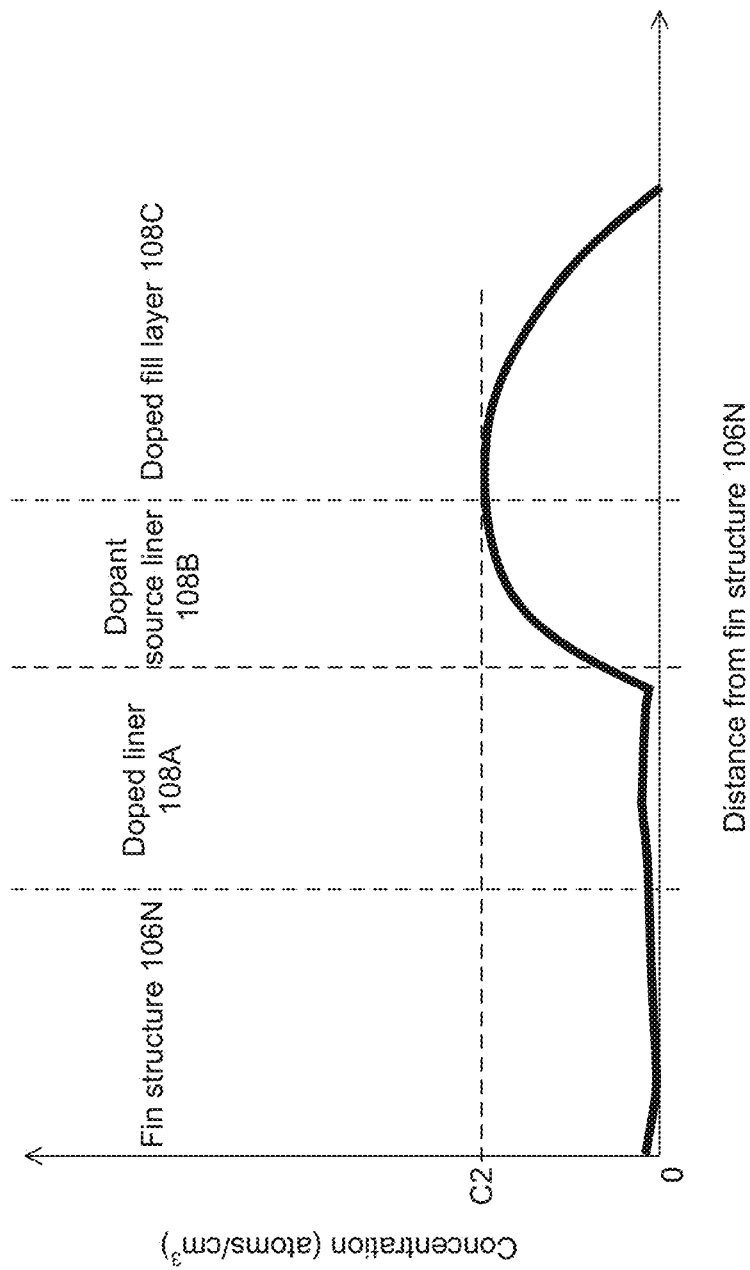
Figure 5E:
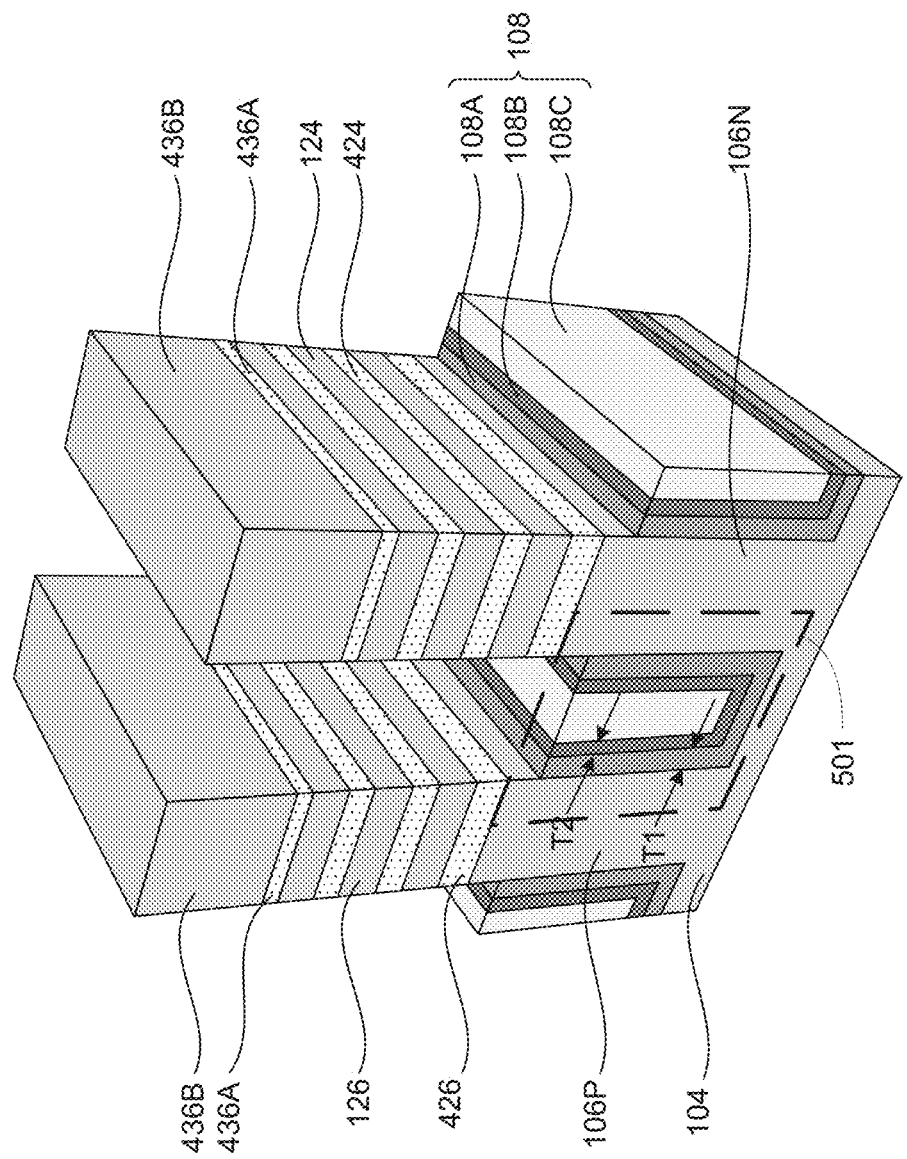

Referring to FIGS. 5A-5G, in some embodiments, the formation of doped STI structures 108 can include sequential operations of (i) depositing an undoped liner 508A on the structure of FIG. 4, as shown in FIG. 5A, (ii) depositing a dopant source liner 508B on undoped liner 508A, as shown in FIG. 5A, (iii) depositing an undoped fill layer 508C on dopant source liner 508B, as shown in FIG. 5A, (iv) performing an anneal process on the structure of FIG. 5A to form doped liner 108A, dopant source liner 108B, and doped fill layer 108C, as shown in FIG. 5B, and (v) performing an etch process on doped liner 108A, dopant source liner 108B, and doped fill layer 108C to form doped STI structures 108, as shown in FIG. 5E.

In some embodiments, depositing undoped liner 508A can include depositing an undoped oxide layer (e.g., undoped $SiO_2$ layer) with a thickness of about 2 nm to about 10 nm in an atomic layer deposition (ALD) or a non-flowable chemical vapor deposition (CVD) process at a temperature of about 25° C. to about 1000° C., at a pressure of about 1 torr to about 15 torr, and at an RF power of about 10 W to about 500 W. In some embodiments, depositing dopant source liner 508B can include depositing a nitride layer (e.g., SiON or SiN layer) with a thickness of about 1 nm to about 6 nm in an ALD or a non-flowable CVD process at a temperature of about 400° C. to about 700° C., at a pressure of about 1 torr to about 15 torr, and at an RF power of about 10 W to about 200 W. In some embodiments, depositing undoped fill layer 508C can include depositing an undoped flowable oxide layer (e.g., undoped flowable $SiO_2$ layer) in a flowable CVD process at a temperature of about 25° C. to about 200° C., and at a pressure of about 1 torr to about 15 torr.

In some embodiments, performing the anneal process can include performing a wet anneal process on the structure of FIG. 5A in an ambient of steam, oxygen, and nitrogen at a temperature of about 200° C. to about 600° C., at a pressure of about 1 torr to about 760 torr, and for a time duration of about 0.5 min to about 300 min. In some embodiments, performing the anneal process can include performing a dry anneal process on the structure of FIG. 5A in an ambient of nitrogen at a temperature of about 500° C. to about 700° C., at a pressure of about 1 torr to about 760 torr, and for a time duration of about 0.5 min to about 120 min. In some embodiments, performing the etch process can include performing a dry etch process in an etching gas mixture of hydrogen fluoride (HF), ammonia ($NH_3$), nitrogen trifluoride ($NF_3$) and hydrogen at a temperature of about 25° C. to about 200° C. and at an RF power of about 10 W to about 100 W.

In some embodiments, prior to the anneal process, undoped liner 508A, dopant source liner 508B, and undoped fill layer 508C can have a concentration profile of nitrogen atoms with a peak nitrogen concentration C1 of about 5 atomic % to about 20 atomic % along a line F-F of FIG. 5A, as shown in FIG. 5C. In some embodiments, after the anneal process, doped liner 108A, dopant source liner 108B, and doped fill layer 108C can have a concentration profile of nitrogen atoms with a peak nitrogen concentration C2 of about 5 atomic % or less than about 5 atomic % along line F-F of FIG. 5B, as shown in FIG. 5D. The discussion of FIG. 1F applies to FIG. 5D, unless mentioned otherwise.

As illustrated by the nitrogen concentration profiles in FIGS. 5C and 5D, nitrogen atoms from dopant source liner 508B diffuse into undoped liner 508A and undoped fill layer 508C during the anneal process and convert them into doped liner 108A, dopant source liner 108B, and doped fill layer 108C. The anneal process can be referred to as the doping process. During the anneal process, the concentration of nitrogen atoms increases from about 0 atomic % in undoped liner 508A and undoped fill layer 508C to about 5 atomic % or less than about 5 atomic % to form doped liner 108A and doped fill layer 108C. On the other hand, the concentration of nitrogen atoms decreases in dopant source liner 508B to form dopant source liner 108B with a concentration of nitrogen atoms less than about 5 atomic %. In some embodiments, the peak concentration of nitrogen atoms in doped fill layer 108C is greater than the peak concentrations of nitrogen atoms doped liner 108A and/or dopant source liner 108B, as shown in FIG. 5D.

The density of undoped liner 508A is greater than that of undoped fill layer 508C, which includes flowable oxide layer. As a result, the etching rate of undoped fill layer 508C is greater than undoped liner 508A. The doping of undoped fill layer 508C with nitrogen atoms can densify the flowable oxide layer of undoped fill layer 508C. The densification of the flowable oxide layer forms a non-flowable oxide layer in doped fill layer 108C with an etching rate that is lower than the etching rate of undoped fill layer 508C. The anneal process can modify the unequal etching rates of undoped liner 508A, dopant source liner 508B, and undoped fill layer 508C to substantially equal etching rates of doped liner 108A, dopant source liner 108B, and doped fill layer 108C. In some embodiments, the anneal process can reduce the etching rate difference among undoped liner 508A, dopant source liner 508B, and undoped fill layer 508C to less than about 1 nm/sec in doped liner 108A, dopant source liner 108B, and doped fill layer 108C. As a result of substantially equal etching rates and/or low etching rate difference among doped liner 108A, dopant source liner 108B, and doped fill layer 108C, doped STI structures 108 can be formed with substantially planar top surface profiles, as shown in FIG. 5F, which is an enlarged cross-sectional view of region 501 of FIG. 5E. In some embodiments, doped STI structures 108 can be formed with top surface profiles with a height difference H1 of less about 2 nm between the top surface edge and top surface center along axis of symmetry G, as shown in FIG. 5G, which is another enlarged cross-sectional view of region 501 of FIG. 5E. The top surface profiles of doped STI structures 108 in FIGS. 5F-5G can facilitate the subsequent formation of structures (e.g., cladding layers 838 shown in FIG. 8 and/or isolation structures 116 shown in FIG. 9) on doped STI structures 108 with improved linear sidewall profiles.

Without the doping process, STI structures could have top surface profiles with raised top surface edges 108s and a height difference greater than about 2 nm between top surface edges 108s and top surface center along axis of symmetry G, as shown in FIGS. 5F-5G. Such top surface edges 108s can form less linear sidewall profiles of cladding layers 838 and isolation structures 116, resulting in cladding layer residue 838r (shown in FIGS. 14B and 14D) in S/D openings 1410N-1410P. Such cladding layer residue 838r can lead to fabrication defects in the formation of S/D regions 110N-110P, inner spacers, 115, and/or gate structures 112, as discussed below.

The peak nitrogen concentration C1 of about 5 atomic % to about 20 atomic % can adequately form doped liner 108A and doped fill layer 108C without introducing fixed charges in doped liner 108A. If peak nitrogen concentration C1 less than about 5 atomic %, dopant source liner 508B may not provide adequate concentrations of nitrogen atoms to form doped liner 108A and doped fill layer 108C with substantially equal etching rates. On the other hand, if peak nitrogen concentration C1 greater than about 20 atomic %, the nitrogen atoms can introduce fixed charges in doped liner 108A, which can induce a current leakage path in substrate 104.

Figure 6A:
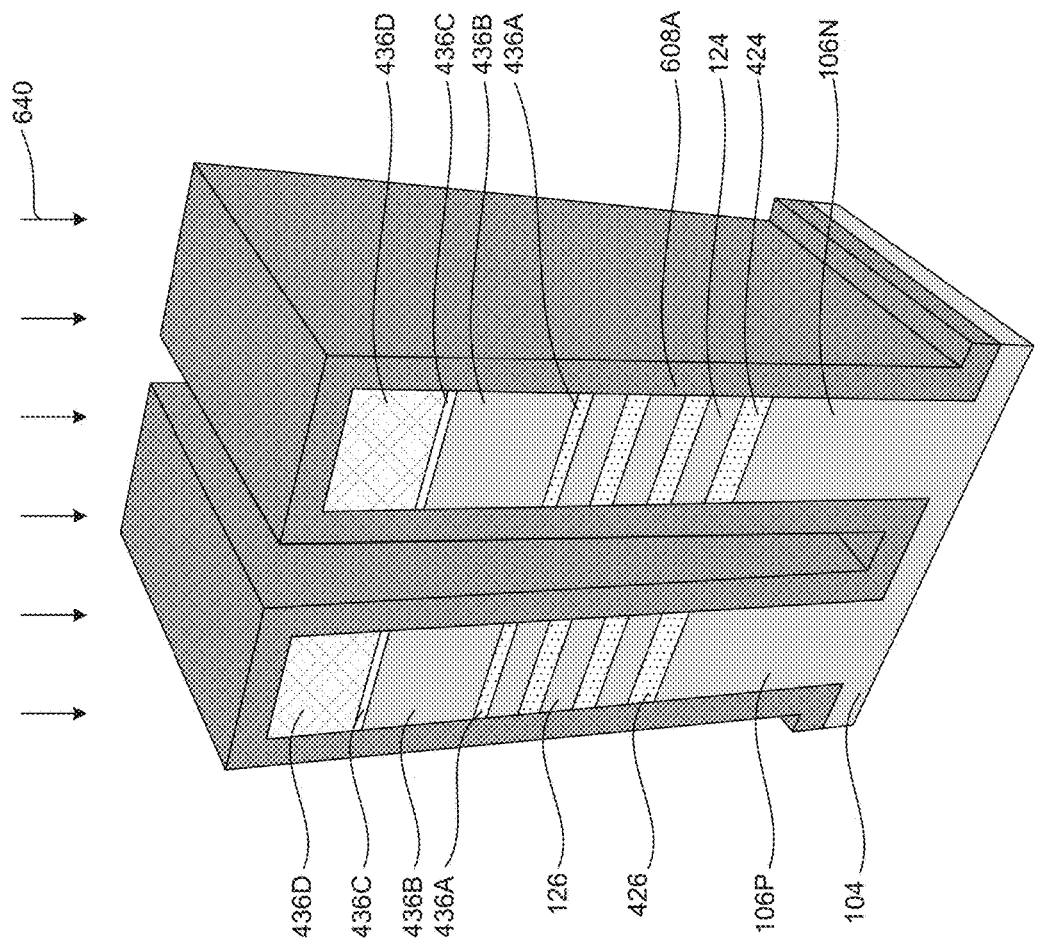
Figure 6A:
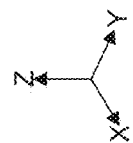
Figure 6B:
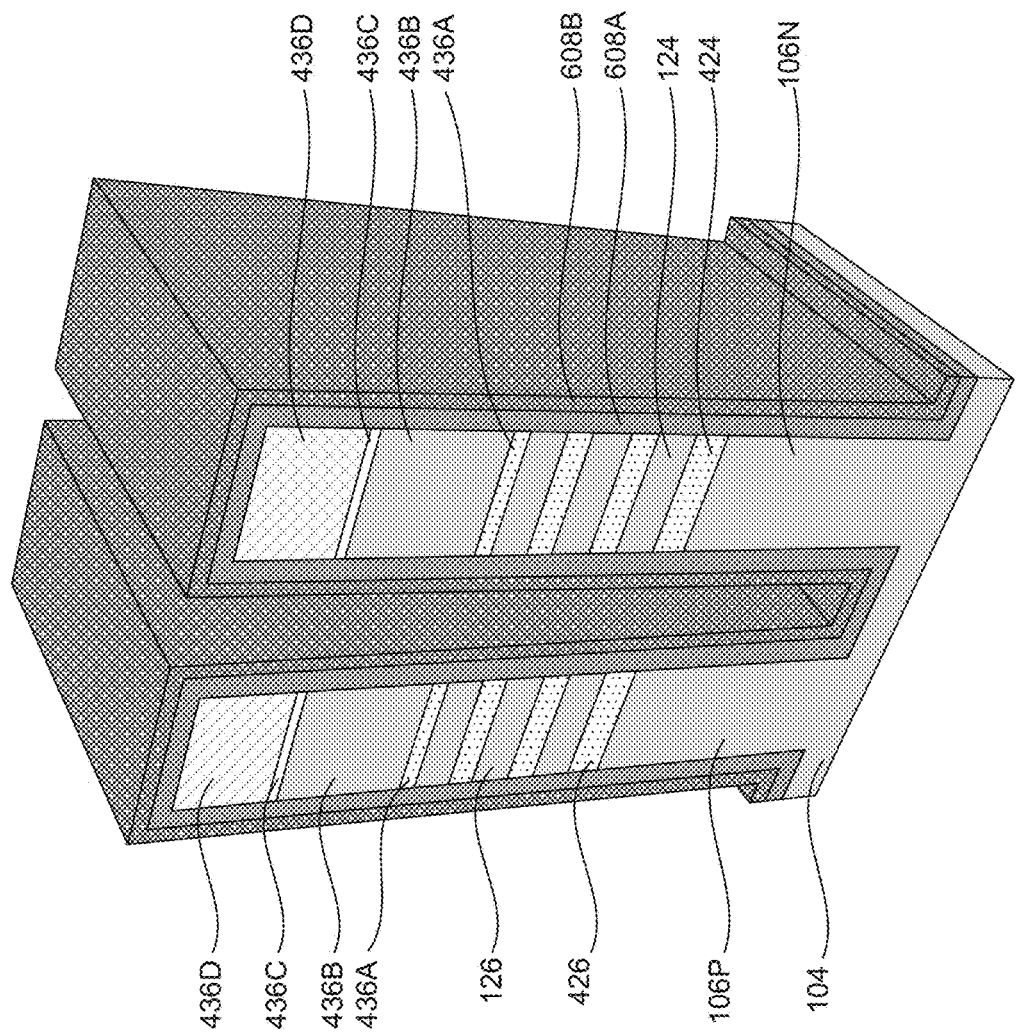
Figure 6B:
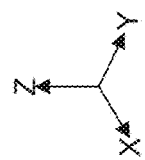
Figure 6C:
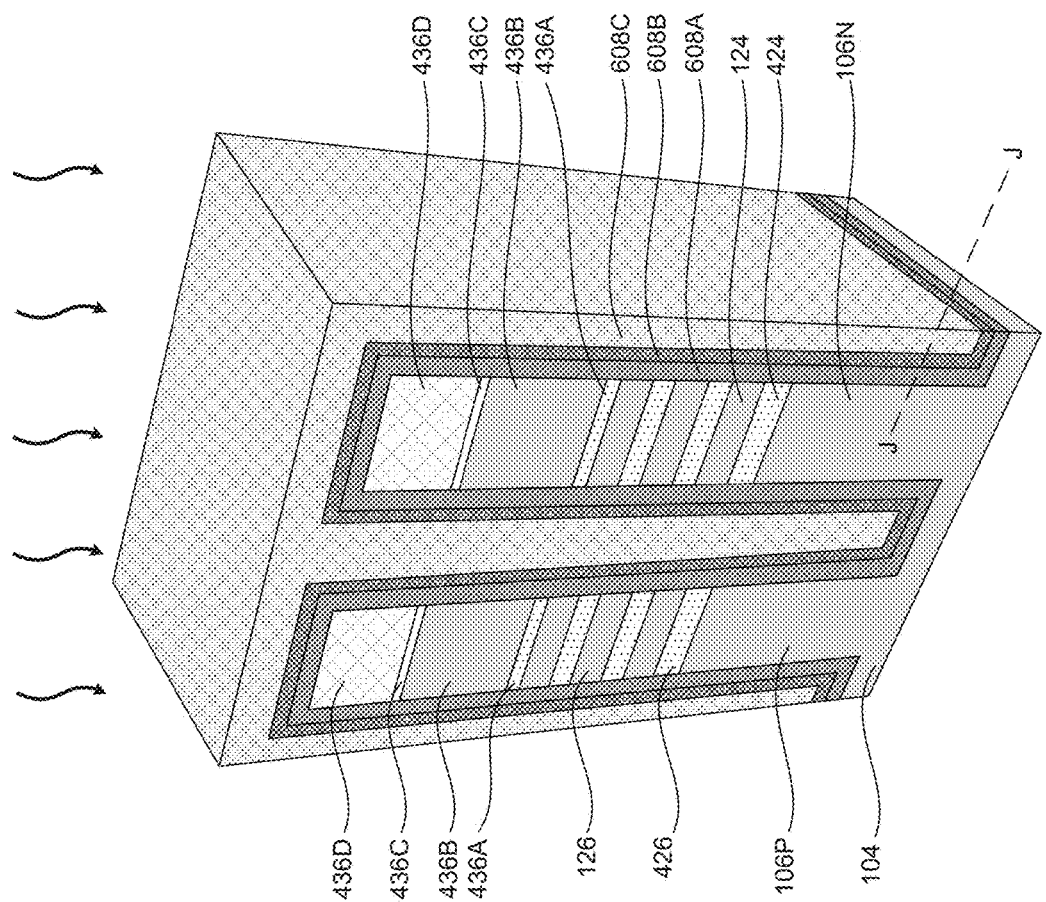
Figure 6D:
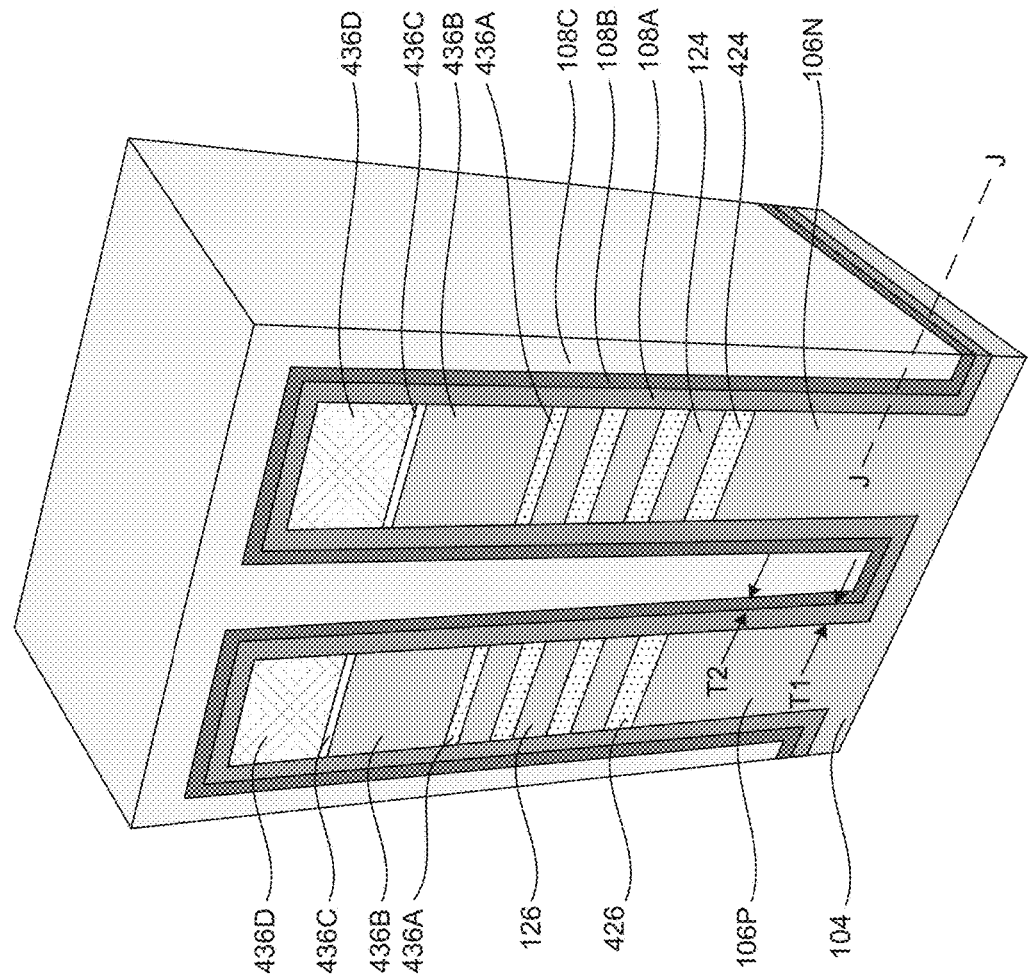
Figure 6D:
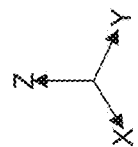

Referring to FIGS. 6A-6E, in some embodiments, the formation of doped STI structures 108 can include sequential operations of (i) depositing an undoped liner 608A on the structure of FIG. 4, as shown in FIG. 6A, (ii) performing a nitridation process on the structure of FIG. 6A with ammonia gas or nitrogen gas 640 to convert a top liner portion of undoped liner 608A into a dopant source liner 608B, as shown in FIG. 6B, (iii) depositing an undoped fill layer 608C on dopant source liner 608B, as shown in FIG. 6C, (iv) performing an anneal process on the structure of FIG. 6C to form doped liner 108A, dopant source liner 108B, and doped fill layer 108C, as shown in FIG. 6D, and (v) performing an etch process on doped liner 108A, dopant source liner 108B, and doped fill layer 108C to form doped STI structures 108, as shown in FIG. 5E. In some embodiments, masking layers 436C-436D can be etched during the etch process. The discussion of undoped liner 508A, dopant source liner 508B, and undoped fill layer 508C applies to undoped liner 608A, dopant source liner 608B, and undoped fill layer 608C.

The deposition processes of undoped liner 608A and undoped fill layer 608C can be similar to that of undoped liner 508A and undoped fill layer 508C. In some embodiments, performing the nitridation process can include performing a thermal nitridation process on the structure of FIG. 6A in an ambient of ammonia or nitrogen gas 640 at a temperature of about 700° C. to about 1000° C., at a pressure of about 1 torr to about 760 torr, and for a time duration of about 0.5 min to about 60 min. In some embodiments, performing the nitridation process can include performing a plasma nitridation process on the structure of FIG. 6A in an ambient of ammonia or nitrogen gas 640 at a temperature of about 250° C. to about 1000° C., at a pressure of about 1 torr to about 760 torr, at an RF power of about 10 W to about 15000 W, and for a time duration of about 0.5 min to about 60 min. The anneal process performed on the structure of FIG. 6C can be similar to the anneal process performed on the structure of FIG. 5A.

Figure 6E:
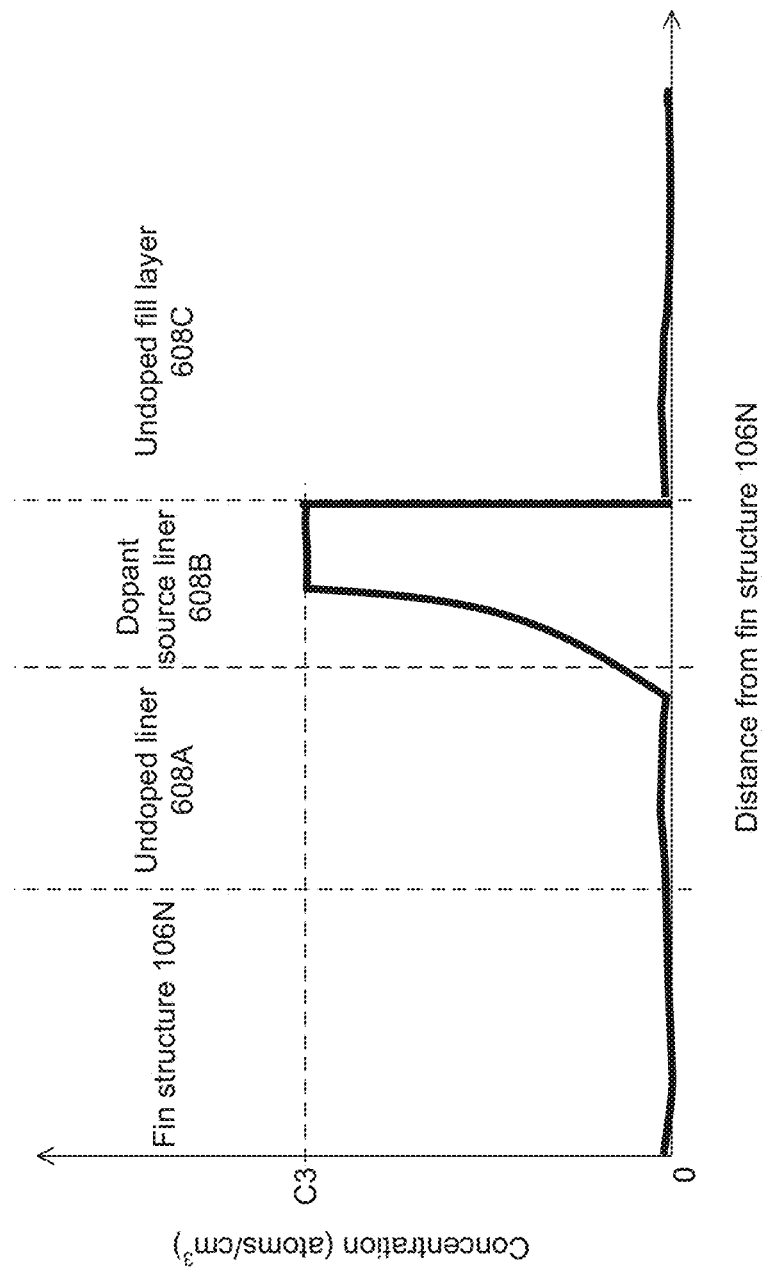
Figure 7A:
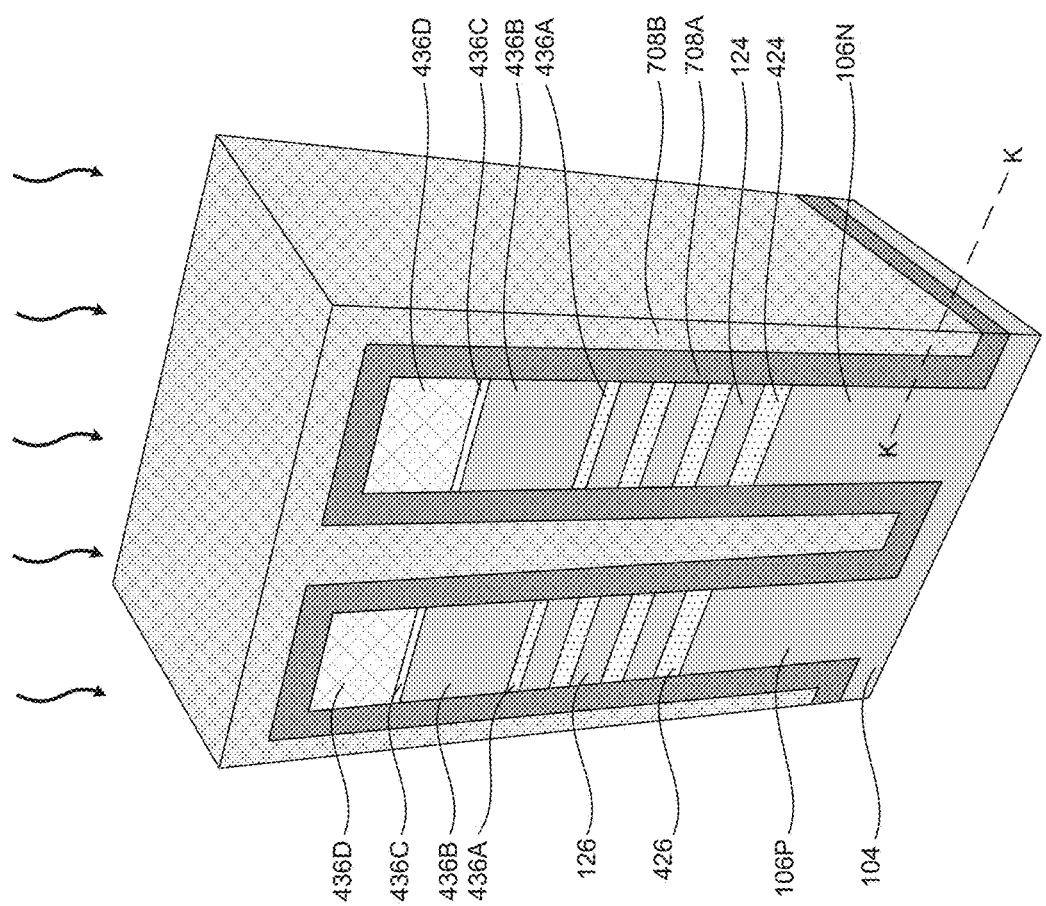
Figure 7A:
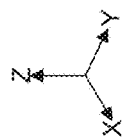
Figure 7B:
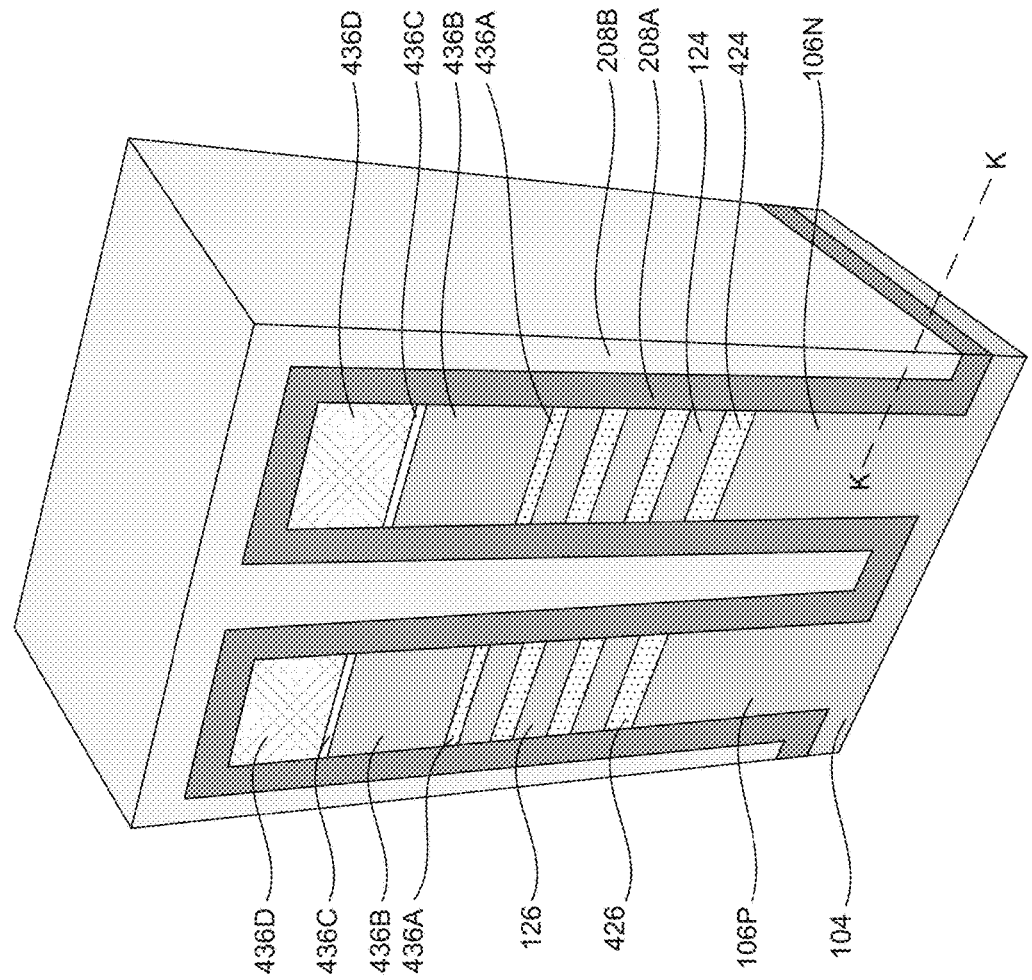
Figure 7B:
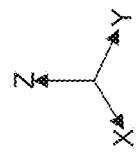

In some embodiments, prior to the anneal process, undoped liner 608A, dopant source liner 608B, and undoped fill layer 608C can have a concentration profile of nitrogen atoms with a peak nitrogen concentration C3 of about 5 atomic % to about 20 atomic % along a line J-J of FIG. 6C, as shown in FIG. 6E. In some embodiments, after the anneal process, doped liner 108A, dopant source liner 108B, and doped fill layer 108C can have a concentration profile of nitrogen atoms along line J-J of FIG. 6D similar to that shown in FIG. 5D.

In some embodiments, instead of doped STI structures 108, doped STI structures 208 can be formed on substrate 104 and adjacent to fin structures 106N and 106P, as described with reference to FIGS. 7A-7E. In some embodiments, the formation of doped STI structures 208 can include sequential operations of (i) depositing a nitrogen-based liner 708A on the structure of FIG. 4, as shown in FIG. 7A, (ii) depositing an undoped fill layer 708B on nitrogen-based liner 708A, as shown in FIG. 7A, (iii) performing an anneal process on the structure of FIG. 7A to form nitrogen-based liner 208A and doped fill layer 208B, as shown in FIG. 7B, and (iv) performing an etch process on nitrogen-based liner 208A and doped fill layer 208B to form doped STI structures 208, as shown in FIG. 7E.

In some embodiments, depositing nitrogen-based liner 708A can include depositing a nitride layer (e.g., SiON or SiN layer) in an ALD or a non-flowable CVD process with a Si precursor (e.g., dicholorosilane or hexachlorodisilane), an oxygen precursor, and a nitrogen precursor (e.g., $NH_3$ or $N_2$) at a temperature of about 400° C. to about 700° C. and at an RF power of about 10 W to about 100 W. In some embodiments, depositing undoped fill layer 708B can include depositing an undoped flowable oxide layer (e.g., undoped flowable $SiO_2$ layer) in a flowable CVD process at a temperature of about 25° C. to about 200° C., and at a pressure of about 1 torr to about 15 torr. The anneal process performed on the structure of FIG. 7A can be similar to the anneal process performed on the structure of FIG. 5A. The etch process performed on the structure of FIG. 7B can be similar to the etch process performed on the structure of FIG. 5B.

Figure 7C:
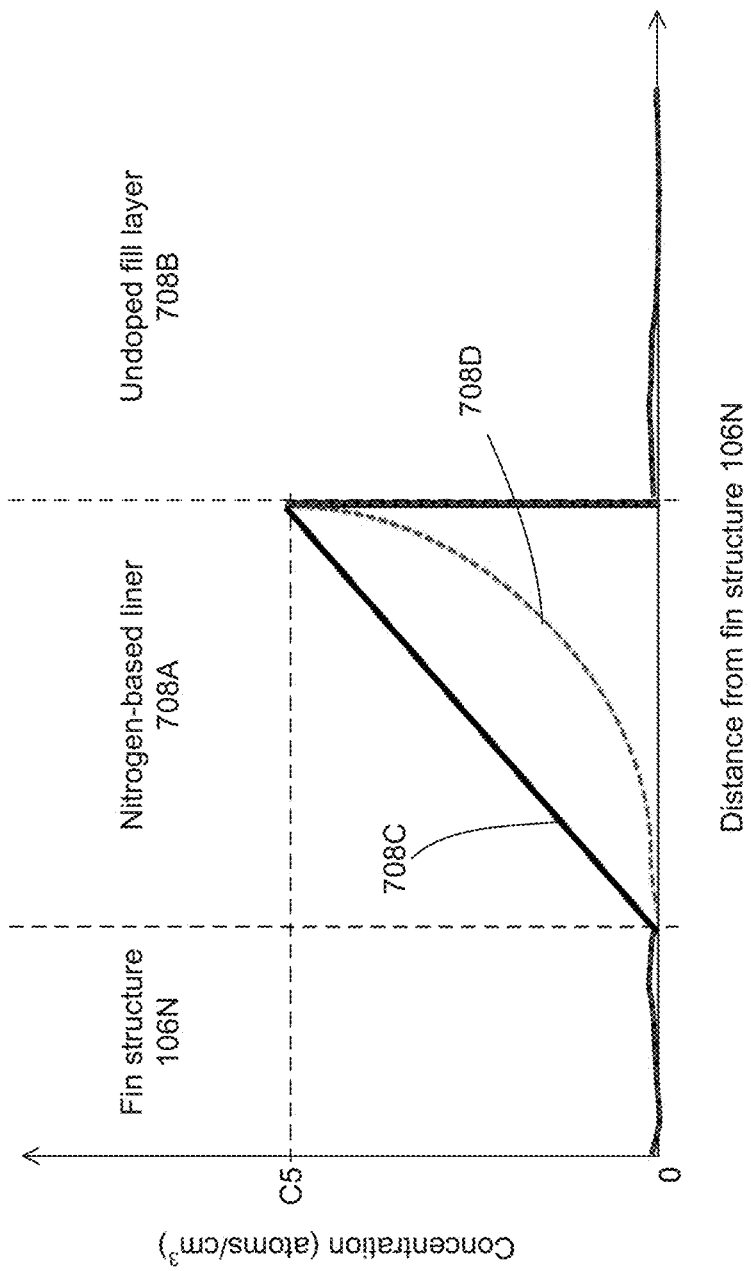
FIGS. 7C-7D illustrate characteristics of another different isolation structure at various stages of its fabrication process, in accordance with some embodiments.
Figure 7D:
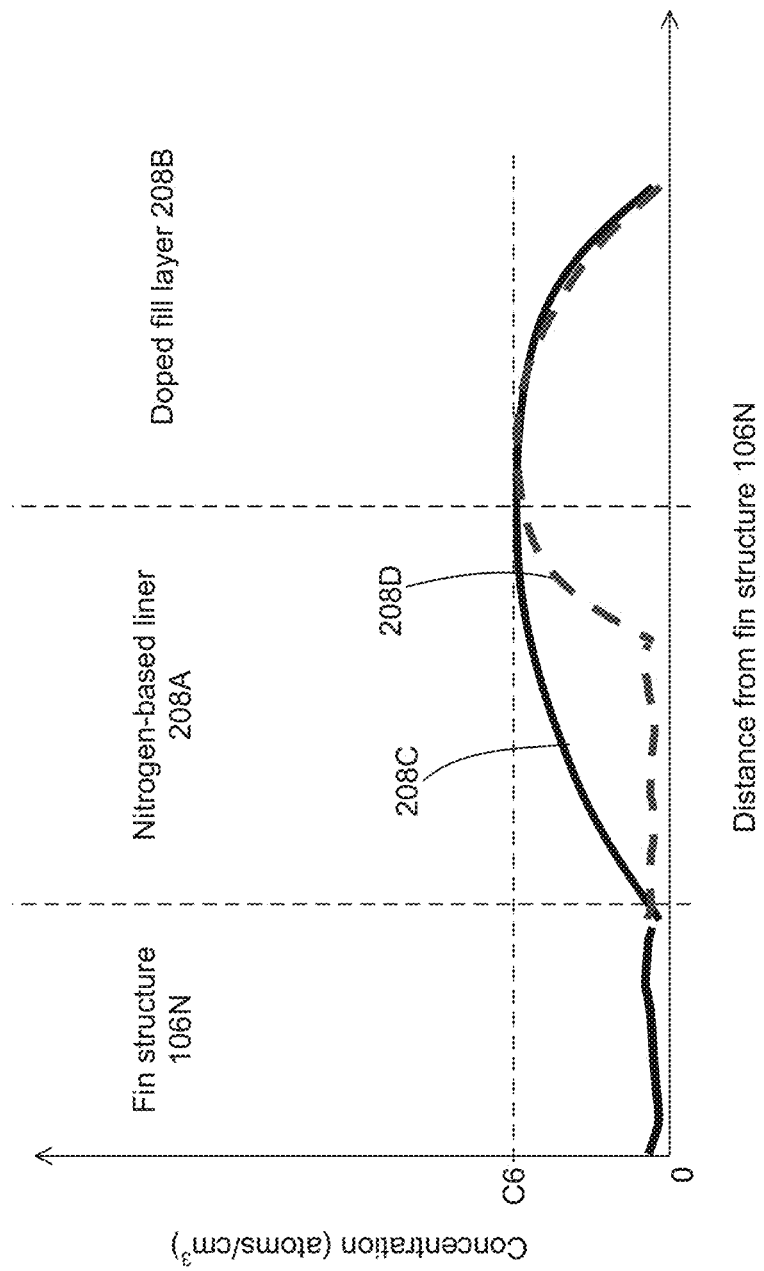

In some embodiments, prior to the anneal process, nitrogen-based liner 708A and undoped fill layer 708B can have concentration profiles 708C or 708D of nitrogen atoms with a peak nitrogen concentration C5 of about 5 atomic % to about 20 atomic % along a line K-K of FIG. 7A, as shown in FIG. 7C. In some embodiments, after the anneal process, nitrogen-based liner 208A and doped fill layer 208B can have concentration profiles 208C or 208D of nitrogen atoms with a peak nitrogen concentration C6 of about 5 atomic % or less than about 5 atomic % along line K-K of FIG. 7B, as shown in FIG. 7D. The discussion of FIG. 2B applies to FIG. 7D, unless mentioned otherwise.

As illustrated by the nitrogen concentration profiles in FIGS. 7C and 7D, nitrogen atoms from nitrogen-based liner 708A diffuse into undoped fill layer 708B during the anneal process and convert them into nitrogen-based liner 208A and doped fill layer 208B. The anneal process can be referred to as the doping process. During the anneal process, the concentration of nitrogen atoms increases from about 0 atomic % in undoped fill layer 708B to about 5 atomic % or less than about 5 atomic % to form doped fill layer 208B. On the other hand, the concentration of nitrogen atoms decreases in nitrogen-based liner 708A to form nitrogen-based liner 208A with a concentration of nitrogen atoms less than about 5 atomic %.

The density of nitrogen-based liner 708A is greater than that of undoped fill layer 708B, which includes flowable oxide layer. As a result, the etching rate of undoped fill layer 708B is greater than nitrogen-based liner 708A. The doping of undoped fill layer 708B with nitrogen atoms can densify the flowable oxide layer of undoped fill layer 708B. The densification of the flowable oxide layer forms a non-flowable oxide layer in doped fill layer 208B with an etching rate that is lower than the etching rate of undoped fill layer 708B. The anneal process can modify the unequal etching rates of nitrogen-based liner 708A and undoped fill layer 708B to substantially equal etching rates of nitrogen-based liner 208A and doped fill layer 208B. In some embodiments, the anneal process can reduce the etching rate difference between nitrogen-based liner 708A and undoped fill layer 708B to less than about 1 nm/sec in nitrogen-based liner 208A and doped fill layer 208B. As a result of substantially equal etching rates and/or low etching rate difference between nitrogen-based liner 208A and doped fill layer 208B, doped STI structures 208 can be formed with substantially planar top surface profiles.

Figure 8:
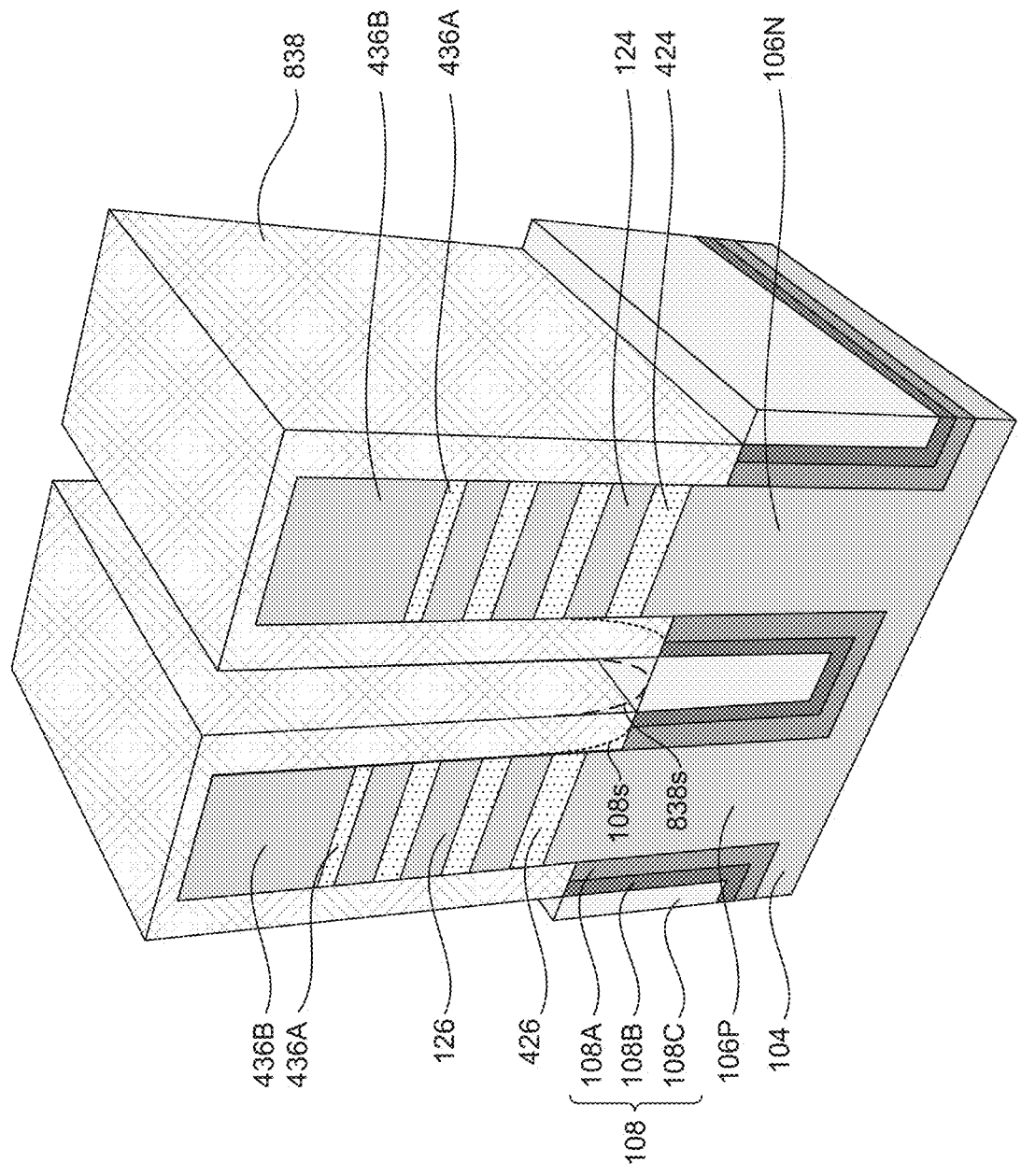

Referring to FIG. 3, in operation 315, cladding layers are formed surrounding the superlattice structures. For example, as shown in FIG. 8, cladding layers 838 are formed surrounding superlattice structures 423 and 425. The formation of cladding layers 838 can include (i) depositing a layer of material (e.g., SiGe) similar to that of nanostructured layers 424 in a CVD process with precursors, such as germane (GeH$_4$) and disilane (Si$_2$H$_6$) on the structure of FIG. 5E, and (ii) performing an etch process on the deposited layer of material to form the structure of FIG. 8.

The substantially planar top surface profiles of doped STI structures 108 form cladding layers 838 with substantially linear sidewall profiles, as shown in FIG. 8. On the other hand, if doped STI structures 108 are not used, STI structures would have raised top surface edges 108s, as discussed above, and cladding layers could have non-linear sidewalls profiles, such as sidewall profile 838s shown in FIG. 8. Such non-linear sidewalls profiles 838s can result in cladding layer residue 838r (shown in FIGS. 14B and 14D) in S/D openings 1410N-1410P and lead to fabrication defects in the formation of S/D regions 110N-110P, inner spacers, 115, and/or gate structures 112, as discussed below.

Figure 9:
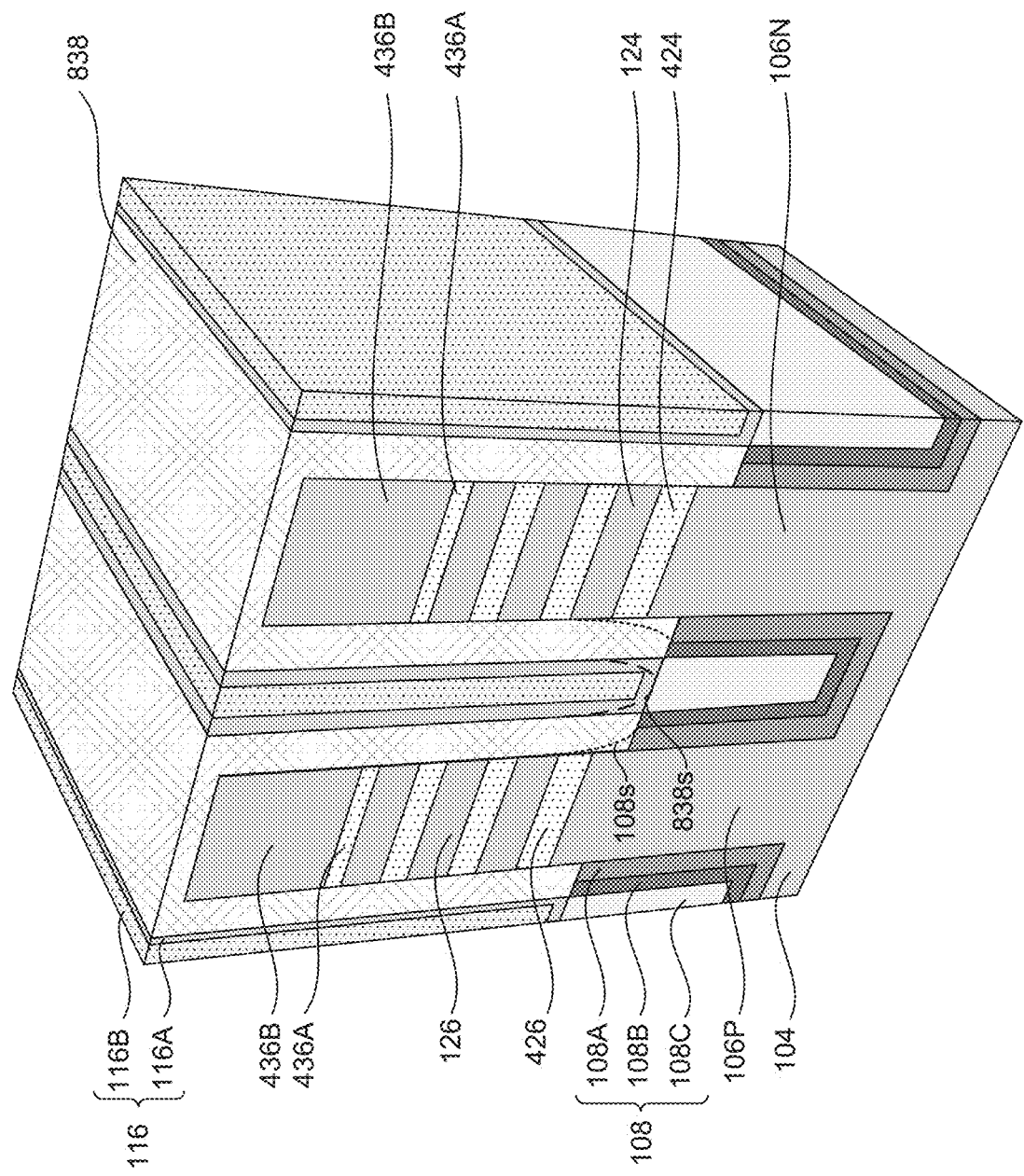
Figure 10:
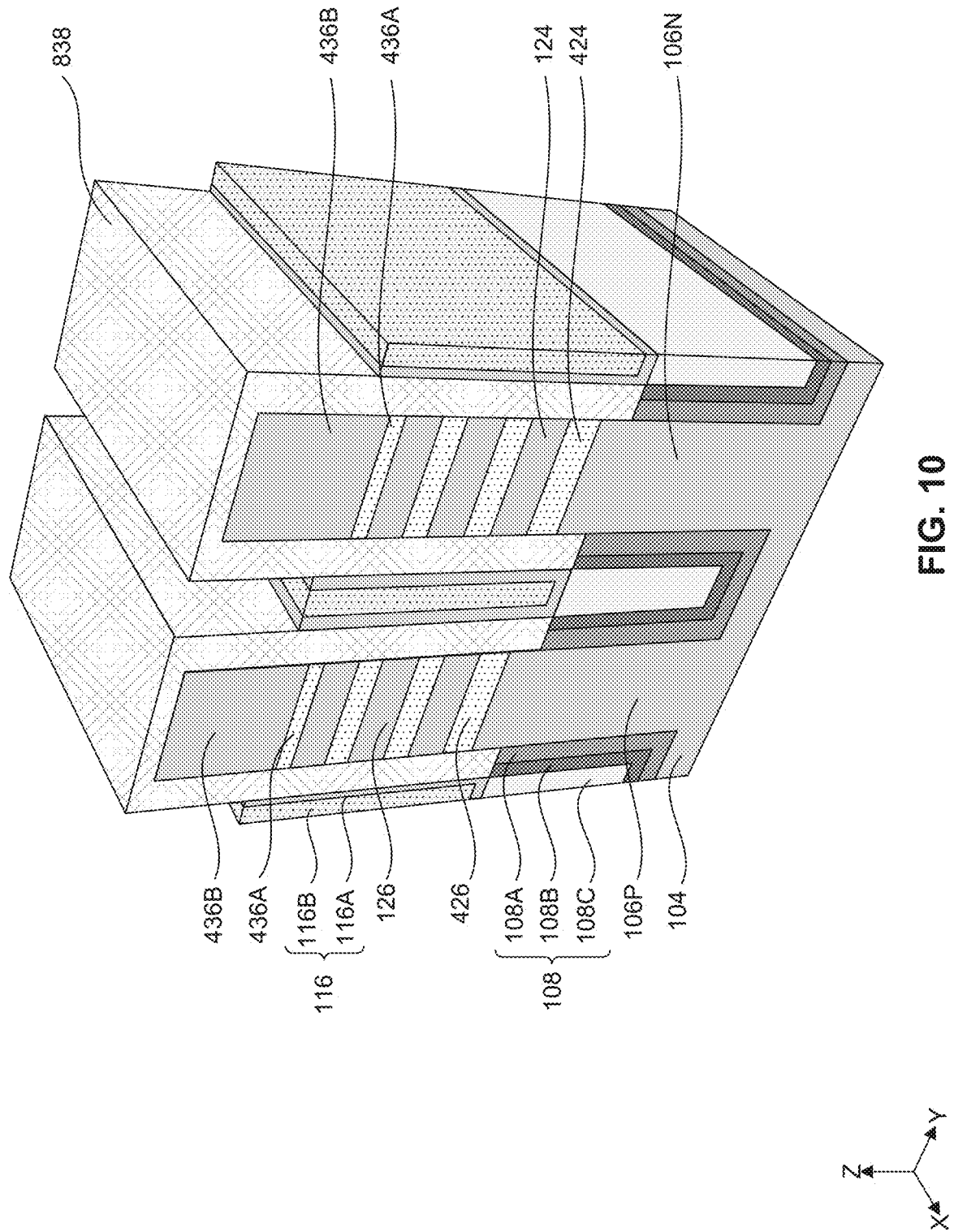

Referring to FIG. 3, in operation 320, isolation structures are formed on the doped STI structures. For example, as shown in FIG. 9, isolation structures 116 are formed on doped STI structures 108. The formation of isolation structure 116 can include sequential operations of (i) depositing insulating liner 116A on the structure of FIG. 8, (ii) depositing insulating fill layer 116B on insulating liner 116A, and (iii) performing a chemical mechanical polishing (CMP) process on insulating liner 116A, insulating fill layer 116B, and cladding layers 838 to substantially coplanarize tops surfaces of insulating liner 116A, insulating fill layer 116B, and cladding layers 838 with each other, as shown in FIG. 9.

Figure 11:
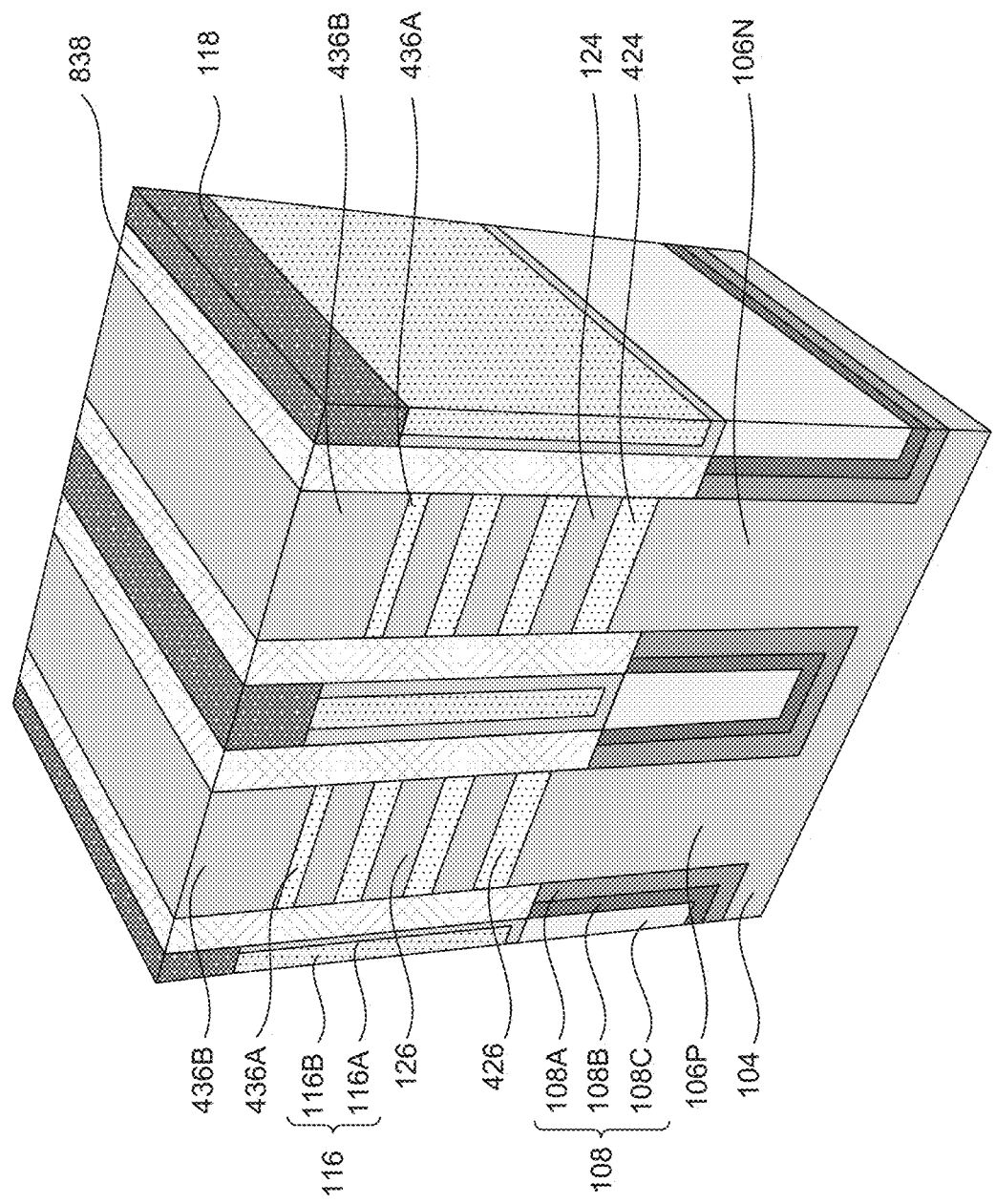

Referring to FIG. 3, in operation 325, barrier layers are formed on the isolation structures. For example, as described with reference to FIGS. 10-11, barrier layers 118 are formed on isolation structures 116. The formation of barrier layers 118 can include sequential operations of (i) performing an etch process on isolation structures 116 to form the structure of FIG. 10, (ii) depositing a rare earth metal oxide layer (not shown) on the structure of FIG. 10, (iii) performing a CMP process on the rare earth metal oxide layer to substantially coplanarize tops surfaces of barrier layers 118 and cladding layers 838 with each other, as shown in FIG. 11.

Figure 12:
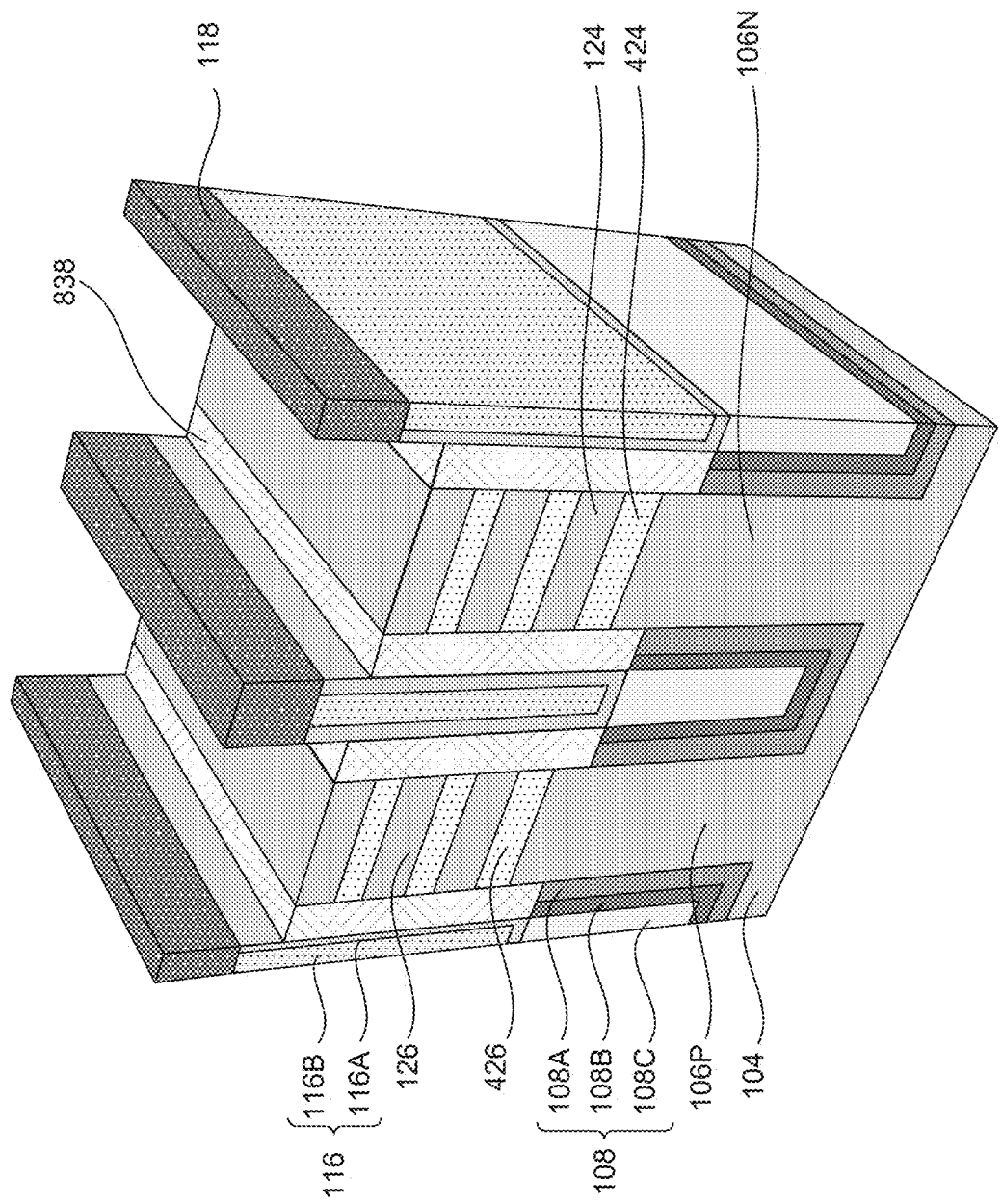
Figure 13:
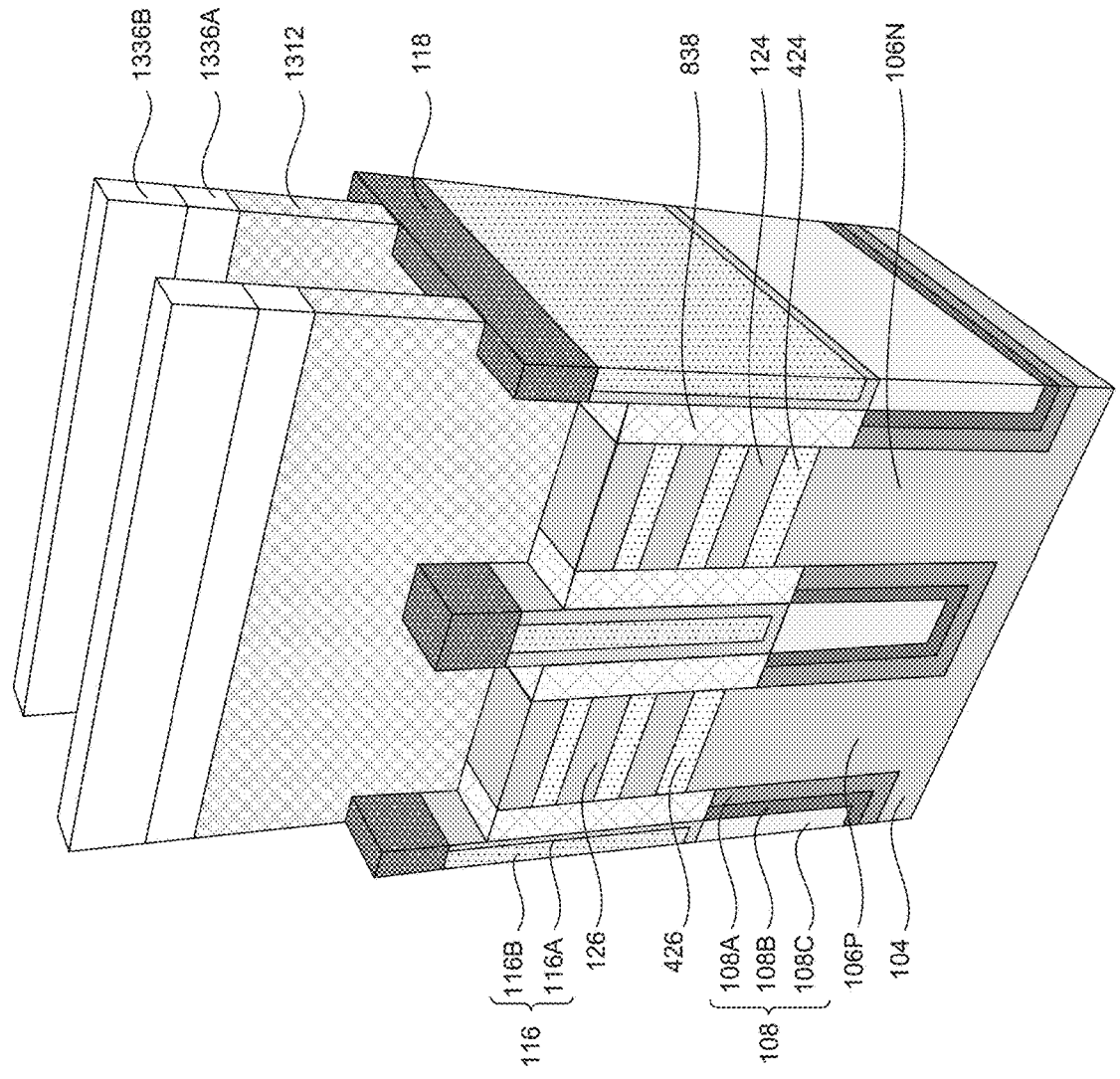
Figure 14A:
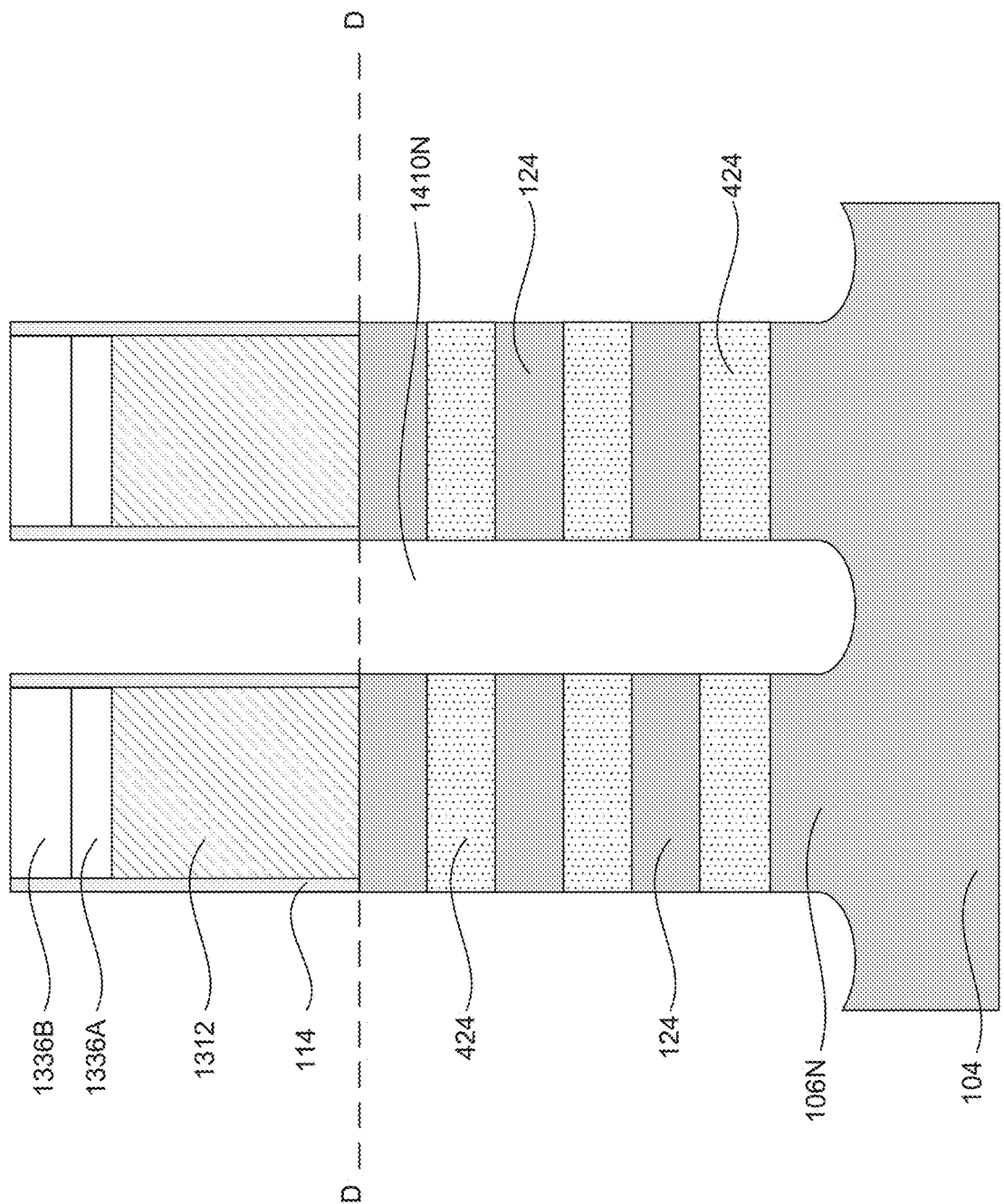

Referring to FIG. 3, in operation 330, polysilicon structures are formed on the barrier layers, the cladding layers, and the superlattice structures. For example, as described with reference to FIGS. 12-13, polysilicon structures 1312 are formed on barrier layers 118, cladding layers 838, and superlattice structures 423 and 425. The formation of polysilicon structures 1312 can include sequential operations of (i) performing an etch process on the structure of FIG. 11 to remove masking layers 436A-436B, as shown in FIG. 12, (ii) depositing a polysilicon layer (not shown) on the structure of FIG. 12, and (iii) performing a patterning process (e.g., lithography process) on the polysilicon layer to form polysilicon structures 1312, as shown in FIG. 13. In some embodiments, hard mask layers 1336A-1336B can be formed during the formation of polysilicon structures 1312. In some embodiments, gate spacers 114 can be formed after the formation of polysilicon structures 1312, as shown in FIG. 14A.

Figure 14B:
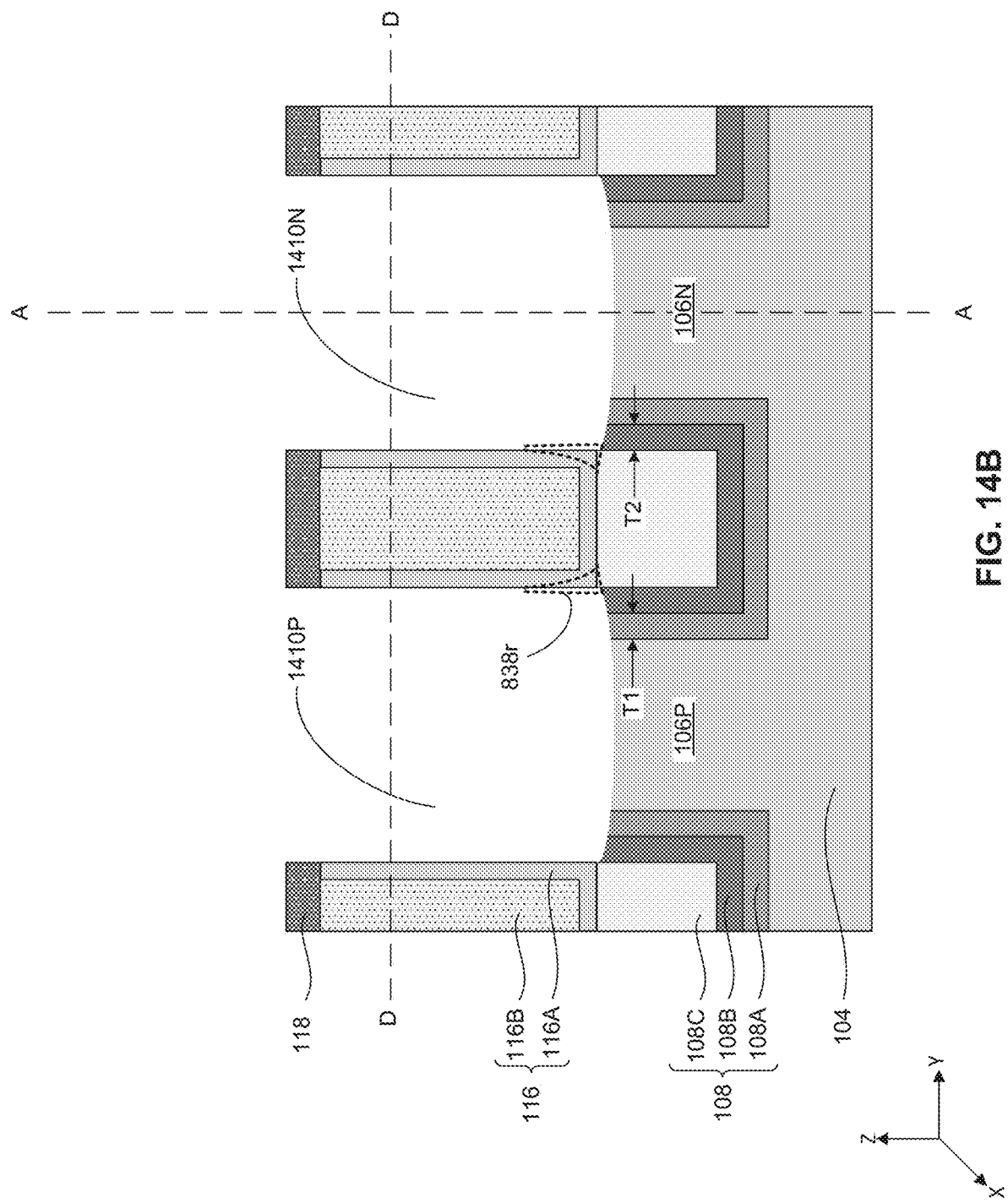
Figure 14C:
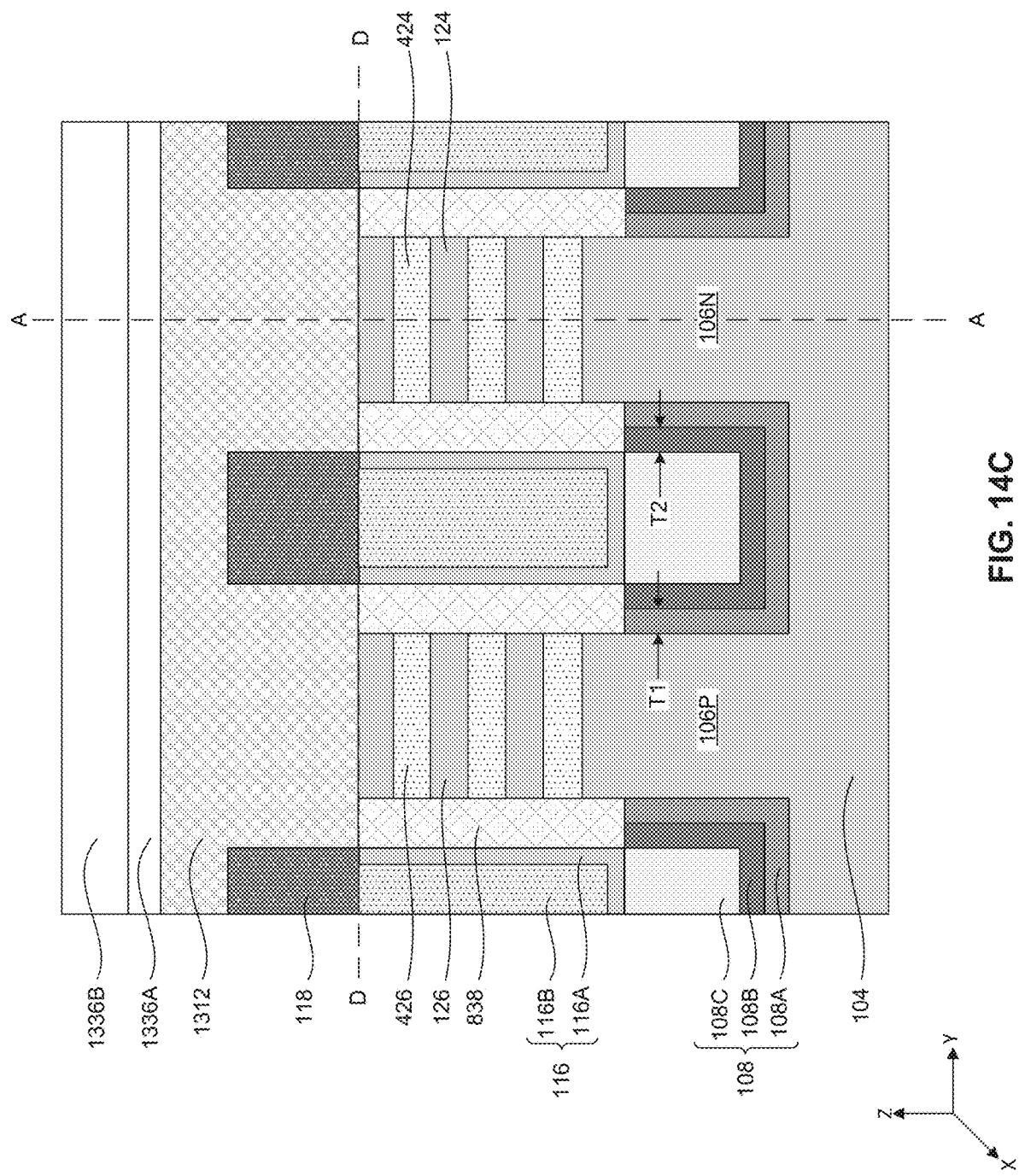
Figure 14D:
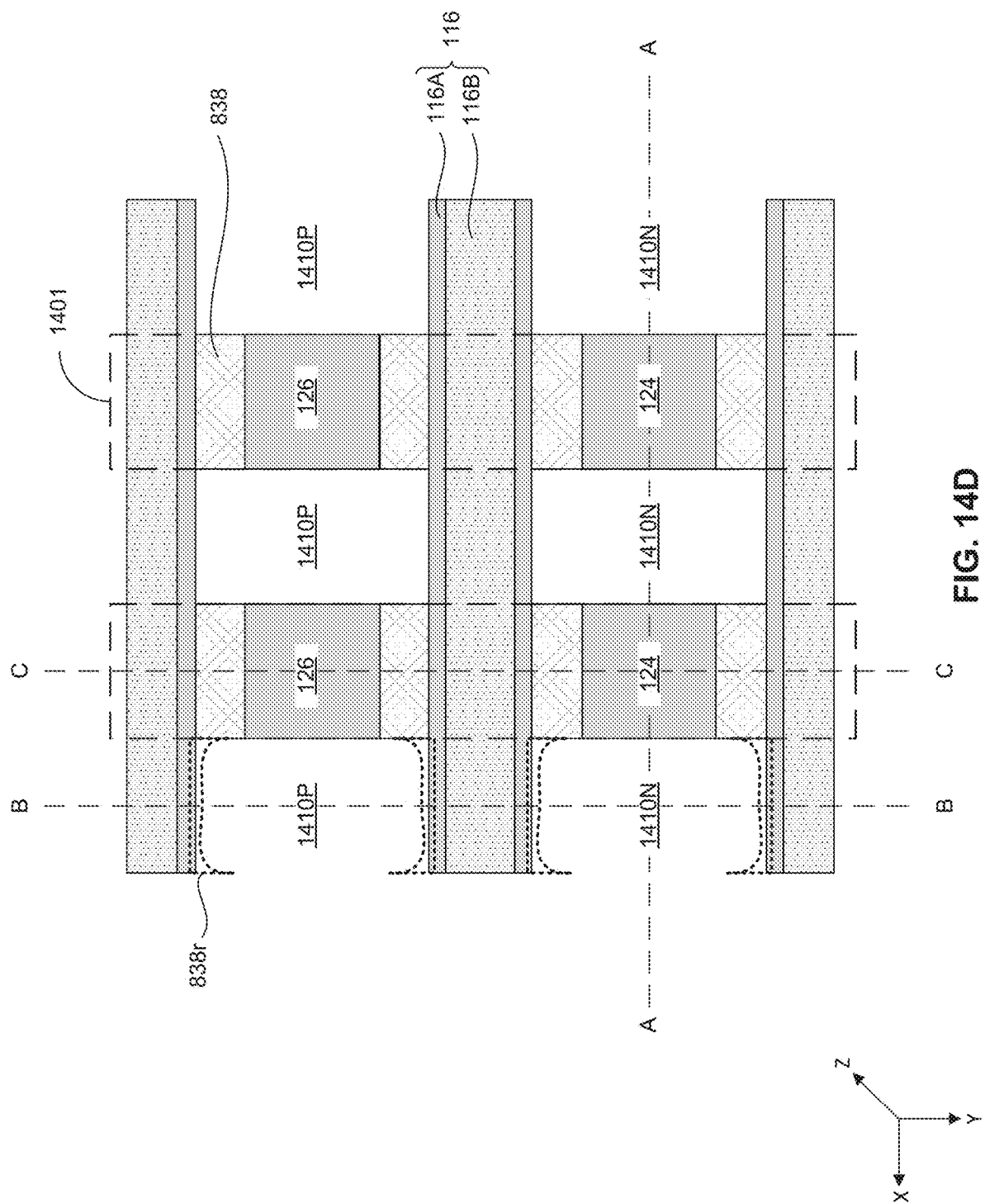
Figure 15A:
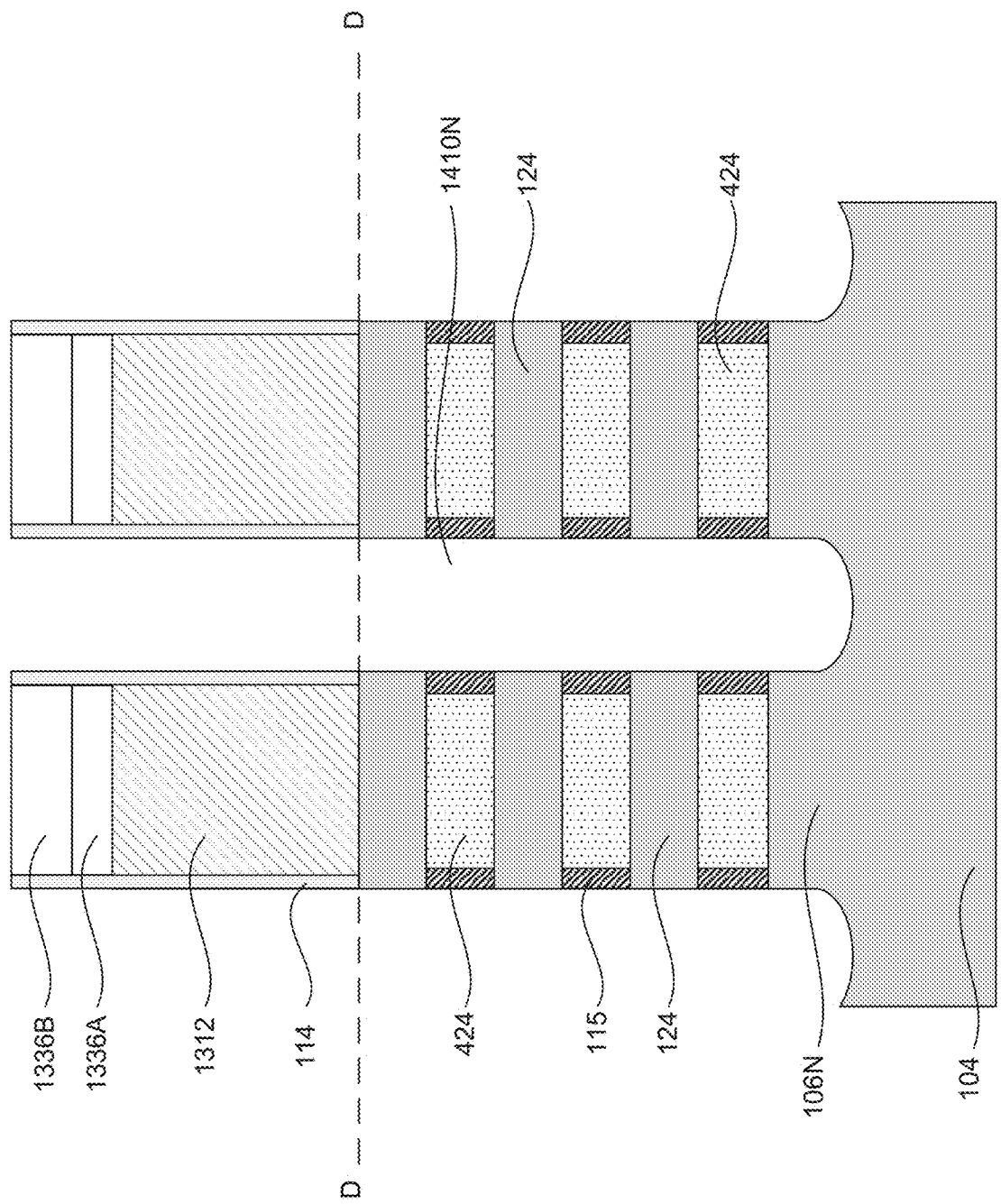
Figure 15B:
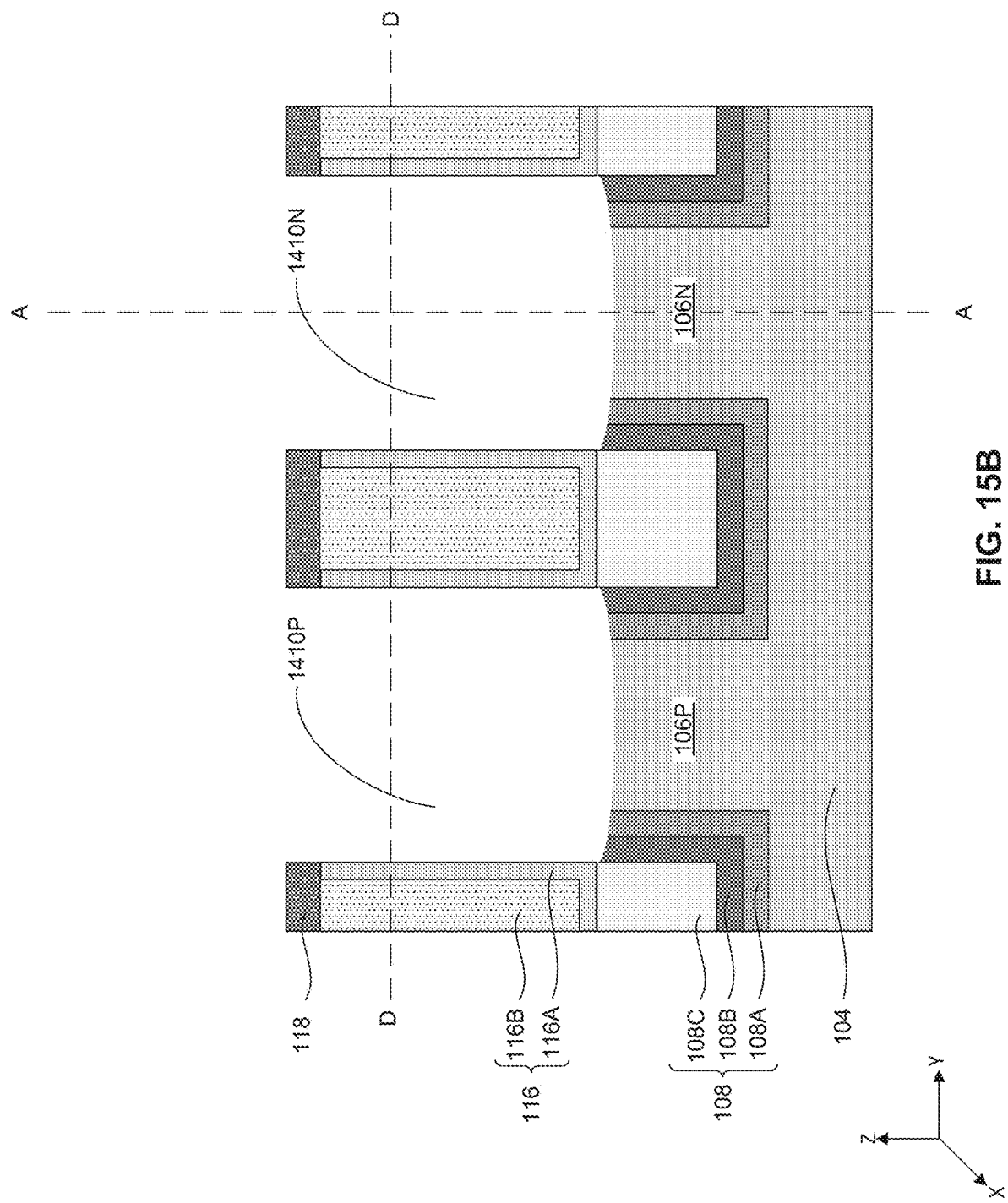
Figure 15C:
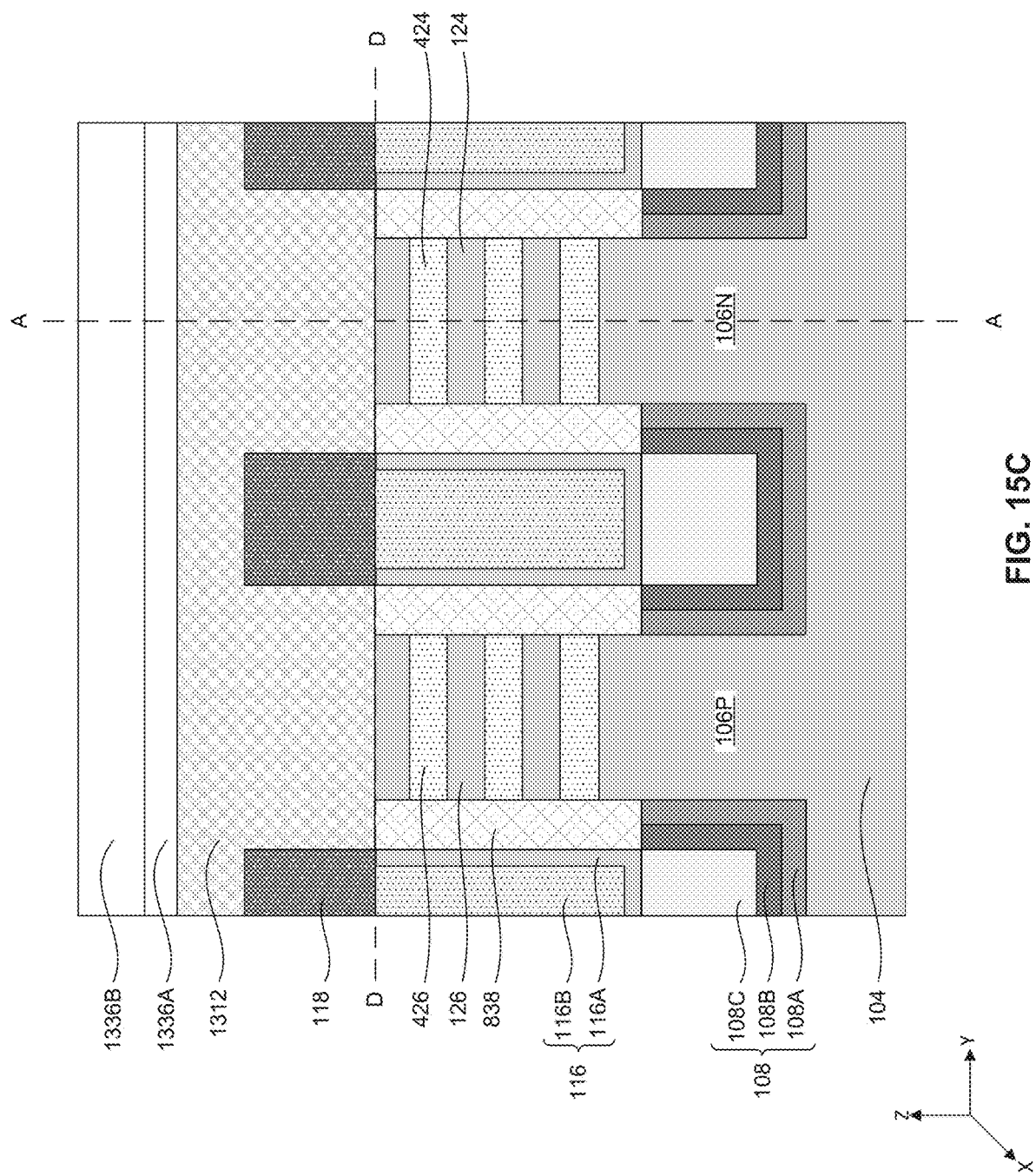
Figure 15D:
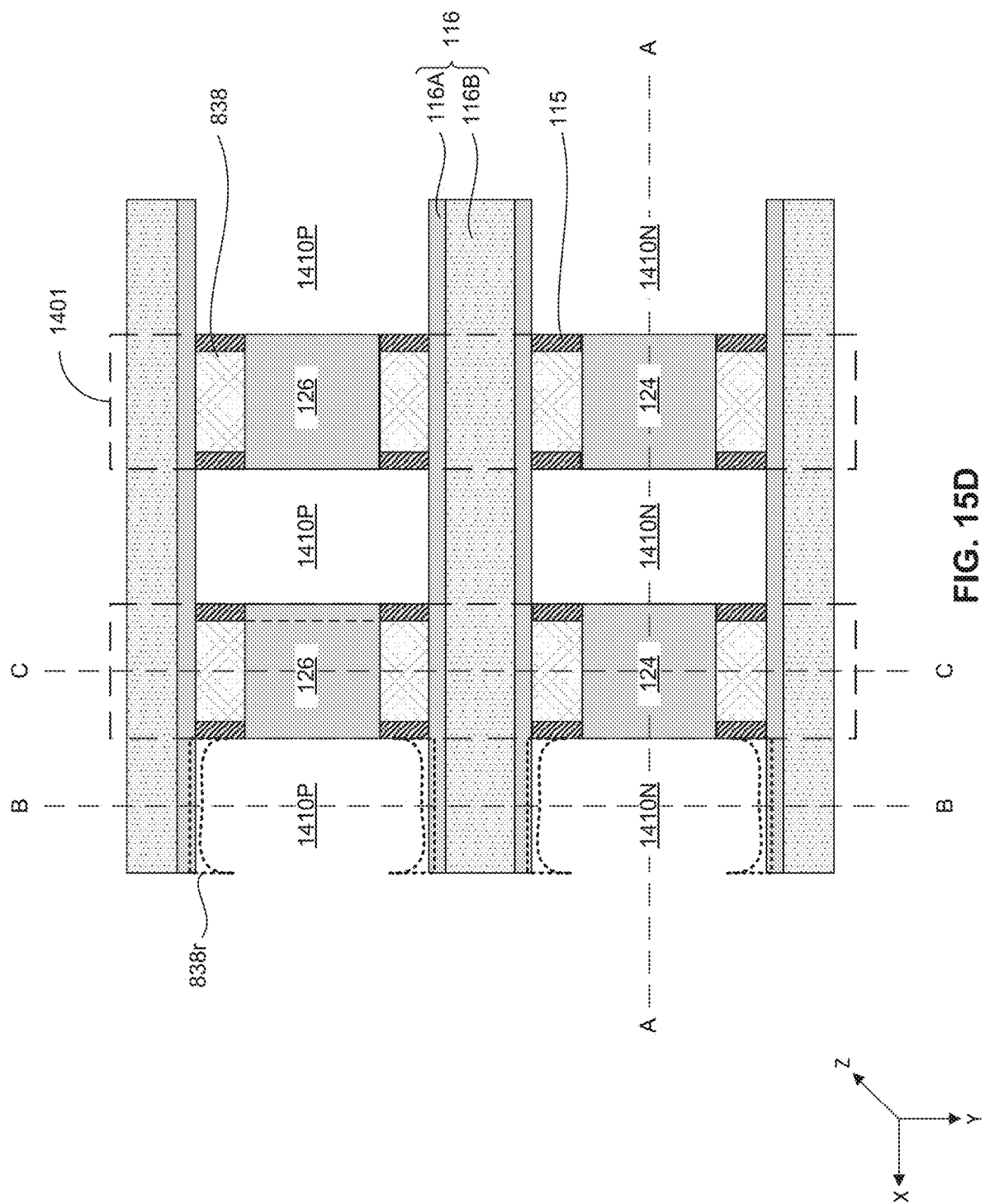
Figure 16A:
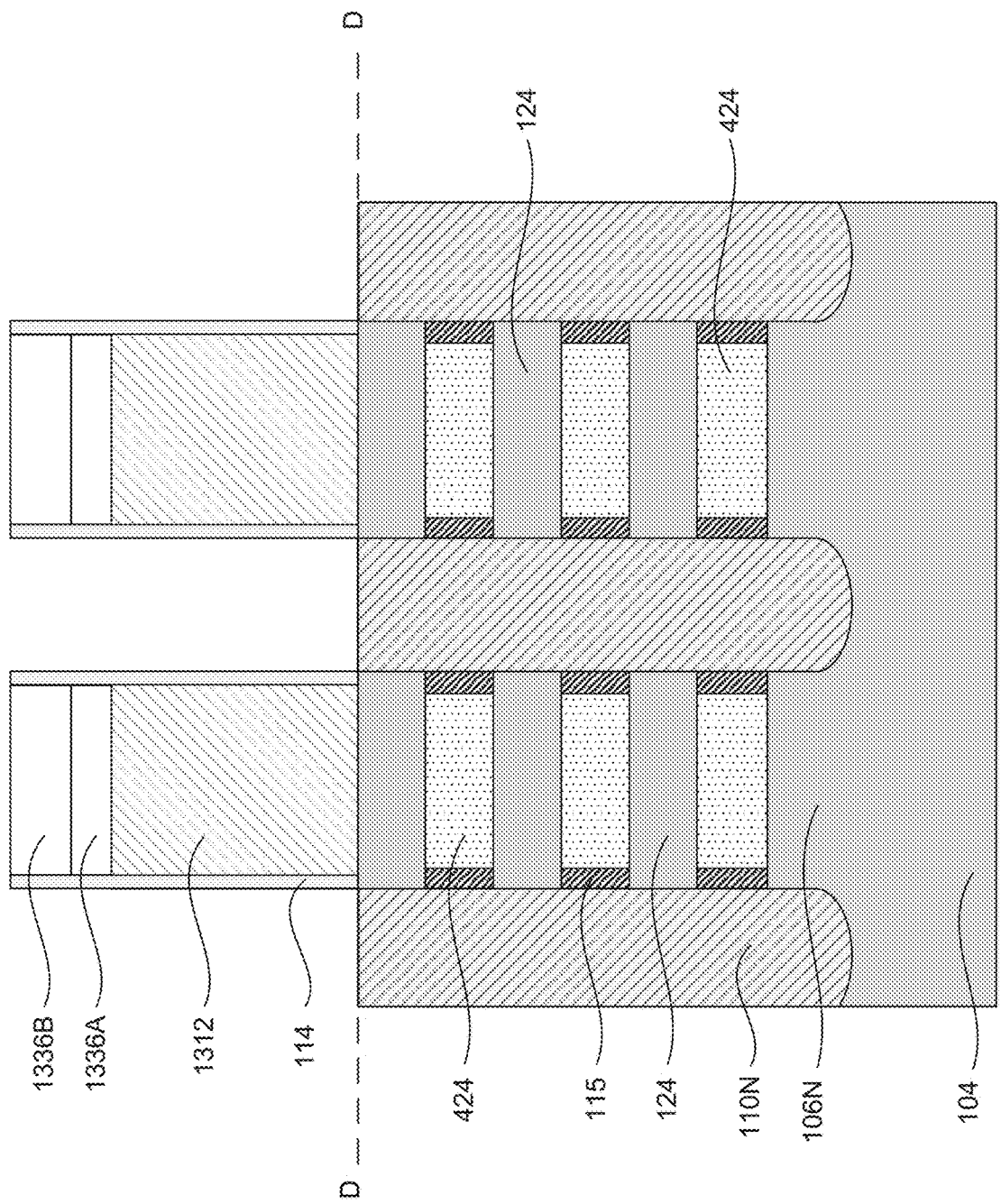
Figure 16B:
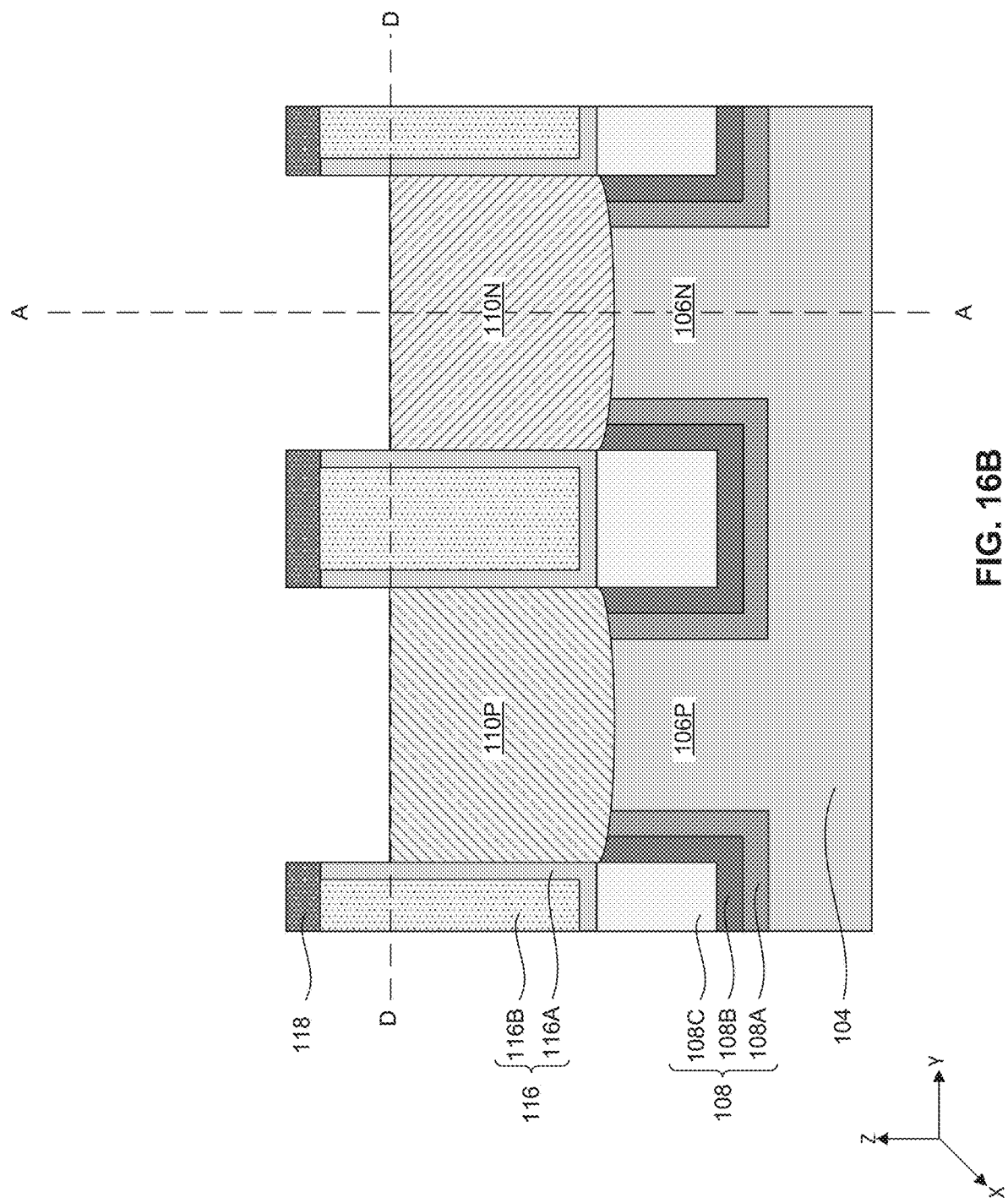
Figure 16C:
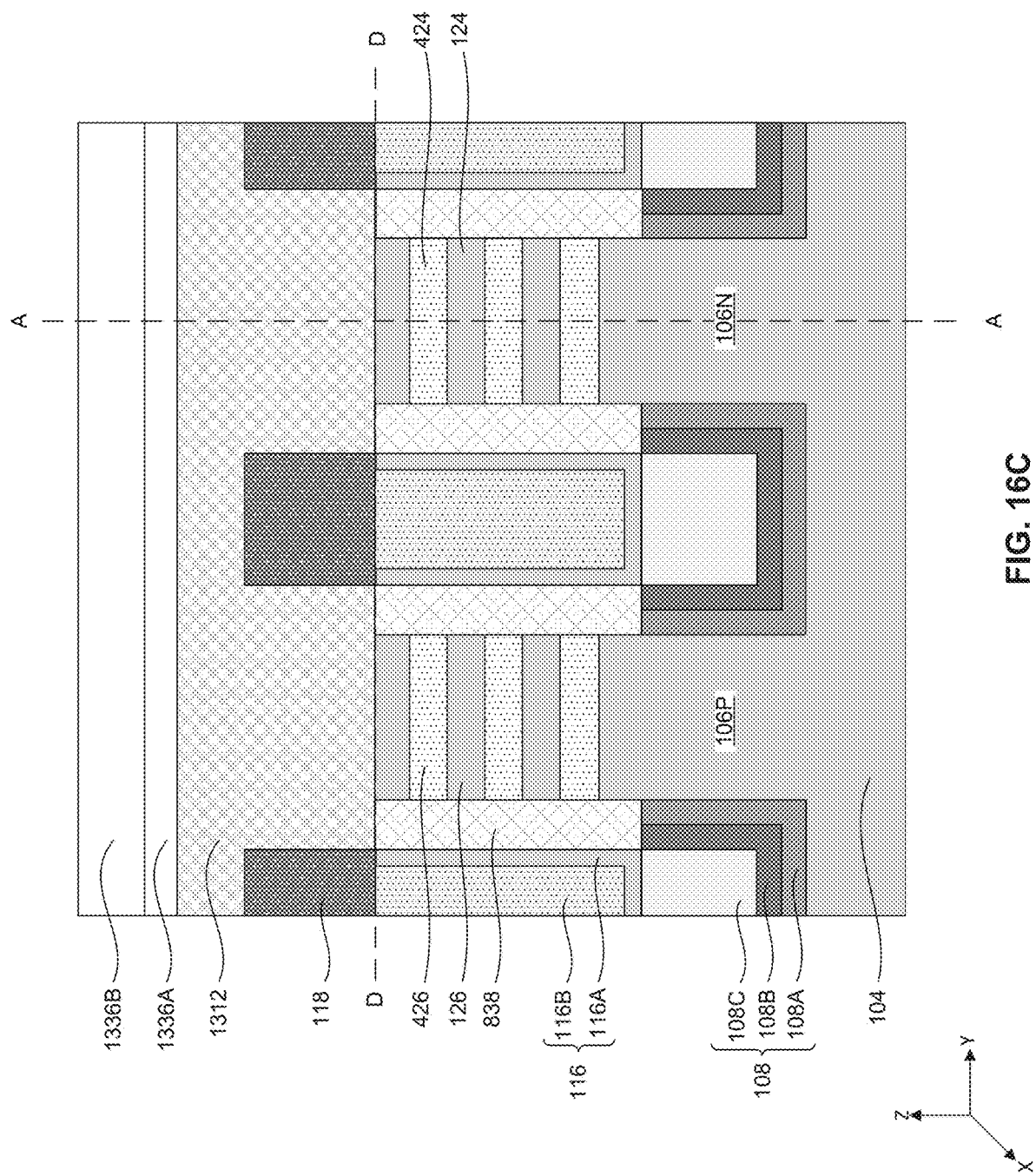
Figure 16D:
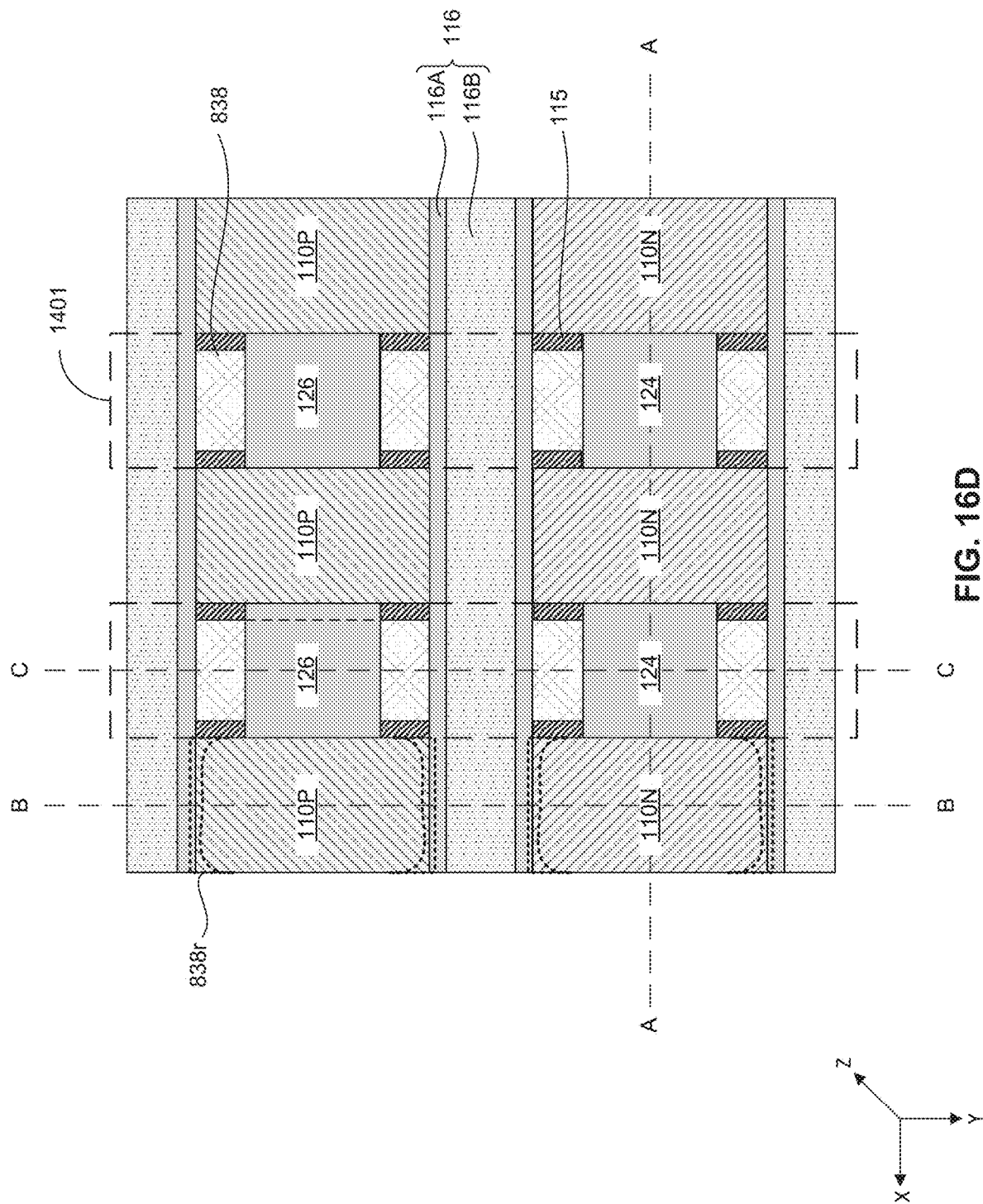
Figure 17A:
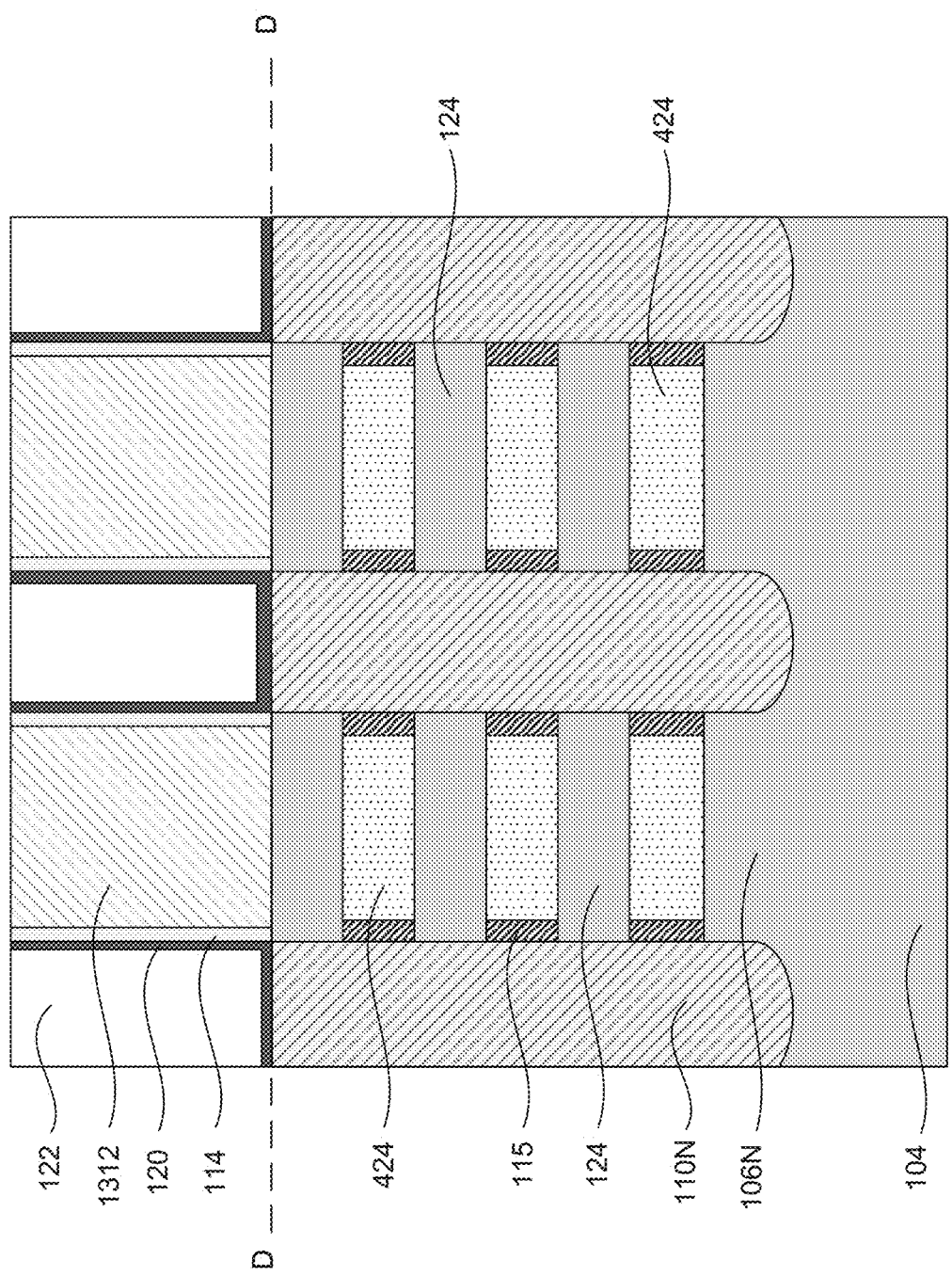
Figure 17B:
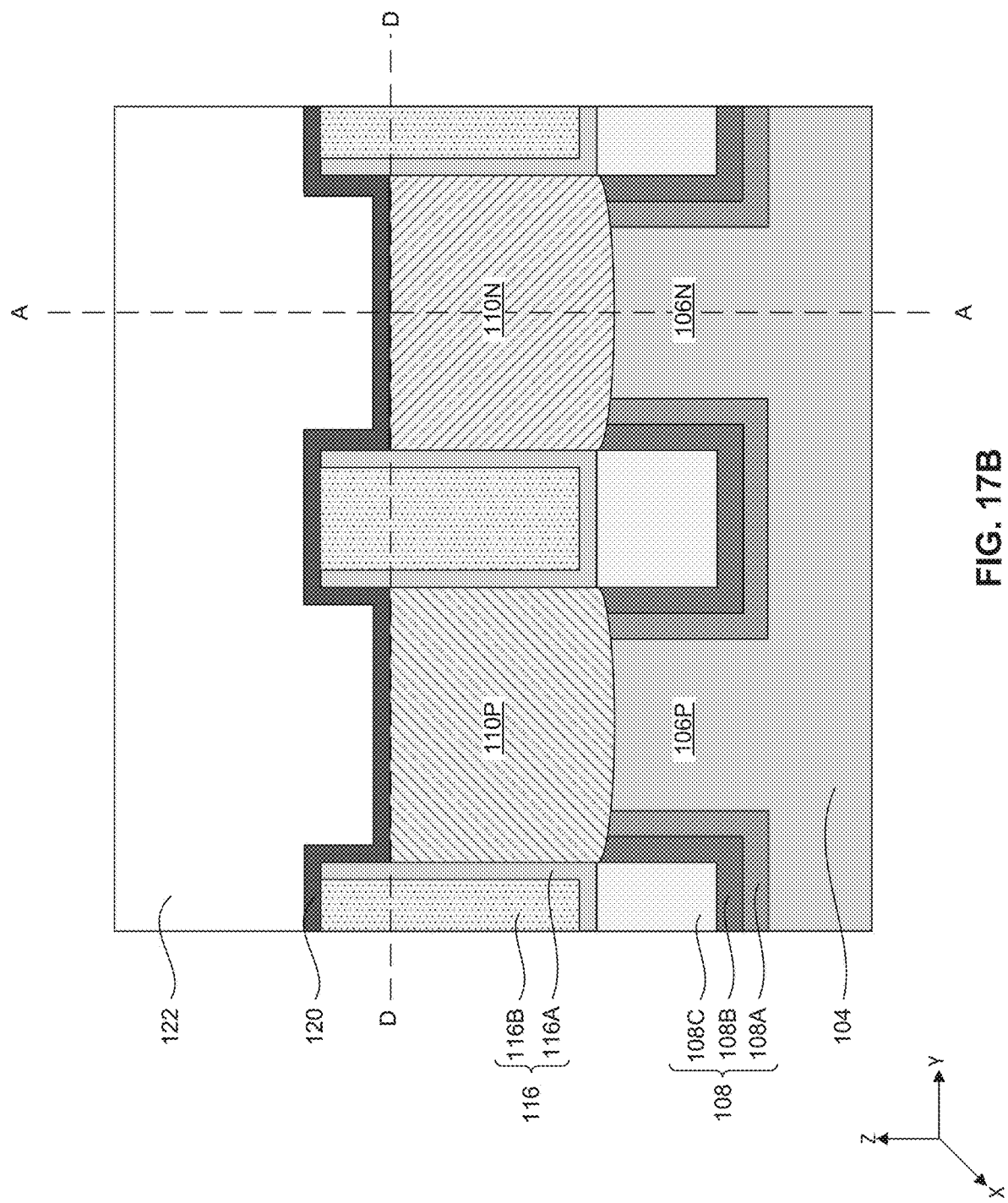
Figure 17C:
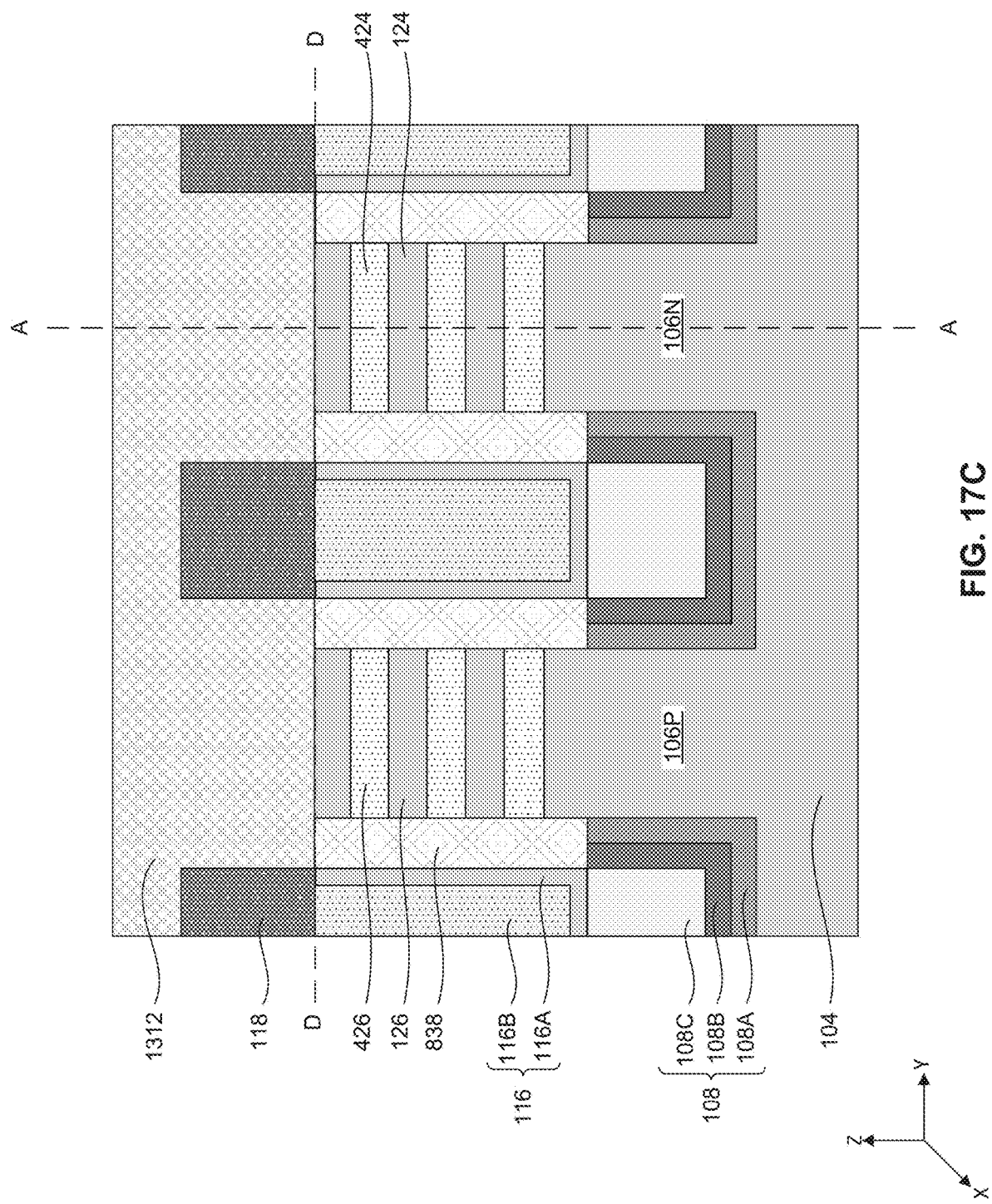
Figure 17D:
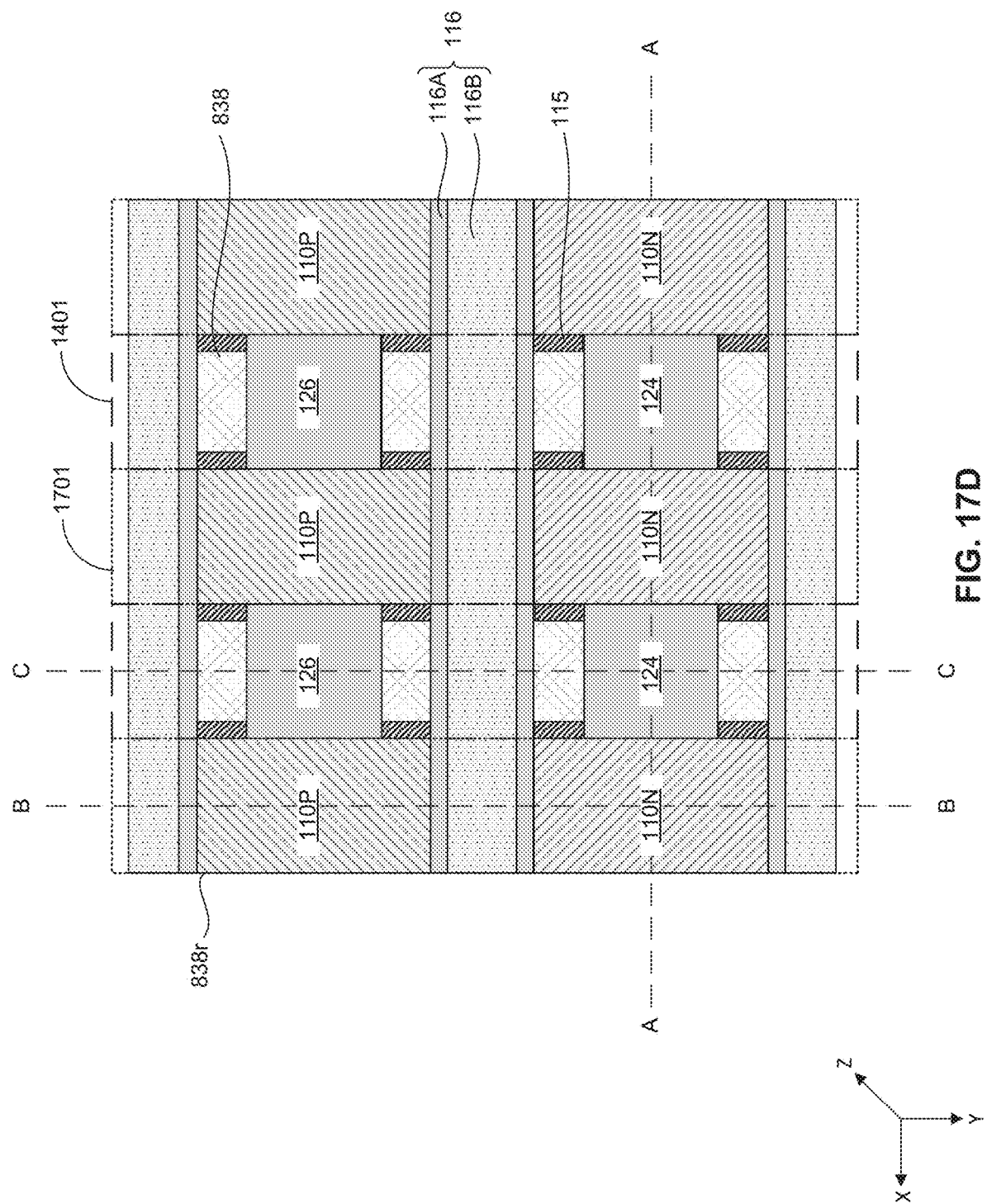

Referring to FIG. 3, in operation 335, S/D regions are formed on the fin structures. For example, as described with reference to FIGS. 14A-16D, S/D regions 110N and 110P are formed on fin structures 106N and 106P, respectively. The formation of S/D regions 110N and 110P can include sequential operations of (i) forming S/D openings 1410N and 1410P, as shown in FIGS. 14A-14B and 14D (not visible in cross-sectional view of FIG. 14C), and (ii) epitaxially growing semiconductor materials in S/D openings 1410N and 1410P, as shown in FIGS. 16A-16B and 16D. The formation of S/D openings 1410N and 1410P can include etching portions of superlattice structures 423 and 425 and cladding layers 838 that are not covered by gate spacers 114 and polysilicon structures 1312. Regions 1401 shown in FIG. 14D can be covered under gate spacers 114 and polysilicon structures 1312.

In some embodiments, as shown in FIGS. 15A-15D, inner spacers 115 can be formed between operations (i) and (ii) of the formation process of S/D regions 110N and 110P.

FIGS. 14B and 14D illustrate cladding layer residues 838r that can remain after the formation of S/D openings 1410N and 1410P due to non-linear sidewall profiles 838s of cladding layers formed on undoped STI structures with raised top surface edges 108s (discussed above), if doped STI structures 108 are not used. The presence of cladding layer residues 838r can create fabrication defects, such as gaps between insulating liners 116A and inner spacers 115, between insulating liners 116A and S/D regions 110N, and/or between insulating liners 116A and S/D regions 110P. Such gaps can lead to further fabrication defects in the formation of gate structures 112 in operation 345. For example, gate metal fill layer 134 can be deposited in these gaps and create an electric short between S/D regions 110N-110P and gate structures 112.

In some embodiments, after the formation of S/D regions 110N and 110P, ESLs 120 and ILD layers 122 can be formed, as shown in FIGS. 17A-17D. Regions 1701 shown in FIG. 17D can be covered under ESLs 120 and ILD layers 122.

Figure 18A:
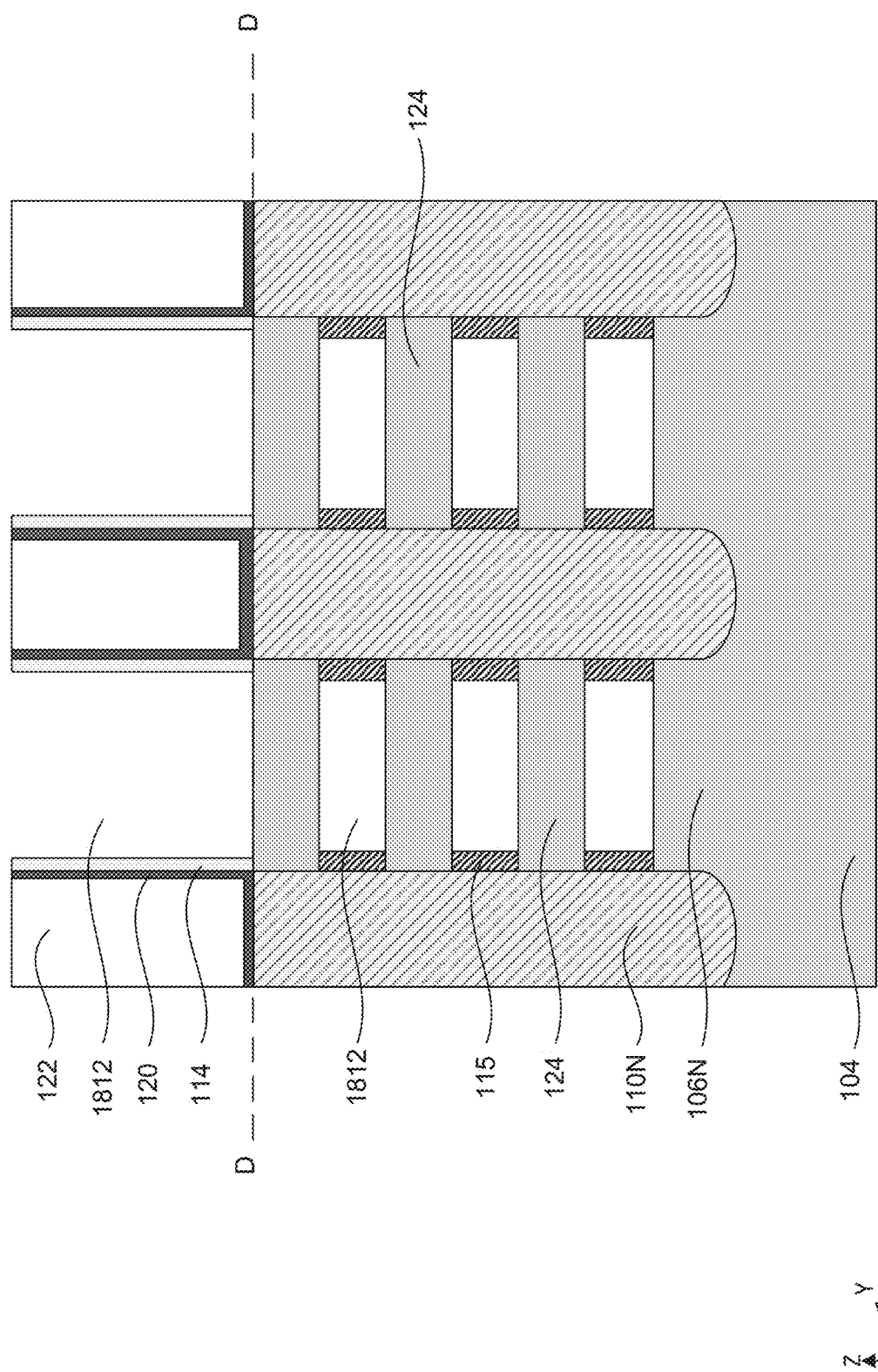
Figure 18B:
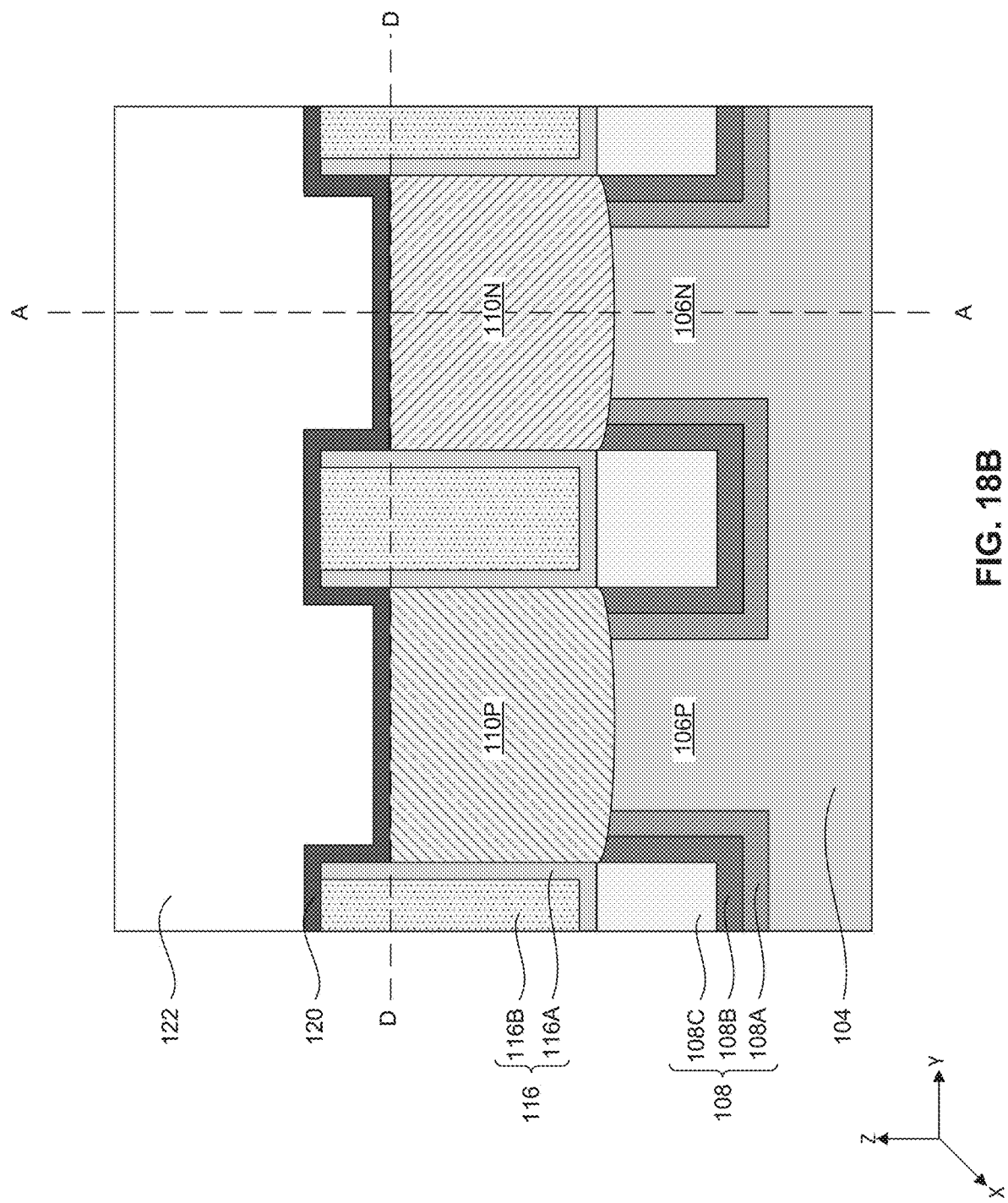
Figure 18C:
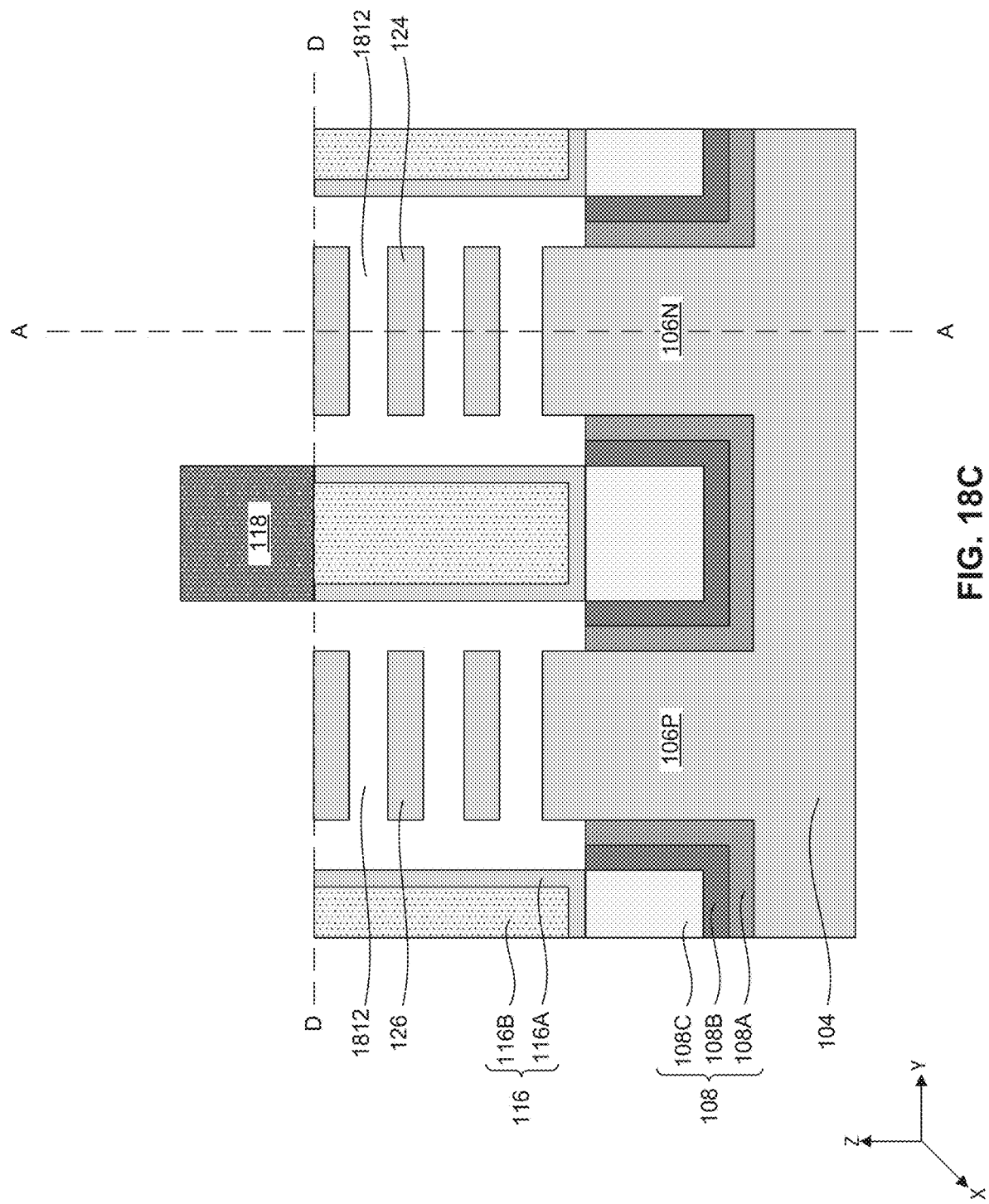
Figure 18D:
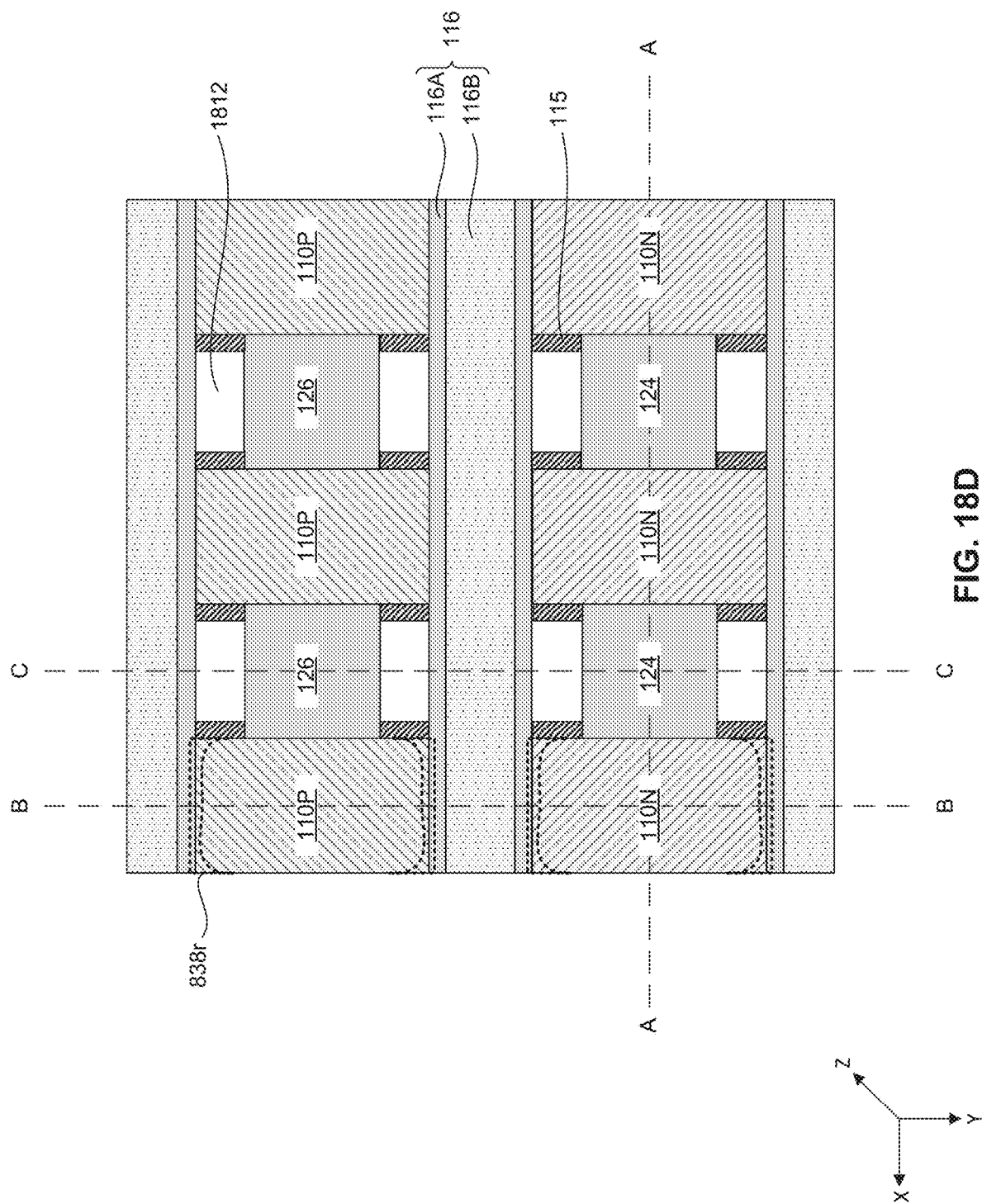

Referring to FIG. 3, in operation 340, gate openings are formed. For example, as shown in FIGS. 18A and 18C-18D (not visible in cross-sectional view of FIG. 18B), gate openings 1812 are formed around nanostructured channel regions 124 and 126. The formation of gate openings 1812 can include etching polysilicon structures 1312, nanostructured layers 424 and 426, and portions of cladding layers 838 under polysilicon structures 1312. FIG. 18B shows cross-sectional view along line B-B of FIG. 18D.

Figure 19A:
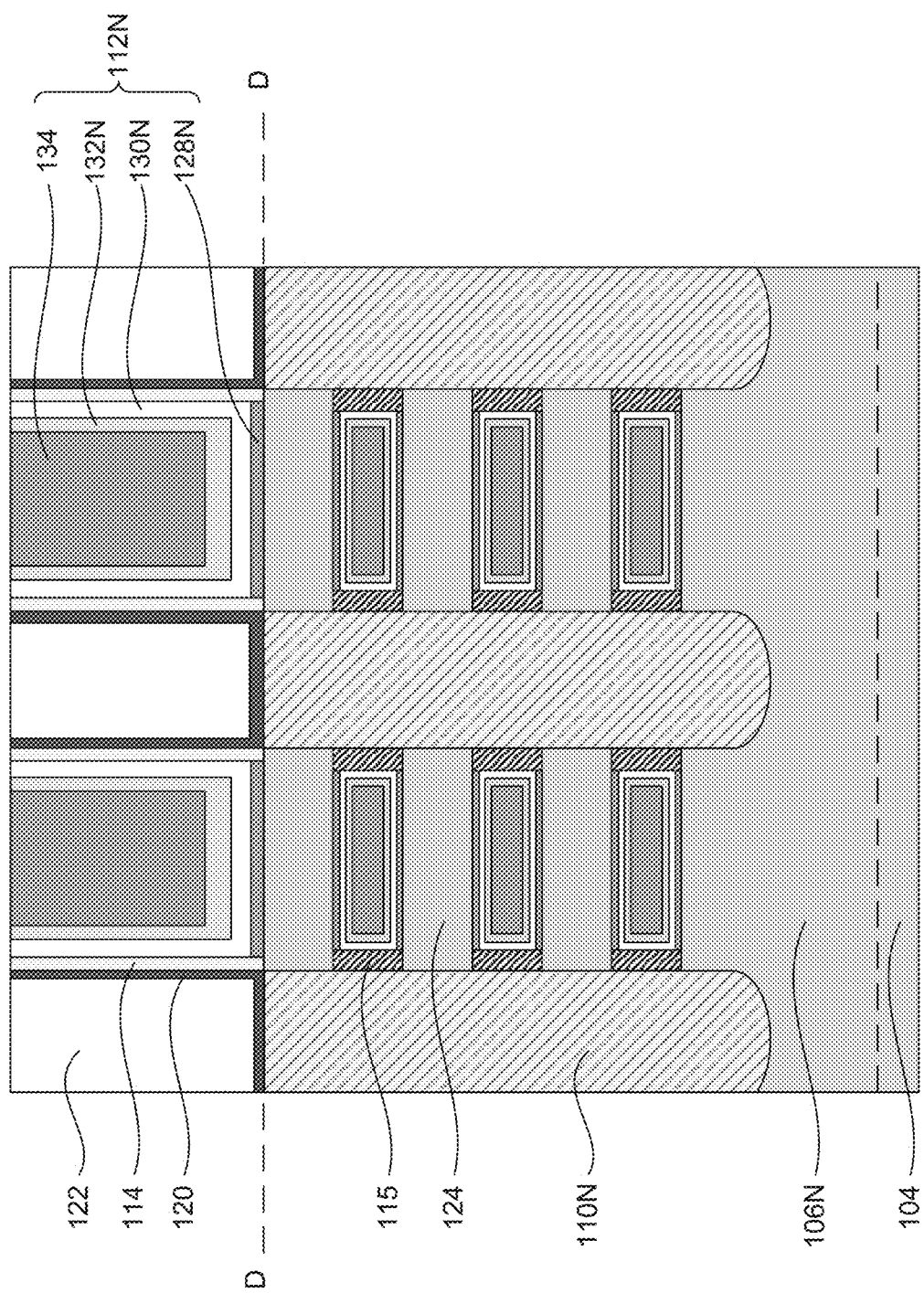
Figure 19B:
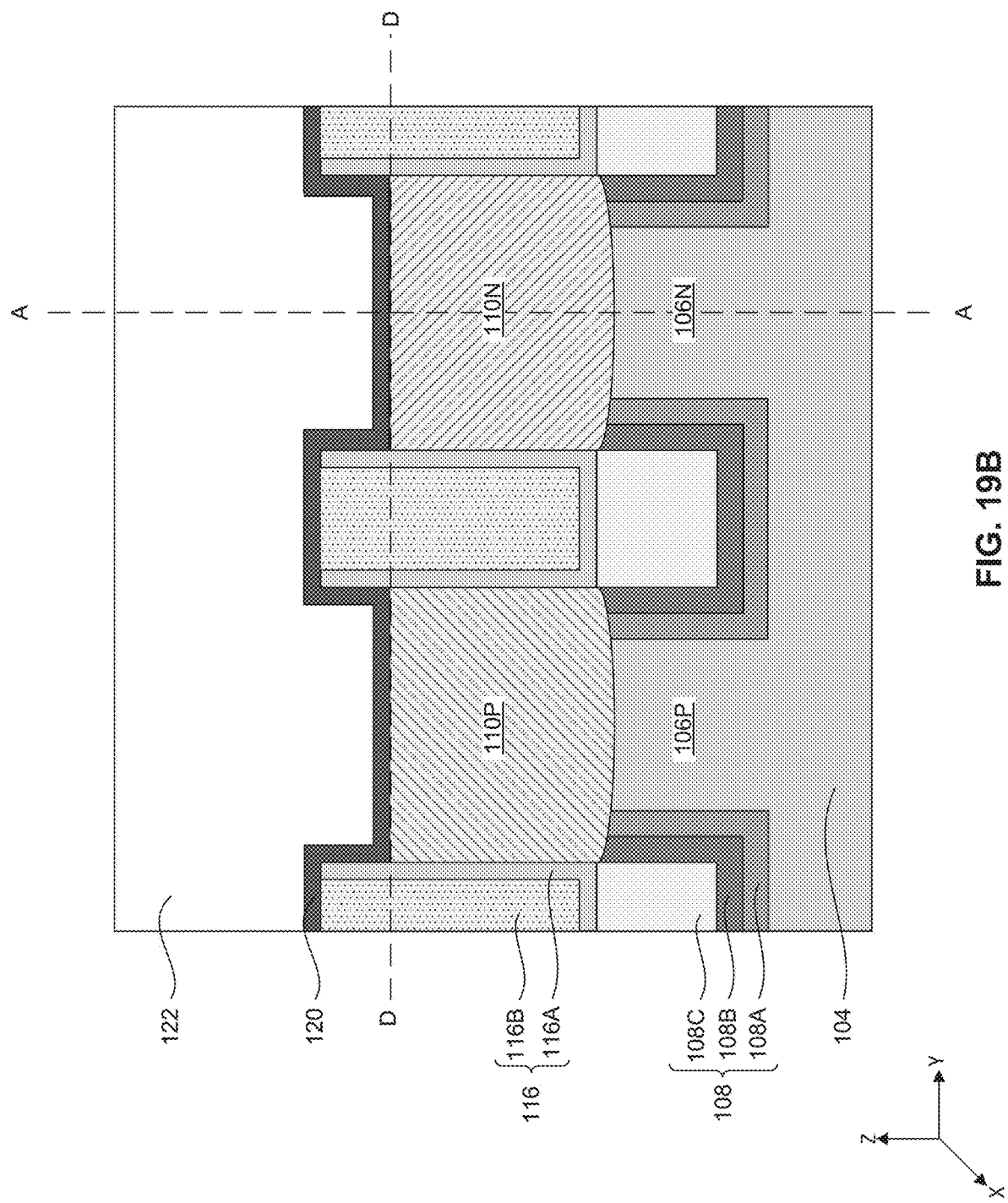
Figure 19C:
Figure 19D:
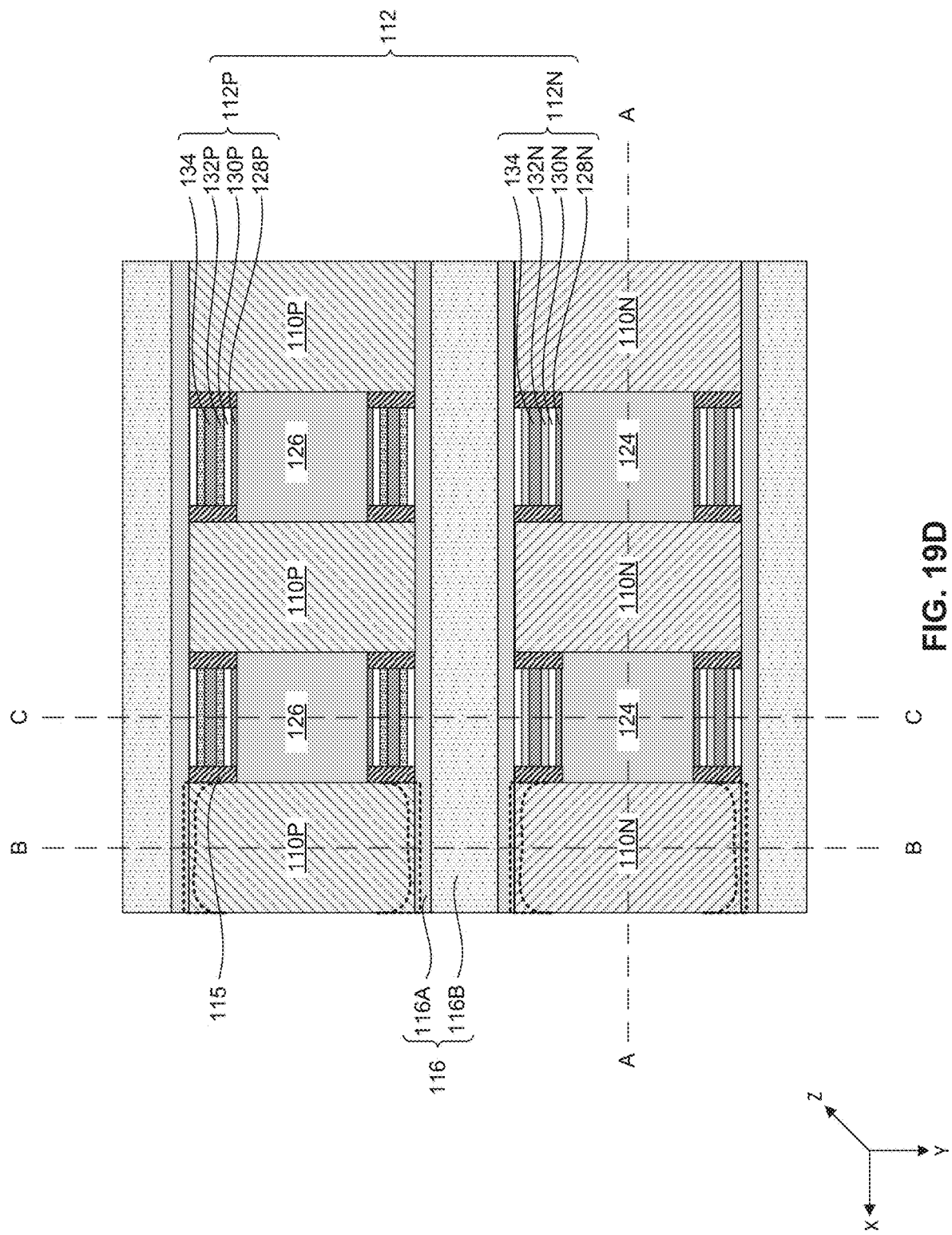

Referring to FIG. 3, in operation 345, gate structures are formed in the gate openings. For example, as described with reference to FIGS. 19A, 19C, and 19D (not visible in cross-sectional views of FIG. 19B), gate structures 112 are formed in gate openings 1812. The formation of gate structures 112 can include sequential operations of (i) forming IL layers 128N and 128P on nanostructured channel regions 124 and 126, respectively, as shown in FIGS. 19A and 19C-19D, (ii) depositing HK gate dielectric layers 130N and 130P on IL layers 128N and 128P, respectively, as shown in FIGS. 19A and 19C-19D, (iii) depositing WFM layers 132N and 132P on HK gate dielectric layers 130N and 130P, respectively, as shown in FIGS. 19A and 19C-19D, (iv) depositing gate metal fill layer 134 on WFM layers 132N and 132P, as shown in FIGS. 19A and 19C-19D, and (v) performing a CMP process to substantially coplanarize top surfaces of ILD layers 122, HK gate dielectric layers 130N and 130P, WFM layers 132N and 132P, and gate metal fill layer 134 with each other, as shown in FIGS. 19A and 19C-19D. FIG. 19B shows cross-sectional view along line B-B of FIG. 19D.

In some embodiments, operations 315-345 can be performed on the structure of FIG. 7E to form semiconductor device 200.

The present disclosure provides example structures of semiconductor devices (e.g. GAA FETs 102N-102P) with doped shallow trench isolation (STI) structures (e.g., doped STI structures 108 and 208) and examples methods (e.g., method 300) of fabricating the same. In some embodiments, the doped STI structure can include a doped liner (e.g., doped liner 108A), a dopant source liner (e.g., dopant source liner 108B), and a doped fill layer (e.g., doped fill layer 108C). In some embodiments, the formation of the doped STI structure can include forming a stack with a liner, a dopant source liner, and a fill layer with an etching rate faster than an etching rate of the liner. The formation of the doped STI structure can further include doping the liner and the fill layer by annealing the stack to implant dopant material from the dopant source liner into the liner and the fill layer. The doping of the liner and the fill layer can reduce the etching rate difference between the liner and the fill layer and/or modify the etching rates of the liner and the fill layer to be substantially equal to each other. As a result, the uniformity of the etched surface profiles of the doped STI structure is improved. The improved uniform surface profiles of the doped STI structure results in improved linear profiles of structures subsequently formed on the doped STI structure, preventing or reducing fabrication defects in the subsequently-formed structures.

In some embodiments, the dopant source liner can include a nitride layer (e.g., silicon oxynitride (SiON) or silicon nitride (SiN)), and the doped liner and the doped fill layer can include nitrogen dopants. In some embodiments, the concentration of nitrogen atoms in the dopant source liner can decrease to a range of about 0 atomic % to about 5 atomic % from a range of about 5 atomic % to about 20 atomic % after the annealing process. In some embodiments, the doped fill layer can include a concentration of nitrogen dopants of about 1 atomic % to about 5 atomic %. The concentration of nitrogen dopants in the doped fill layer is greater than the concentration of nitrogen dopants in the doped liner.

In some embodiments, a method includes forming a fin structure on a substrate, forming a superlattice structure with first and second nanostructured layers arranged in an alternating configuration on the fin structure, depositing an oxide liner surrounding the superlattice structure and the fin structure in a first deposition process, forming a dopant source liner on the oxide liner depositing an oxide fill layer on the dopant source liner in a second deposition process different from the first deposition process, performing a doping process to form a doped oxide liner and a doped oxide fill layer, removing portions of the doped oxide liner, the doped oxide fill layer, and the dopant source liner from sidewalls of the superlattice structure, and forming a gate structure on the fin structure and surrounding the first nanostructured layers.

In some embodiments, a method includes forming a fin structure on a substrate, forming a superlattice structure with first and second nanostructured layers arranged in an alternating configuration on the fin structure, forming a dopant source liner on the superlattice structure and the fin structure in a first deposition process, forming a doped fill layer on the dopant source liner in a second deposition process different from the first deposition process, removing portions of the dopant source liner and the doped fill layer from sidewalls of the superlattice structure, and forming a gate structure on the fin structure and surrounding the first nanostructured layers.

In some embodiments, a semiconductor device includes a substrate, a fin structure on the substrate, a stack of nanostructured layers disposed on a first portion of the fin structure, a source/drain region disposed on a second portion of the fin structure, a gate structure surrounding each of the nanostructured layers, and an isolation structure disposed on the substrate and adjacent to the fin structure, wherein the isolation structure includes a doped oxide liner, a nitride liner, and a doped oxide fill layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin base structure on a substrate;
   forming a superlattice structure with first and second nanostructured layers arranged in an alternating configuration on the fin base structure;
   depositing an oxide liner in contact with sidewalls of the first and second nanostructured layers and surrounding the superlattice structure and the fin base structure in a first deposition process;
   forming a dopant source liner on the oxide liner;
   depositing an oxide fill layer on the dopant source liner in a second deposition process different from the first deposition process;
   performing a doping process to form a doped oxide liner and a doped oxide fill layer;
   removing top portions of the doped oxide liner, the doped oxide fill layer, and the dopant source liner from sidewalls of the superlattice structure, while bottom portions of the doped oxide liner, the doped oxide fill layer, and the dopant source liner remain surrounding the fin base structure;

forming an isolation structure on the bottom portions of the doped oxide fill layer; and forming a gate structure surrounding the first nanostructured layers.

2. The method of claim 1, wherein forming the dopant source liner comprises performing a nitridation process on the oxide liner.

3. The method of claim 1, wherein forming the dopant source liner comprises converting a top portion of the oxide liner into a nitride liner.

4. The method of claim 1, wherein performing the doping process comprises performing an anneal process on the oxide liner, the dopant source liner, and the oxide fill layer.

5. The method of claim 1, wherein performing the doping process comprises implanting the oxide liner with a first dopant concentration and implanting the oxide fill layer with a second dopant concentration that is greater than the first dopant concentration.

6. The method of claim 1, wherein performing the doping process comprises implanting the oxide liner and the oxide fill layer with nitrogen atoms from the dopant source liner.

7. The method of claim 1, wherein performing the doping process comprises increasing concentrations of nitrogen atoms in the oxide liner and the oxide fill layer and decreasing a concentration of nitrogen atoms in the dopant source liner.

8. The method of claim 1, further comprising forming a cladding layer on the sidewalls of the superlattice structure after removing the top portions of the doped oxide liner, the doped oxide fill layer, and the dopant source liner from the sidewalls of the superlattice structure.

9. The method of claim 1, wherein forming the isolation structure on the doped oxide fill layer comprises depositing an insulating layer on the doped oxide fill layer.

10. The method of claim 1, further comprising replacing a portion of the superlattice structure with a source/drain region.

11. The method of claim 1, wherein forming the gate structure comprises removing the second nanostructured layers.

12. A method, comprising:

forming a superlattice structure with first and second semiconductor nanostructured layers arranged in an alternating configuration on a substrate;

forming a dopant source liner on the superlattice structure in a first deposition process;

forming, on the dopant source liner, a doped fill layer with a peak nitrogen concentration at an interface between the doped fill layer and the dopant source liner in a second deposition process different from the first deposition process;

removing portions of the dopant source liner and the doped fill layer from sidewalls of the superlattice structure; and forming a gate structure surrounding the first semiconductor nanostructured layers.

13. The method of claim 12, wherein forming the doped fill layer comprises:

depositing an undoped oxide fill layer on the dopant source liner in a flowable deposition process; and performing an anneal process on the undoped oxide fill layer and the dopant source liner.

14. The method of claim 12, wherein forming the doped fill layer comprises:

depositing an oxide fill layer on the dopant source liner in a flowable deposition process; and implanting nitrogen atoms from the dopant source liner into the oxide fill layer.

15. A method, comprising:

forming a semiconductor nanostructured layer on a substrate;

depositing, on and in contact with a top surface and sidewalls of the semiconductor nanostructured layer and the substrate, a first liner comprising a first material;

converting, using a nitridation process, a portion of the first liner into a second liner comprising a second material different from the first material;

depositing a dielectric layer on the second liner;

doping the dielectric layer with nitrogen dopants to form a doped dielectric layer with a peak nitrogen concentration at an interface between the doped dielectric layer and the second liner; and forming a gate structure surrounding the semiconductor nanostructured layer.

16. The method of claim 15, wherein converting the portion of the first liner into the second liner comprises converting the portion of the first liner into a silicon nitride liner.

17. The method of claim 15, wherein converting the portion of the first liner into the second liner comprises exposing the first liner to ammonia gas.

18. The method of claim 15, further comprising doping the first liner with the nitrogen dopants.

19. The method of claim 15, further comprising converting the first liner to a doped first liner.

20. The method of claim 15, further comprising forming a barrier layer on the doped dielectric layer prior to forming the gate structure.

* * * * *